United States Patent [19]

Alzmann et al.

[11] Patent Number: 4,829,375

[45] Date of Patent: May 9, 1989

[54] METHOD FOR PUNCHING IN PRINTED CIRCUIT BOARD LAMINATES AND RELATED APPARATUS AND ARTICLES OF MANUFACTURE

[75] Inventors: Donald Alzmann; Michael Angelo, both of East Islip; Paul R. Waldner, Wantagh; Arthur Brady, Stonybrook, all of N.Y.

[73] Assignee: Multiline Technology, Inc., Farmingdale, N.Y.

[21] Appl. No.: 902,467

[22] Filed: Aug. 29, 1986

[51] Int. Cl.$^4$ .............................................. H04N 7/18
[52] U.S. Cl. ................................... 358/101; 356/401; 408/3; 408/16
[58] Field of Search .................. 358/101, 106, 107, 93; 382/8, 16; 364/488, 489, 490, 491, 559, 560; 408/3, 16; 83/72-75, 360, 361, 600, 604, 691; 234/89, 79; 356/375, 373, 380, 384, 237, 401; 29/568

[56] References Cited

U.S. PATENT DOCUMENTS

| | | |
|---|---|---|
| 4,123,695 | 10/1978 | Hale et al. |
| 4,171,162 | 10/1979 | Gerard |
| 4,325,077 | 4/1982 | Dunham |
| 4,485,453 | 11/1984 | Taylor ............................... 408/3 X |
| 4,559,603 | 12/1985 | Yoshikawa ........................ 364/491 |
| 4,568,971 | 2/1986 | Alzmann et al. .................. 358/101 |
| 4,596,037 | 6/1986 | Bouchard et al. .............. 358/107 X |
| 4,596,067 | 6/1986 | Raiteri ............................. 408/16 X |

*Primary Examiner*—James J. Groody
*Assistant Examiner*—Victor R. Kostak
*Attorney, Agent, or Firm*—Roberts, Spiecens & Cohen

[57] ABSTRACT

The method includes locating a target on a printed circuit board laminate having a circuit pattern etched thereon and utilizing the target to locate the laminate in a punching device. Preferably two such targets are employed and the laminate is adjusted in the X and Y directions as well as rotationally to bring the target into prescribed relationship with reference markings whereby to locate the holes precisely in the laminate whereby to facilitate stacking of the same. In related apparatus two television cameras are employed to operate with two targets to feed data into a microprocessor which generates signals to cause an alignment of the laminate to be punched. With respect to punching mechanisms special techniques are employed to locate the centers of the targets so that these centers can be aligned with cross hairs to take into account the deviations possible in the configurations of the targets.

33 Claims, 40 Drawing Sheets

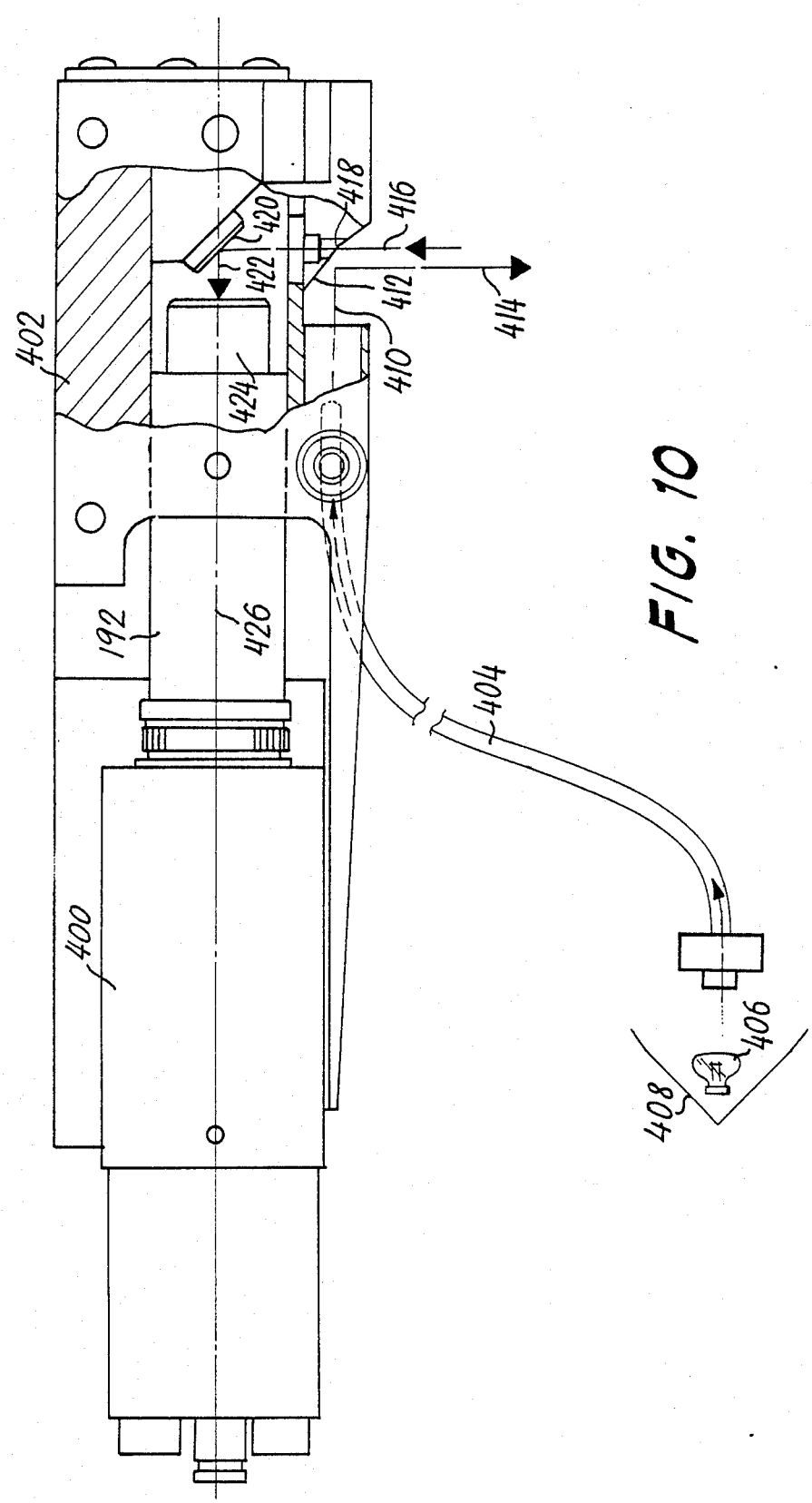

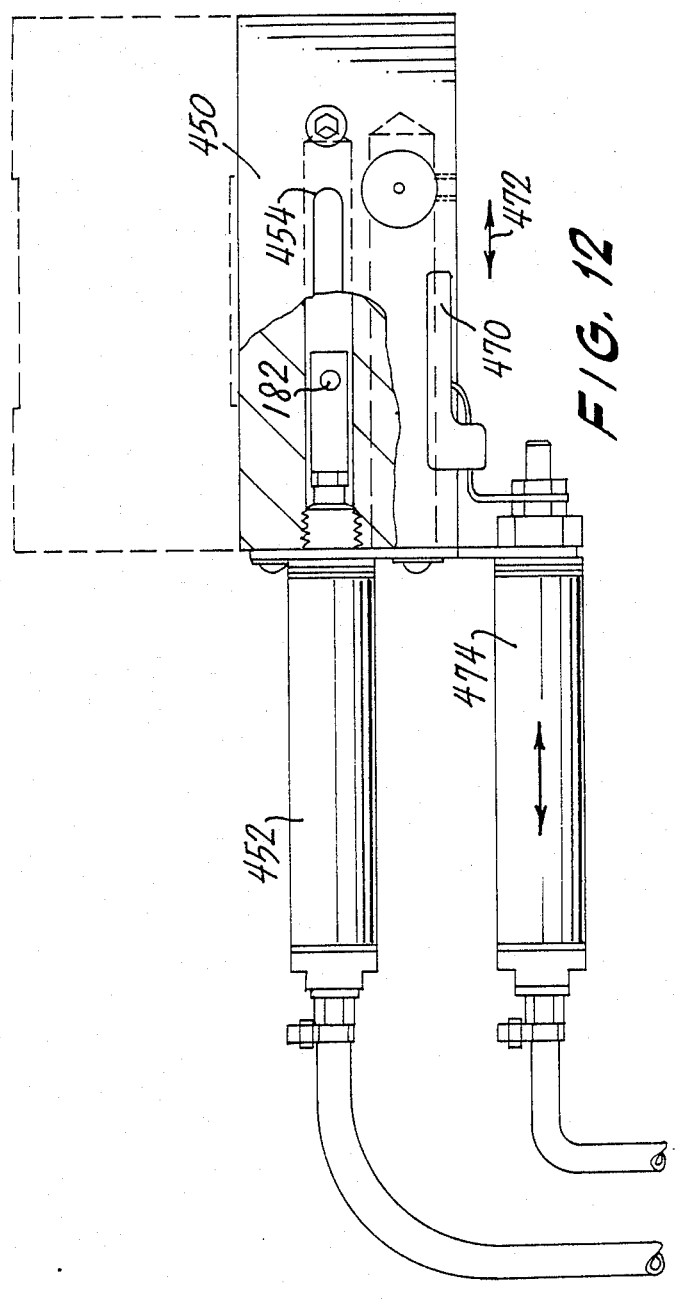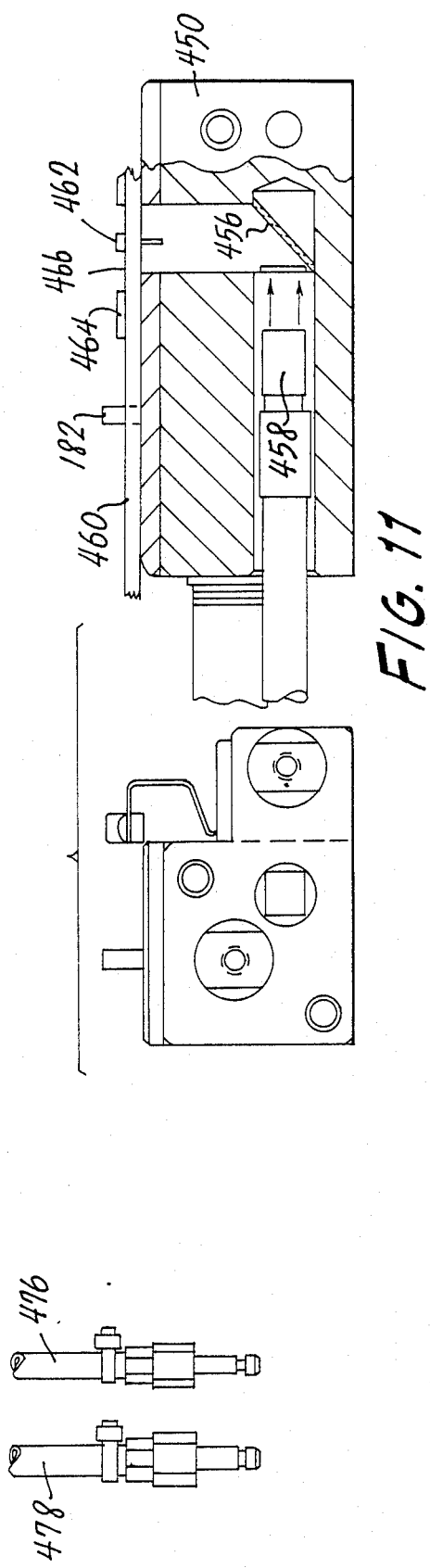

FIG. 15C

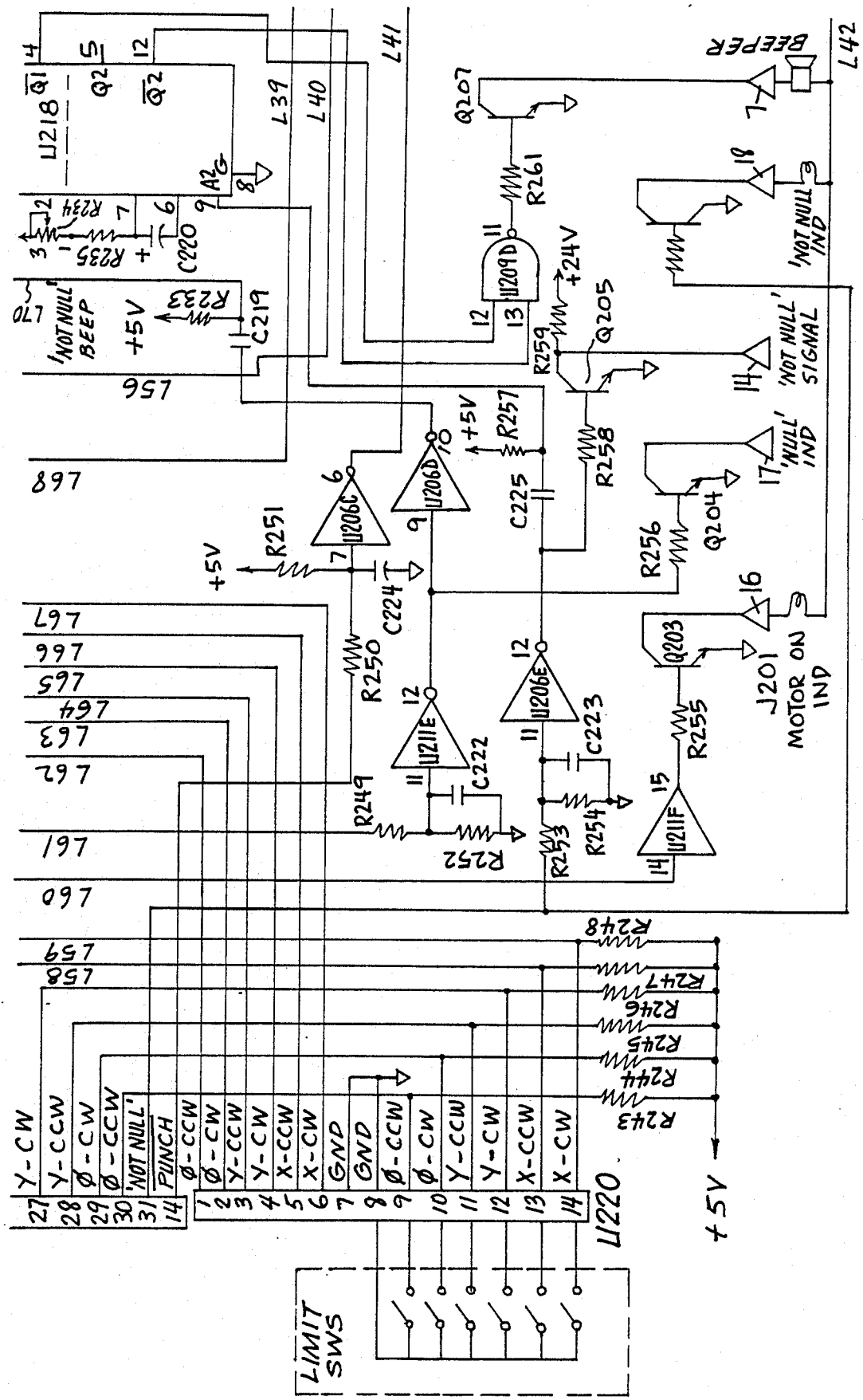

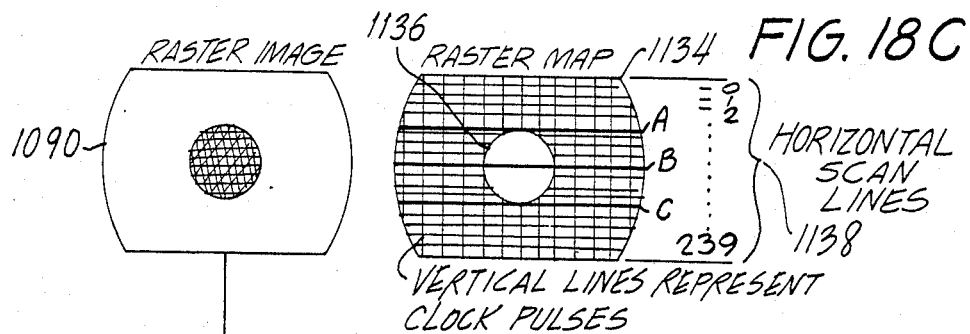
FIG. 18C
IN THIS EXAMPLE, LINE A IS THE FIRST SCAN LINE TO ENCOUNTER THE TARGET. LINE B IS A SCAN LINE THROUGH THE TARGET NEAR ITS CENTER. LINE C IS THE LAST SCAN LINE TO ENCOUNTER THE TARGET.
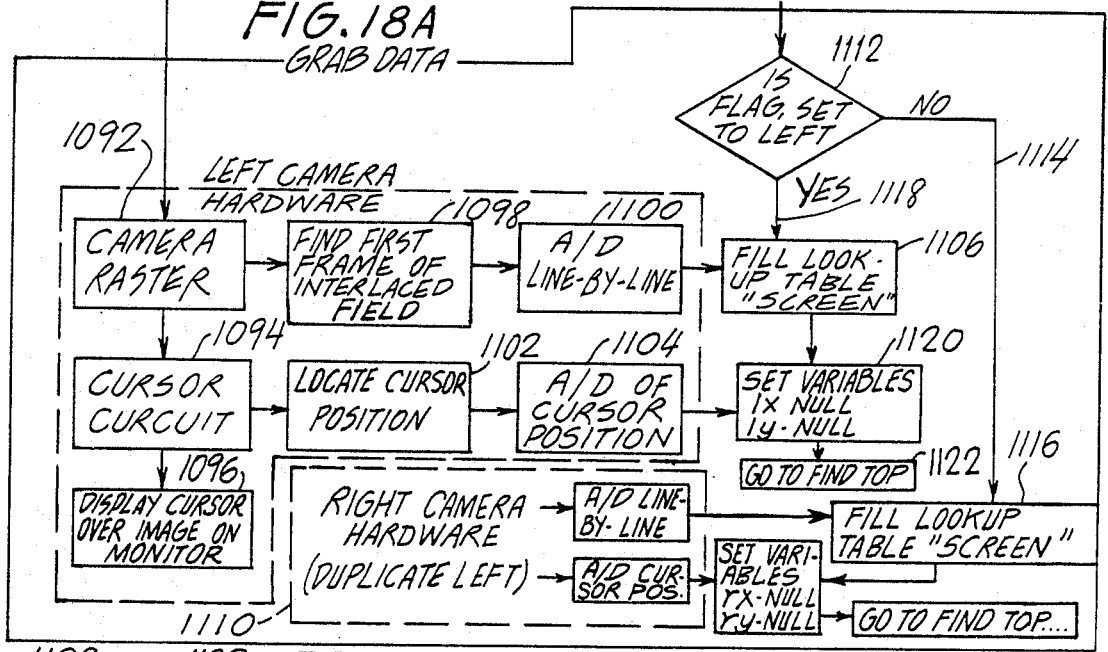
FIG. 18A
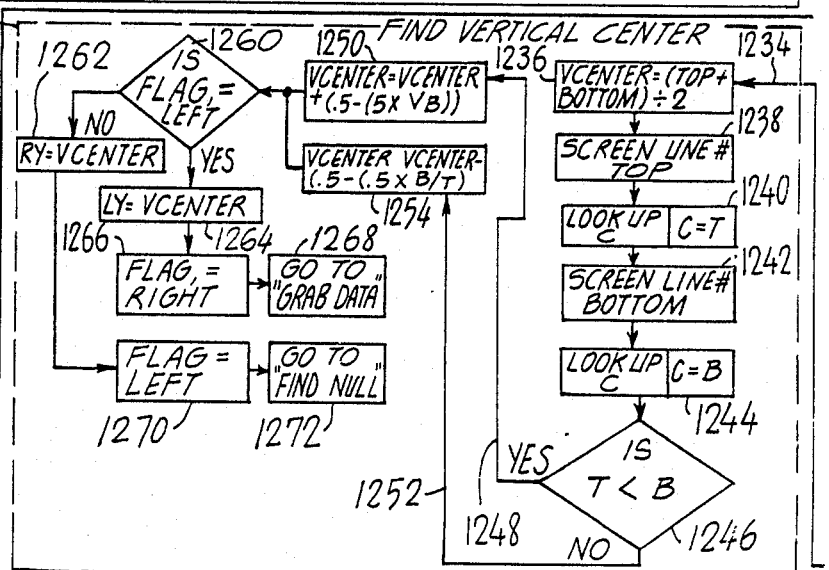

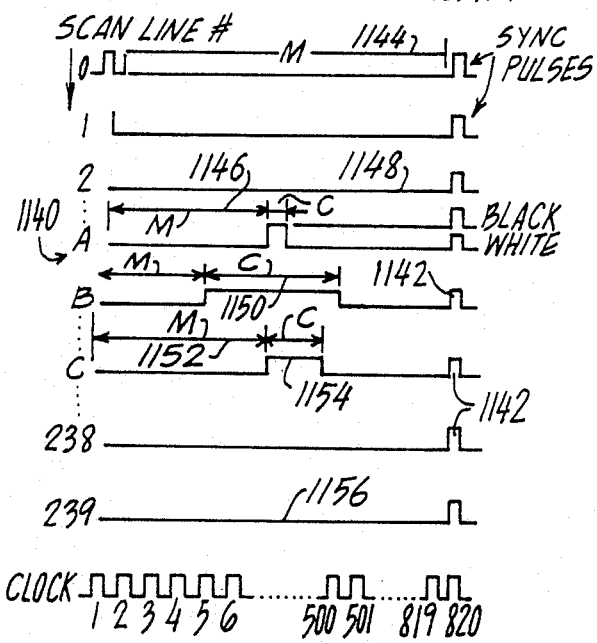
FIG. 18D
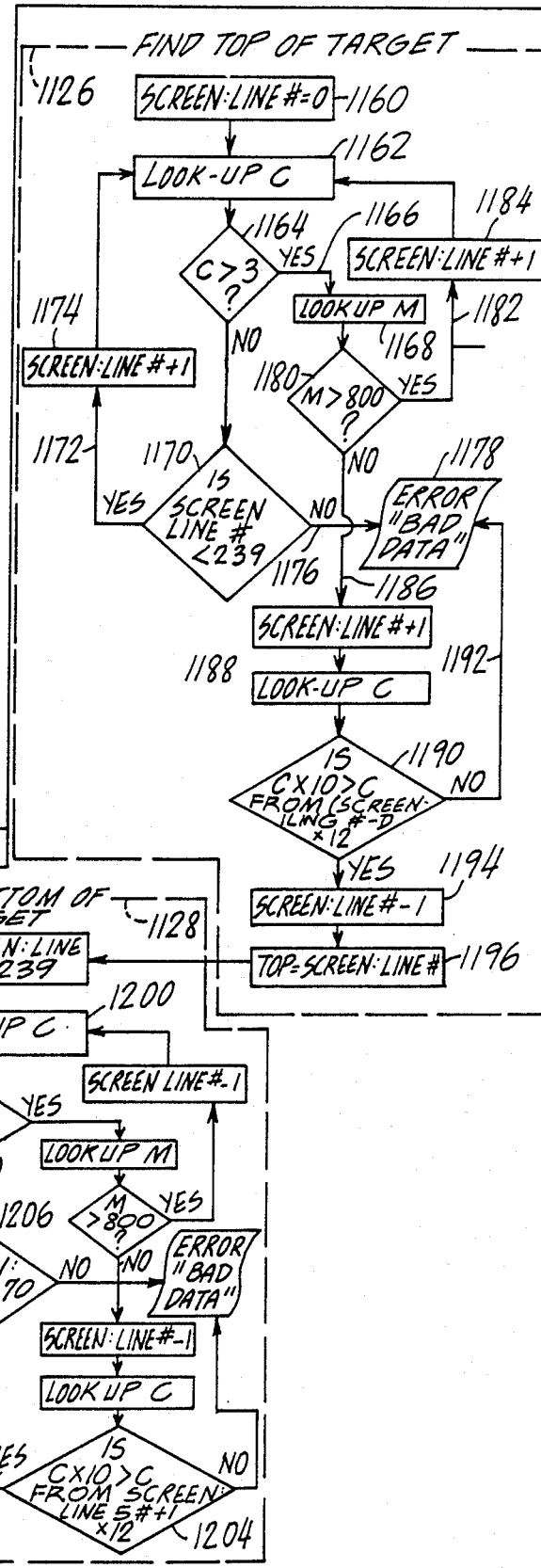
FIG. 18B
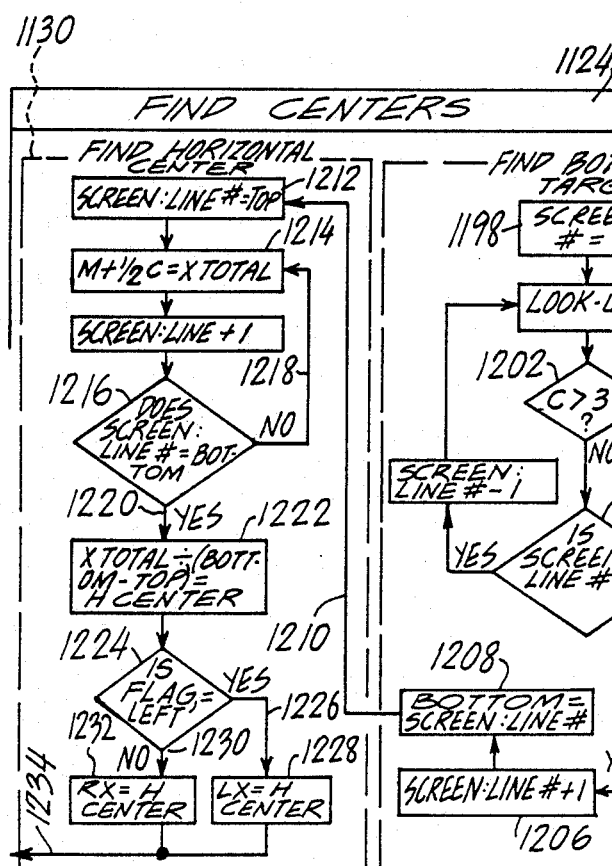

METHOD FOR PUNCHING IN PRINTED CIRCUIT BOARD LAMINATES AND RELATED APPARATUS AND ARTICLES OF MANUFACTURE

FIELD OF INVENTION

This invention relates to methods and apparatus for forming holes in laminates suitable for the manufacture of printed circuit boards and the like and to intermediate precursor products.

BACKGROUND

In the early years of multilayer printed circuit board manufacturing, lamination tooling holes were optically positioned in relation to predetermined target locations and then drilled or punched through the post-etched material. In most cases, the method was inaccurate, tedious and slow, but the process had some conceptual advantages not found in the pre-image process largely used today. Since fewer steps in artwork preparation were necessary, tolerance errors were reduced. Also, artwork registration could be done without pins, making imaging a faster process.

Problems arose, however, because the inherent instability of the etched material caused a deviation in target locations. When holes were punched or drilled in the target, this deviation caused the tooling holes to vary in relationship to each other. The error then compounded from layer to layer, causing the material to buckle during lay-up.

With the introduction of newly developed equipment, all the advantages of post-etch punching can be realized while the disadvantages are overcome. One such system is seen in U.S. Pat. No. 4,568,971. This system punch automatically averages any deviation in the target locations due to material instability, splits the difference, and punches tooling slots or holes into the panel.

The dimensional instability of epoxy glass laminates means registration at any stage in the process is never perfect because the base material is either shrinking or growing. The best method of correction after accumulating various tolerance errors is to "split-the-difference." This is achieved most effectively by implementing the four-slot tooling method commonly used for multilayer tooling. A good tooling system allows the multilayer manufacturer to compensate for any error in the artwork or laminate before tooling slots or holes are punched.

U.S. Pat. No. 4,568,971 (D. Alzmann et al) discloses a method and apparatus for effecting operations such as punching holes in sheets of material at precise locations. Each sheet has a reference marking thereon and is placed on a receiver in sequence and held in fixed position thereupon. A TV camera views each sheet to detect the reference marking thereon and a visual display of the marking is produced on a TV monitor. Also produced on the monitor is a cross hair with a coincident shaded box. The cross hair is first aligned with a marking reference on a master sheet to establish a fixed relation between the cross hair and the marking reference on the master sheet and thereby between the cross hair and the operating system which may be, for example, the punches which punch the holes in the sheets. The master sheet is removed and the sheets to be punched are placed one by one on the receiver which is moved to align the reference marking on each sheet as viewed on the monitor.

SUMMARY OF INVENTION

It is an object of the invention to provide improved methods and devices to effect the formation of holes in laminates suitable for use as elements in printed circuit boards and the like.

It is a further object to provide an improvement over the method and apparatus described in U.S. Pat. No. 4,568,971.

Yet another object of the invention is to avoid the need for utilizing master sheets and the like in methods and apparatus employed for the punching of holes in sheets of material.

Yet another object of the invention is to provide improved methods and apparatus readily usable for the automatic and semiautomatic alignment of sheets in punching devices and the like.

In achieving the above and other objects of the invention, there is provided a precise method for locating a pattern and a target in prescribed relationship on a support, comprising moving the support relative to the hole-forming tool which is employed thereby to displace the target relative to a reference having a prescribed relationship to the hole-forming tool and to bring the target into prescribed relationship with the reference, and thereafter operating the hole-forming tool to form a hole in the support, all for the reasons mentioned hereinabove. The support may be moved in accordance with the invention along Cartesian coordinates and rotationally. The reference is in accordance with the invention generated in a television camera which captures a light generated image of the target. In accordance with a special feature of the invention the image of the target is scanned by a raster to generate signals which are used to effect x, y and $\theta$ displacement of the image of the target relative to the reference thereby to effect movement of the pattern and support relative to the punch.

In view of the fact that the laminate which is dealt with by the method and apparatus of the invention is primarily utilized as a part of a printed circuit board, the aforesaid pattern and target are preferably etched into an electrically conductive material on the support which, as has been indicated hereinabove, is a relatively flat laminate.

In accordance with a preferred embodiment of the invention, a second target is located on the support in prescribed relationship to the aforesaid pattern and the support is moved to displace the second target relative to a second reference having a prescribed relationship with a second punch, said method comprising operating a second punch to punch a second hole into the support.

As will be shown hereinbelow, the target is formed in at least generally circular form and the center of the circle is brought to alignment with the reference. To account for cases of non-circularity of the target or departures from the geometrical form thereof, the center is determined by weighting the signals according to the results of multiple scannings at different locations across the same. According to one specific embodiment of the invention, the center is weighted in the y direction thereof in accordance with the relative values of one of the first and one of the last rasters passing through the upper and lower extremities of the target image. The center may be weighted in the x direction thereof in accordance with the average chord resulting from a plurality of horizontal scans through the target image.

According to yet another aspect of the invention, the television camera has a field and the support is firstly brought to a position where the target image is in the field and fine adjustments of the image relative to the reference are automatically made by repeated scannings of the target image. The support may be crowded against a stop to bring the image into the field.

According to yet another aspect of the invention, the support has a surface with a center and the targets are at least substantially colinear with and at least substantially equidistant from the center. Moreover, the target is an at least substantially circular target in a visually contrasting field in a preferred embodiment of the invention. Advantageously, the field may also be circular and may constitute a part of the support or substrate.

The invention is also concerned with an article of manufacture. This article of manufacture may comprise a substrate, a coating of prescribed form on this substrate, and at least one target on the substrate to provide for locating and positioning the substrate for performing an operation thereon in a position related to the coating. The substrate is preferably a sheet and the coating is preferably electrically conductive. Furthermore, the coating and target are preferably of the same material and the target preferably has a prescribed relationship to the coating and to the configuration etched into the same.

As has been noted above, the article of manufacture of the invention preferably comprises two spaced targets which are located on the central axis of the substrate and on opposite sides of the coating. The target is preferably of a material capable of intercepting light. In one instance this light may be reflected back to the television camera and in another instance the target may be translucent to modulate the light which passes through the same. As has been noted hereinabove, the target is preferably circular. It is preferably of copper. Advantageously, it is of a diameter in the order of magnitude of 0.030 inches and is surrounded by an encircling bare portion of substrate which represents a background field, this field having a minimum radius in the order of magnitude of 0.250 inches. Advantageously, the coating form and target are etched from a common layer of material which is located atop the substrate.

The invention is also concerned with an apparatus for locating and treating a sheet having at least one target thereon as aforesaid. In one generalized form, the apparatus comprises relatively displaceable sheet support means and sheet treatment means, optical and computing means to generate a positional reference and to superimpose a shadow of the target with respect thereto dependent on the position of the sheet and target relative to the reference and to generate signals indicating displacement between the reference and an at least approximate center of the target. Furthermore, there are provided control means coupled to the optical and computing means and automatically adjusting the relative positioning of the sheet support means and the sheet treatment means to bring the reference and target into positional correspondence whereby operation of the sheet means is effective at a position related to the target. In the preferred version, as noted hereinabove, the sheet has two targets thereon and the optical and computing means generate two positional references which are dealt with in the manner indicated above. The utilization of two targets enables the displacement of the sheet in a circular or polar sense thereby to enable three adjustments, namely, adjustments relative to the x and y axes and rotationally.

As will be explained in greater detail hereinbelow, the optical and computing means mentioned above includes approximating means for approximating the centers of the circles. As also indicated above, the approximating means includes scanning means for electronically scanning an electronic representation of each circle in the x direction and comparing one of the first scans of each circle against one of the last scans thereof and weighting the center thereof, in the y direction, in favor of the larger of the thusly compared scans. Further, the approximating means will preferably include means for averaging a plurality of scans generally centrally located in the y direction of each circle and averaging the same to approximate the center of each circle with respect to the x direction. The above and other objects, features and advantages of the invention will be found in the detailed description which follows hereinafter as illustrated in the accompanying drawing.

BRIEF DESCRIPTION OF DRAWING

In the drawing:

FIG. 10 is a side view of a television camera assembly adapted to cooperate with the structure of FIGS. 7-9 and forming a part of the assembly of FIG. 7;

FIG. 11 is a side view of a target block assembly employed in accordance with the invention;

FIG. 12 is a side view of the apparatus of FIG. 11;

FIGS. 115A-L constitute a partly logical and partly schematic diagram of the counter and control boards of FIG. 14;

FIGS. 18A and 18B cooperatively form a flow diagram further explaining the Grab Data and Find Centers of FIGS. 17A and 17B;

FIGS. 18C and 18D respectively show a raster map and a scan line timing diagram in explanation of FIGS. 18A and 18B.

DETAILED DESCRIPTION

Figure 1:
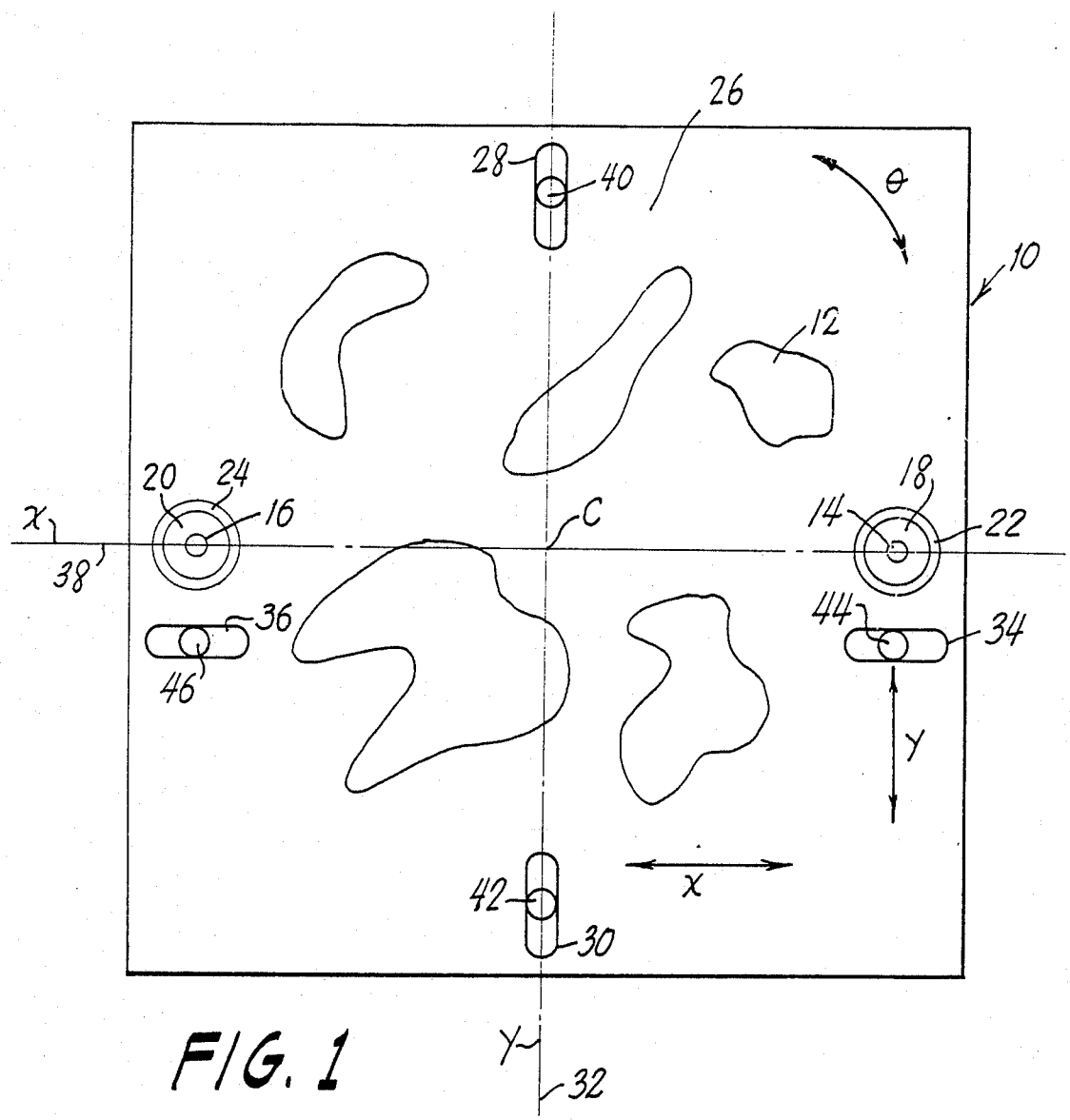
FIG. 1 is a top view of a lamination provided with a coating etched into the form of a printed circuit and bearing targets and provided with holes punched into the substrate.

Designed to meet the high accuracy demands of industry's most sophisticated multilayer boards, the post-etch punch process of the invention offers advantages superior to pre-image punching. Post-etch punching means better registration because punching is done after etching, when, due to the inherent instability of multilayer materials, the majority of shifts occur. The new process averages any deviation on the etched panel, splits the difference, and punches tooling slots or holes into the panel, all automatically. Both image and tooling repeatability, panel-to-panel, are achieved with close tolerances (e.g., ±0.0007"). Thus excellent quality is obtained in each layer and an accumulation of tolerance errors, which can render a finished board useless, is avoided.

Using the post-etch registration method of the invention, circuit images can be placed on panels without tooling holes. This can be accomplished by using automatic exposure equipment. Artwork is marked with two fiducial targets at specified locations and is then generated on the panel. These marks are preferably co-linear and equidistant from the center point, and preferably as far apart as possible. After this imaging process is completed, the panels are etched.

The apparatus of the invention consists of two units, a durable hydraulically-driven punching unit, capable of punching the registration pattern into a sheet or laminate which can be relatively thick, and a console unit for operator control and computer microprocessing. An adjustment moves punching heads in the punching unit to accommodate various panel sizes. The punch blocks move on ground slides and spring-loaded dowels fit into precision bored holes at correct locations. Punches move in selected increments an any panel size can be accommodated.

According to the method of the invention, etched panels or sheets are inserted manually or automatically. The material is moved into the unit and correctly positioned against left and rear stops by material crowders. Panels are held in place by a vacuum table or clamping means. If a table is employed, it preferably contains variably controlled vacuum channels actuated according to panel size. Two high-resolution, CCD miniature cameras move in relationship to the punches along the long axis of the panel. Two target pods are pressed against the fiducial targets on the panel to hold the panel or sheet flat, insuring proper focus for the video cameras. To optimize precision alignment, the fiducial target image is enlarged by the video cameras, providing an image-to-tooling pattern of ±0.0007" at the center of the panel. A fiber optic light source illuminates the target for reflective or refractive images. Top or bottom lighting is selected to accommodate the different materials being processed. To achieve maximum contrast, the sensitivity of the camera is adjustable. The video system internally defines the prime position or references for the fiducial target locations using electronically derived and pre-set references or "null points." It then surveys the fiducial marks and relays accurate information regarding precise target locations to the positioning system.

The positioning system consists of three-axis, servo-driven tables x, y and $\theta$ (rotational). An automatic sequence directs the servo-table to position the fiducial marks on the panel directly in relationship to the internally programmed video "null points." When acceptable alignment is achieved, any error between the fiduciary marks is split in half. Internal sensor circuits then direct the press to automatically cycle. (The unit can also be operated in a manual mode.) After punching, the panel is removed through the rear of the punch by a dual-belt-driven unloader which deposits panels onto an automatic indexing stacker (optional). Productivity averages four to five panels per minute in the standard automatic mode with manual loading.

With the method and apparatus described below, the choice is made to circumvent any tooling holes that are used for any process prior to or during imaging. Instead of tooling holes as indicators of image position, the invention utilizes two fiducial marks or targets, which are part of the etched image, to locate the panel (after imaging) with respect to the punch. This punch pierces the tooling configuration. This tooling configuration is then used in subsequent production steps, such as lamination and drilling, to ensure layer-to-layer and image-to-drill registration. With this capability to form holes in an imaged panel relative to the image, it is possible to eliminate all need for providing any holes prior to, or during, imaging.

The main elements of the apparatus of the invention are a video control package and a punch and die system engineered to pierce an accurate registration pattern.

Although the apparatus is hand fed, the panels are punched and removed from the machine automatically. The operator, after placing a panel against stops, initiates the automatic sequence which directs $\theta$, x and y tables to position fiducial marks on the panel with respect to video "null points." When a proper alignment is achieved, the press is directed to cycle by internal sensor circuits. After punching, the panel is ejected automatically out the rear of the machine.

The use of the method of the invention imposes one demand on the photo-tooling unique to the system. Each board to be processed in accordance with the preferred embodiment requires the presence of two fiducial marks that are approximately co-linear with the center-point of the panel and each as equidistant as possible from the center-point. In addition, the distance between these fiducial marks should be as long as possible. The form of each marker is that of a round pad of roughly 0.030 diameter on an otherwise unmarked background of a minimum of 0.250 radius about this pad.

The positioning table is made up of a vacuum platen (for holding the imaged panels flat) firmly affixed to a rotary $\theta$ stage, which is mounted to the center of a y stage, which in turn is mounted in a perpendicular relationship to the center of an x stage. The x stage is fixed in a position or, in an adjustable system, adjusted into a position, so that its linear motion is parallel to the line defined by the nominal position of the two fiducial marks. These nominal positions are defined by electronically derived and preset "null" points within the video system.

The video cameras used as the data input to the positioning system preferably meet the following criteria:
1. Low image distortion for the full raster scan.
2. Accurate and stable gray scale representation; low shading.
3. High resolution, for two reasons: to insure high position reading precision and more precisely define black-to-white transitions.
4. Image stability.
5. Low mass.
6. Low volume.
7. True axis representation (accurate representation of x-y squareness of image).

The existing state-of-the art in commercially available video cameras offers digital cameras or CCD (charge-coupled device) cameras specifically developed for measurement and computer interface applications. These cameras are comprised of densely packaged arrays of discrete photosites (pixels, picture elements) on the face of one chip. As a quantity of light strikes each photosite, a quantity of electrons (a charge packet) is transferred through a buffer to a transport line arranged with information from every other photosite. At the end of this transport line, an output amplifier passes each charge packet to an output device (monitor, storage buffer, etc.) as it is passed down the line.

In the apparatus of the invention, two digital cameras are used to recognize the material position markers in the field of view and to feed accurate information about their precise location to the positioning system. A system of indicators is incorporated to aid the operator in monitoring the panel position. The image is magnified approximately 45X to increase precision of alignment. At 45X the image-to-tooling pattern relationship is held to ±0.0007" at the center of the panel.

Overlaid on the field of each camera, an electronic processor generates a crosshair that represents a "null" point. Through each "null" point, an imaginary x-axis is drawn, such that both "null" points are intersected.

The camera mountings in the punch are located such that the x-axis of both cameras intersects the centerpoint of the part being punched. This guarantees the cameras' data and all position adjustments result in all errors being reckoned from the centerpoint of the part. Through each camera's null-point and perpendicular to the x-axis is that camera's y-axis (called $Y_L$ in the left camera and $Y_R$ in the right camera).

Before fine positioning can be done, the markers must be placed in the system within ±0.050 of the nominal. The "positioning" routine involves directing the panel about, with respect to the tooling locations, until the markers fulfill the following parameters:

The center-point of each marker must be centered with respect to the x-axis and equidistant to the y-axes. The sum of the differences between the marker centerpoints and their respective y centerlines must equal 0.

If $(|x_R|=|x_L|)$ and $(y_L=0)$ and $(y_R=0)$ and $(x_R+x_L=0)$ then the position is good; the panel may be punched.

Initial positioning is facilitated by use of panel stops and crowders which will roughly locate the markers to the cameras. Each component of the positioning table is driven by a motor directed by a microprocessor. The $\theta$ motor makes $y_L=y_R$ or, in other words, makes an imaginary line drawn through the two markers parallel to the x-axis. The y motor makes $y_L=0$ and $y_R=0$ or makes the imaginary line drawn through the two markers coincident with the x-axis. The x motor makes $x_L=x_R$ and $x_L+x_R=0$ or splits the difference in x between the left and right markers.

After insertion of each panel, an operator will momentarily depress a "start" control. All decisions about panel movement and the direction of each motor's rotation will be performed by an internal image detection/stage processor circuit. Upon completion of the stage movements, the press will automatically cycle (conditional upon the die area being clear of any intrusion). Although they are not required elements for machine performance, two monitors are provided to allow the operator to follow positioning progress. In addition, a series of lighted indicators and an LCD readout will keep the operator informed of the system operation.

Referring next to the drawing, FIG. 1 shows a sheet or laminate 10 in top view. The top electrically conductive metallic coating thereof has been etched away to leave a printed circuit board configuration including by way of example metallic islands 12 and the like. Having a fixed and prescribed relationship thereto are two targets 14 and 16. These targets are located in fields 18 and 20 delimited by rings 22 and 24. The targets 14 and 16 and the rings 22 and 24 are preferably of the same material as are the islands 12. However, other combinations of materials may also be employed. The islands and targets are supported by a substrate 26 which may be of, for example, epoxy or any other material which is employed for the fabrication of printed circuit boards or the like. Preferably, this material is translucent so that either reflective or light-transmissive optical characteristics may be employed in utilizing the targets of the invention for purposes of aligning the sheet 10 for purposes of punching or drilling or other such treatment techniques or the like. In the illustrated form, the holes have been punched into the substrate 26. These holes appear at 28 and 30 along the y axis 32 and at 34 and 36 somewhat below the x axis 38. This arrangement departs somewhat from the preferred embodiment of the invention in which the holes 34 and 36 would be directly aligned with the x axis 38 which would pass through the center C of the sheet 10.

Figure 2:
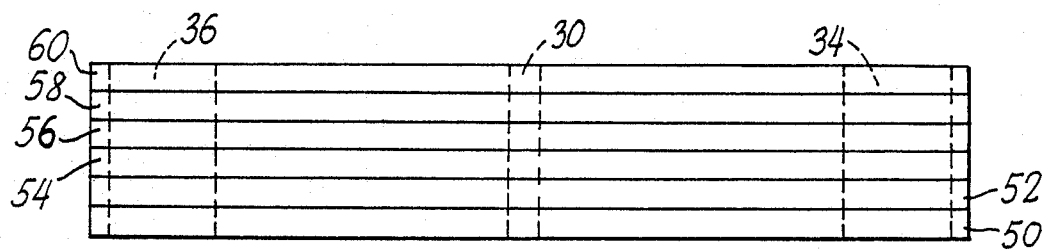
FIG. 2 illustrates a plurality of stacked laminations forming a printed circuit board in accordance with the configuration of FIG. 1.

In FIG. 1 is further seen the pins 40,42,44 and 46 extending through the holes 28,30,34 and 36. These are the pins which are utilized to stack a plurality of laminates such as indicated in FIG. 2 at 50,52,54,56,58 and 60.

It will be noted that the targets 14 and 16 are aligned on the x axis which itself extends through the center C of the sheet or laminate 10. Moreover, it appears that the targets 14 and 16 are equidistant from the axis 32 which is the y axis and that these targets are approximately a maximum distance from the axis 32. The targets 14 and 16 are preferably reflective in order that the images thereof be reflected for optical purposes to be discussed in greater detail hereinbelow. The encircling fields 18 and 22 are preferably translucent in order to provide a contrast with the associated targets so that these targets may clearly and precisely be utilized for positioning the sheet or laminate 10 according to the technique to be described in detail below.

Figure 3A:
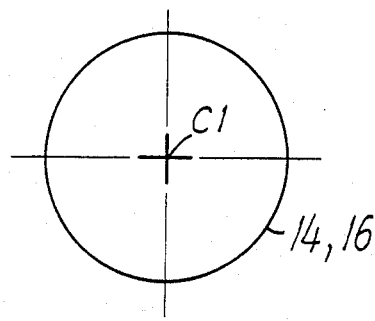
FIGS. 3(a) and (b) respectively illustrate circular and a circular targets employed in accordance with the invention.
Figure 3B:
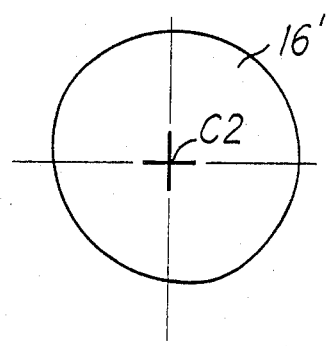

FIG. 3(a) illustrates the target 16 or 14. This Figure illustrates the idealized case in which the target is perfectly round or circular and in which the center C1 is exactly located in the center of the target. This target or pad is etched from the material atop the associated substrate or laminate and it will thus be appreciated that a perfectly circular result is an idealized case which is seldom achieved. FIG. 3(b) illustrates with some exaggeration the typical case wherein the target indicated at 16' is not perfectly circular or round and in which the center C2 is displaced to a position which has to be determined. The determination of this center is important to the location of the substrate for purposes of punching and will be discussed in greater detail hereinbelow.

Figure 4:
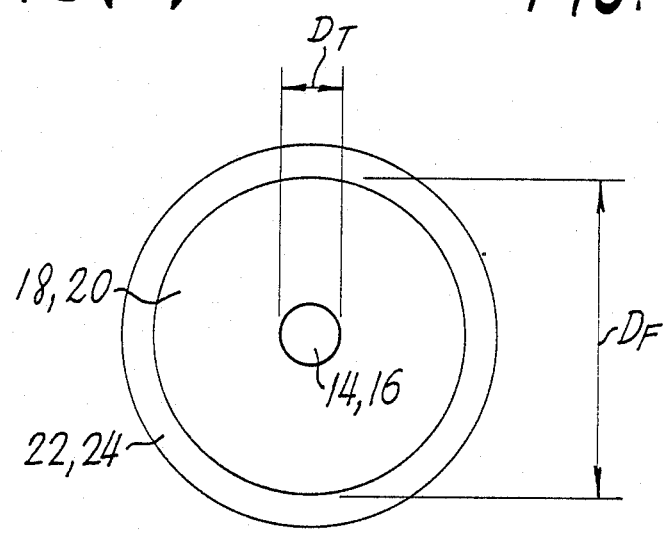
FIG. 4 illustrates a target against a background field limited by an encircling ring.

FIG. 4 illustrates the targets 14,16 encircled by the rings 22 or 24 respectively and being located within the fields 18 and 20. Herein it is indicated that the diameter $d_t$ is substantially less than the diameter $d_f$ of the field 18,20. Preferably, the diameter of the target is in the order of magnitude of 0.030 inches although this magnitude can vary widely within the scope of the invention. Preferably, the order of magnitude of diameter $d_f$ is a minimum of about 0.500 inches in order to enable readily distinguishing the target from the field. The field is preferably unmarked and translucent as aforesaid and does not have within its confines any optical noise which would interfere with the measurements being taken nor with the scanning of the target by an optical raster.

Figure 5:
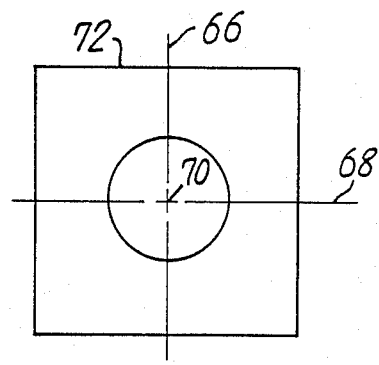
FIG. 5 illustrates a target moved into position relative to cross hairs in a television camera field in accordance with the invention.

FIG. 5 illustrates crosshairs 66 and 68 crossing at point 70 which constitutes the optical reference with which the target is to be aligned. The optical field is indicated at 72 and is established by the cameras and optical circuitry of the invention as is the positioning of crosshairs 66,68 and point 70. The configuration appearing in FIG. 5 is that which would appear on the monitors (not shown) associated with the cameras of the invention so that an operator can readily visualize what is ensuing within the apparatus and circuitry of the invention.

Figure 6:
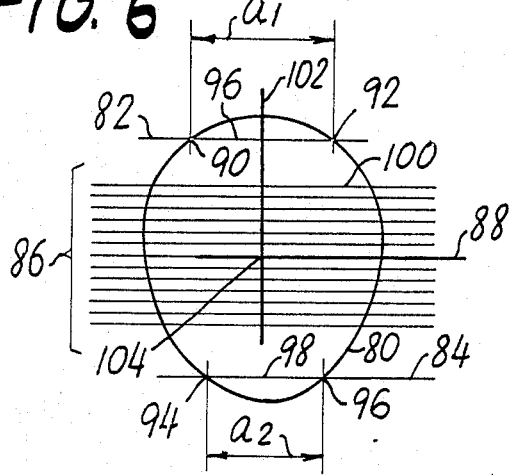
FIG. 6 diagrammatically illustrates the scanning of a target to approximate the center in accordance with the non-circularity thereof.

FIG. 6 illustrates the operation which is undertaken within the apparatus and circuitry of the invention when the situation illustrated in FIG. 3(b) is encountered. While the target 80 in FIG. 6 does not replicate the target 60' of FIG. 3(b), it is adequate to illustrate certain techniques employed in accordance with the invention. Thus, for example, the target 18 is scanned by a plurality of raster lines indicated at 82 and 84 and by an additional plurality of raster lines indicated as group 86. Raster lines 82 and 84 are utilized for weighting the position of the Cartesian coordinate 88. Raster line 82 encounters the target initially at 90 and departs the target at 92, thereby giving a chord having a magnitude as indicated at $a_1$. Raster line 84 first encounters the target at 94 and departs the target at 96, thereby giving a chord having a magnitude indicated at $a_2$. The chords are respectively indicated at 96 and 98. The position of the coordinate 88 is displaced according to the relative sizes of the chords 96 and 98. The coordinate 88 is displaced in the direction of the larger chord and proportional to the relative sizes of the two chords which are being compared. Preferably, the chords 96 and 98 will be the first and last chords which are established relative to the target 80. However, other relationships may also be selected; thus, for example, the chords may be the second from the first and second from the last chords. In any event, they will be one of the first chords which are established upon scanning of the target and one of the last cords which is established during the scanning of the target. In this fashion, the position of the coordinate 88 is established.

The group of raster lines 86 establish a plurality of chords such as indicated at 100. Perhaps ten such chords are established although other numbers are also usable. Preferably somewhere between ten and thirty chords are utilized and their widths are averaged to establish the position of the y coordinate 102. With the y coordinate 102 established and with the x coordinate 88 having been established, their intersection or origin is established, this being indicated at 104. Point 104 constitutes the center of the target 80 as utilized in the method and apparatus of the invention. It has been found by testing and through experience that this establishing of the center of the target provides for repeatability in forming holes in pluralities of laminates for purposes of subsequently stacking the same and providing for adequate coordination between the circuit elements on the various surfaces thereof.

Figure 7:
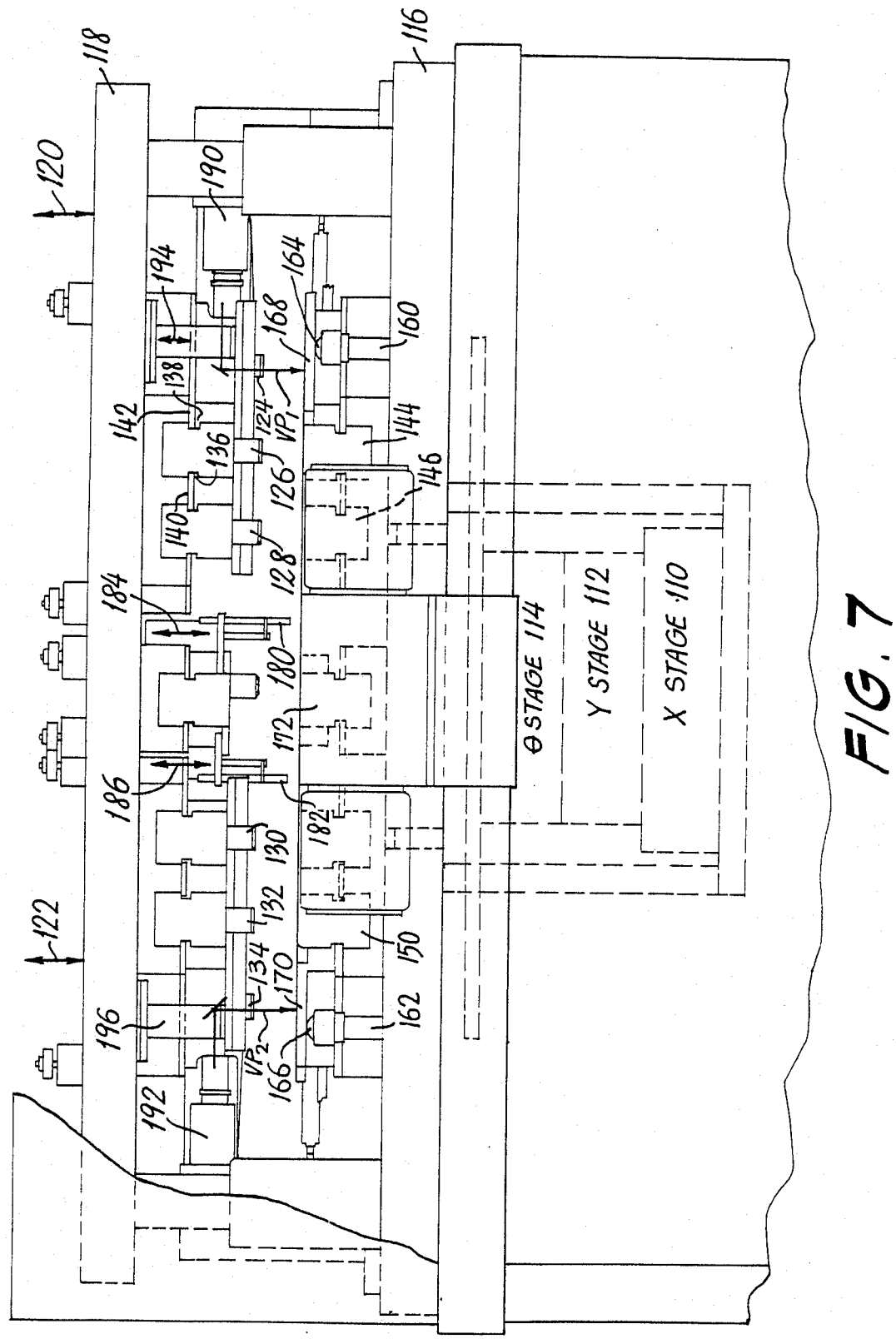
FIG. 7 is a side view of a punching mechanism adapted for aligning a laminate in accordance with the invention.

FIGS. 7-12 illustrate various essential aspects of the apparatus of the invention. FIG. 7 particularly illustrates the x, y and $\theta$ stages 110,112 and 114 respectively. These stages are connected in series with one another. Stage 112 is mounted on stage 110 and stage 114 is mounted on stage 112. These stages are motorized stages driven and controlled by electrical signals and power which result from the associated electrical circuitry to be described hereinbelow. These stages function according to the measurements necessary to establish an electronic null as between the targets and their respective references or crosshairs as will be described in greater detail hereinafter. The apparatus basically consists of a die set 116 and a punch set 118. The die set 116 is stationary. The punch set 118 moves vertically as indicated by arrows 120 and 122. Located in the die set 118 are a plurality of punches indicated by way of example at 124,126,128,130,132 and 134. This number of punches is greater than that necessary to make the four holes indicated in FIG. 1. This is to illustrate that the punches of the invention can be made according to order and need not be restricted to the provision of four punches in cruciform relationship as may have been implied above. The punches are movable or adjustable in a direction normal to the plane of the drawing. This, for example, may be provided as indicated by, for example, slots 136 and 138 into which extends the track members 140 and 142. The punches are adjustable to enable the punching of laminae of different sizes. Thus, for example, for one production run the apparatus of the invention may be set up for one size of lamination whereas for another run the punches may be set up for a different size of laminae. This adjustment which constitutes a minor feature of the invention will be discussed in greater detail hereinbelow.

Some of the dies cooperating with the punches are indicated at 144,146,148 and 150. These dies cooperate with the punches in a conventional manner to provide for a punching through the substrate mentioned hereinabove to form the openings or holes which have already been discussed in detail.

The die set 116 supports mounts such as indicated at 160 and 162 which in turn support bearings 164 and 166 which are in the nature of roller bearings. These roller bearings and others which are not shown in this drawing support adjustable table sections 168 and 170 upon which rest the substrate or lamination to be punched.

These adjustable table portions are coupled to the stages 110,112 and 114 thereby to enable an adjustment of the lamination with respect to Cartesian and polar coordinates thereby to bring the targets into alignment with the associated references.

Also indicated in FIG. 7 is the conveyor 172 which is intended to convey the laminations after they are punched rearwardly and outwardly through the back of the apparatus. However, at the outset for purposes of initial and rough alignment of the lamination there are provided sets of stops. These stops are positioned at either the lefthand or the righthand side of the machine and at the rear of the machine. The rear stops are shown at 180 and 182. They are extensible and retractable. They are extended in order to provide a rough positioning of a lamination for purposes of the punching thereof at the beginning of the operation. Associated therewith are crowders which urge the lamination against the back stops 180 and 182 in the extended positions of the latter. The back stops 180 and 182 are withdrawn to retracted position out of a position of interference with the lamination which is being or has been punched in order that such lamination may be ejected from the apparatus. The directions in which the back stop pins 180 and 182 are extended and retracted are indicated by arrows 184 and 186. Their association with other elements will be referred to hereinbelow.

Also shown in FIG. 7 are the cameras 190 and 192. The detailed requirements of these cameras have been discussed hereinabove. These cameras function relative to visual paths indicated at $VP_1$ and $VP_2$. Associated with these cameras are flattening pads 194 and 196. These flattening pads operate to pin down the lamination being operated upon in order that they be retained in fixed focal position relative to the cameras 190 and 192 for purposes which are too obvious to warrant discussion in this text. The details of cameras 190 and 192 will be discussed in greater detail hereinbelow. In the meantime, reference is next made to FIG. 8 which shows the movable table sections 168 and 170 as well as movable table sections 200 and 202. In the preferred embodiment of the invention, these movable table sections are fixed to one another and are collectively displaceable. They bear thereon and cooperate with vacuum sections such as discussed in prior U.S. Pat. No. 4,568,971 for purposes of holding a lamination thereon for treatment purposes. Thus, the laminations are held on the tables by the vacuum equipment associated with the movable tables while, at the time of measurement and punching, they may be held by the flattening pads which have been discussed hereinabove.

Figure 8:
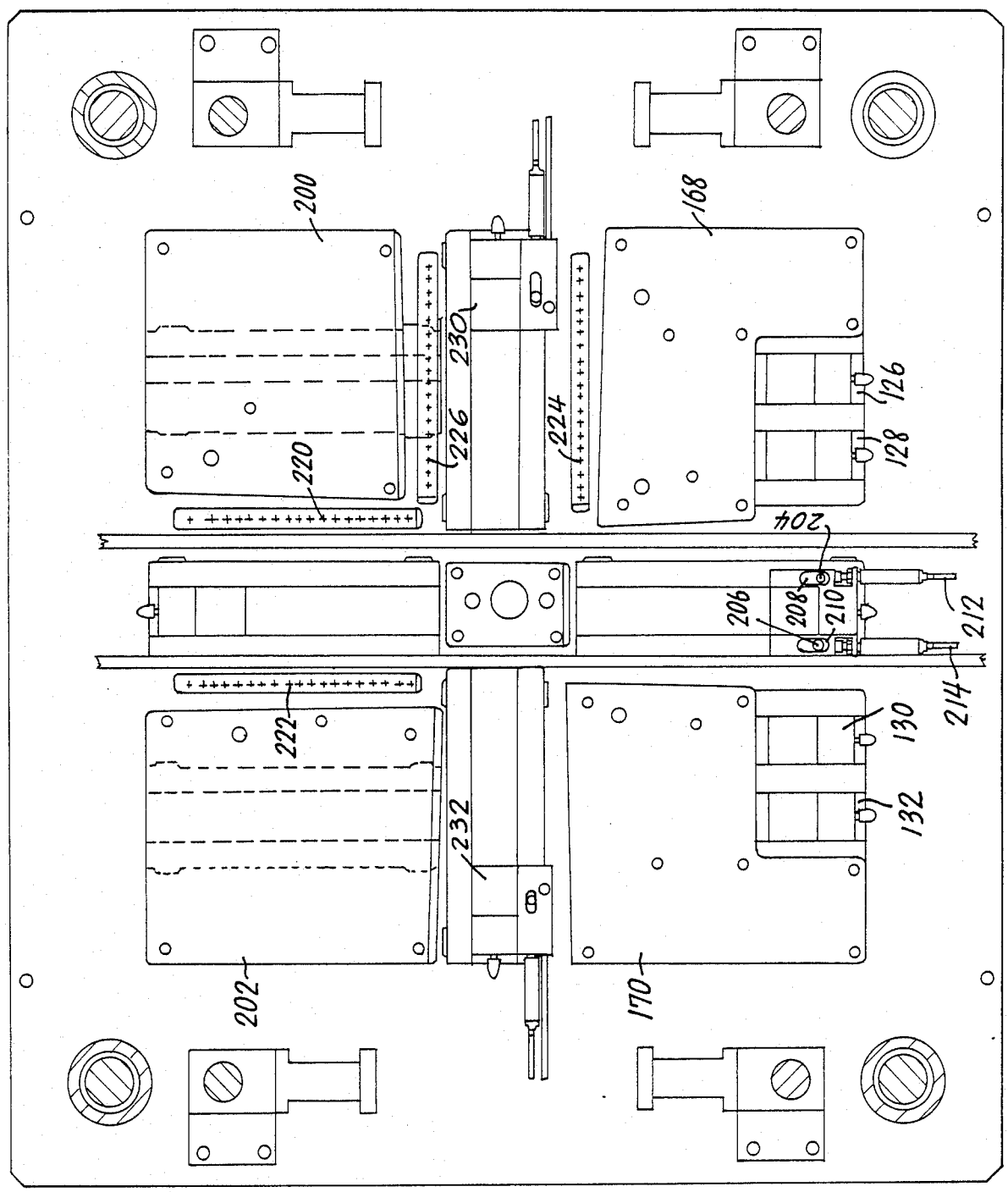
FIG. 8 is a top view of a workpiece positioning assembly for positioning a laminate in accordance with the invention.

The instant drawing illustrates additional auxiliary punches 126,128,130 and 132. These have been discussed above. FIG. 8 furthermore shows the crowders 204 and 206. These crowders are normally retracted within the slots 208 and 210 to permit the entry of the lamination which is to be treated. Once the lamination has passed by the crowders, they are extended by pneumatic pressure supplied via lines 212 and 214 and work with a crabbing or intermittent crowding action to urge the lamination rearwardly against the stops which have been indicated hereinabove.

The rows of positions 220 and 222 indicate positions at which the back stop pins may be located and to which they may be adjusted. These positions are intended to accommodate various front to back dimensions of different sizes of laminations. Similarly, rows of positions 224 and 226 are intended to accommodate different widths of laminations from left to right. The different positions provide for the adjustable location of stop pins which are intended for roughly positioning the laminations with respect to the lateral dimension thereof.

Lateral and adjustable punches are indicated at 230 and 232. These punches will punch the holes or slots relative to the desired spacing thereof along the x axis discussed hereinabove.

Figure 9:
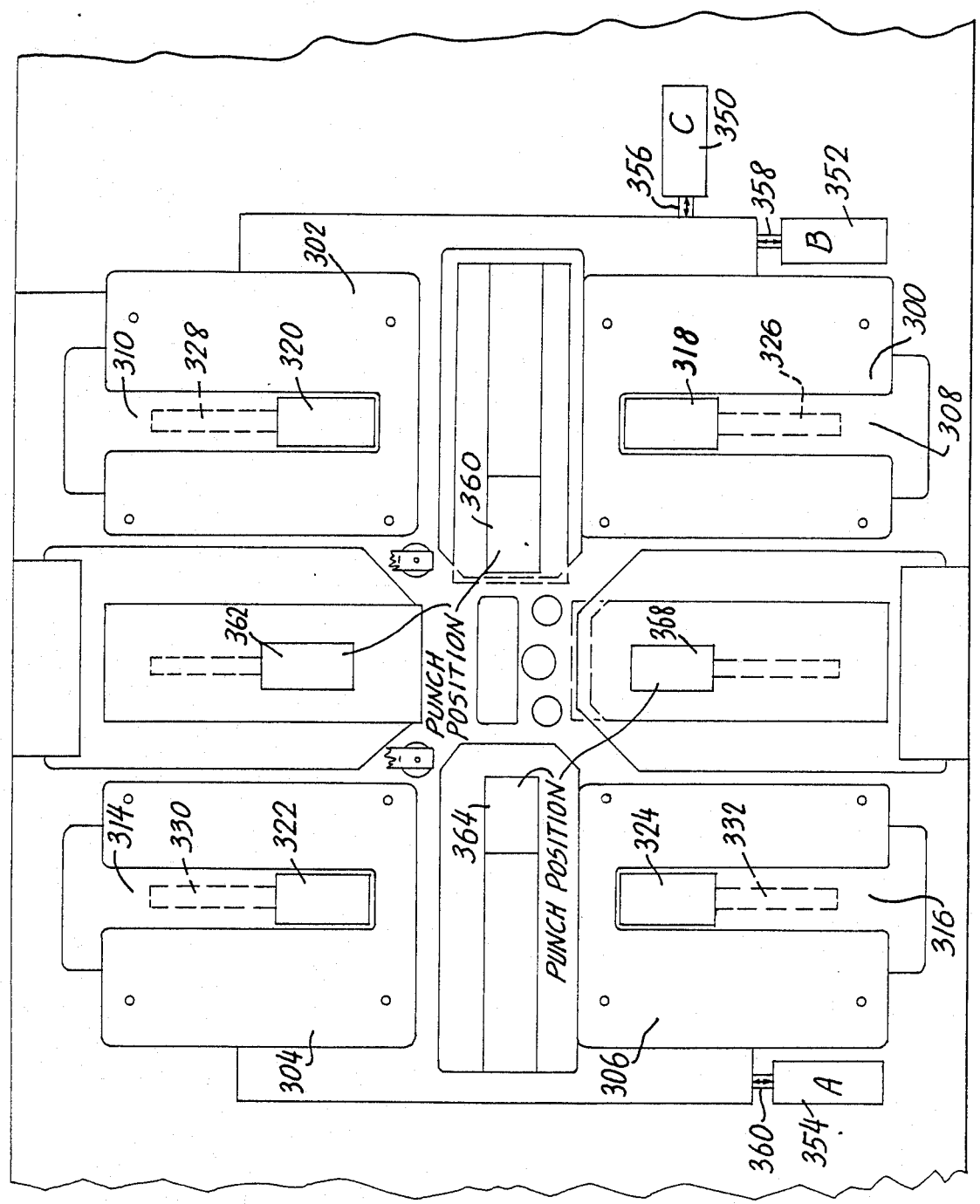
FIG. 9 is a top view of a positioning table assembly for cooperating with the assembly of FIG. 8 in accordance with the invention.

FIG. 9 illustrates positioning tables 300,302,304 and 306 having slots 308,310,314 and 316 therein. These slots permit the displacement of the punching mechanisms indicated generally at 318,320,322 and 324 for purposes of accommodating different sizes of laminations. Adjustment is permitted by tracks indicated at 326,328,330 and 332.

Adjustment of the positions of the various positioning tables is indicated diagrammatically by way of electromechanical or analog devices 350,352 and 354 having links 356,358 and 360 hingedly connected to the associated tables thereby to permit adjustment in the x and y directions as well as curvilinear adjustment with respect to polar coordinates. Further punch positions are indicated at 360,362,364 and 368. The details of the punch positions are shown in FIG. 10-S106 included in the publication Multiline Technology, Accu.Line, Multilayer Alignment System.

FIG. 10 illustrates by way of example one of the camera assemblies involving camera 192 of FIG. 7. Herein it will be seen that the camera is mounted in a block 400 with which is associated an extension 402. The extension 402 receives one end of a fiberoptic bundle 404 which derives light from a halogen light source 406 associated with a parabolic reflector 408. Light from the fiberoptic bundle 404 travels along path 410 and is reflected by a surface 412 to follow light path 414. The light is reflected from the target in the case being illustrated to return via vision path 416. The vision path passes through an opening 418 in reflective surface 412 to be reflected by reflecting surface 420 to follow path 422 thereby to be received via the lens in lens holder 424 associated with camera 192. Thus, the camera will give an image of the target which may be somewhat displaced from the axis 426 to be electronically manipulated and compared with the reference relative to which the target is to be adjusted, all as has been discussed hereinabove relative to FIGS. 1-6.

FIG. 11 shows one of the back stop pins, namely, pin 182, adjustable in block 450 and operable in response to a source of pneumatic pressure indicated generally at 452. The source 452 is effectively a piston and cylinder combination by means of which the rod is extensible relative to the slot 454. Also associated with the block 450 is the reflecting surface 456 which receives light from light source 458. This light follows the path upwardly through the laminate substrate indicated at 460 and bearing thereon the target 462 encircled by ring 464. The target is supported in field 466 as has been mentioned hereinabove. Assisting in holding down the lamination is the displaceable spring clip 470 which is movable into and out of the effective position as shown by arrow 472. This movement is effected by means of the piston and cylinder combination indicated at 474. Lines 476 and 478 supply controlled air under pressure to the piston and cylinder combinations 452 and 474.

From the above description of FIGS. 7-12 it is seen that the apparatus of the invention receives sequentially laminations which are manually fed and which are brought into rough final position by means of a crowder and stop pin arrangement whereafter images of the various targets are picked up and data assembled with respect thereto. This data is assembled and dealt with by electrical circuitry to be discussed in greater detail hereinbelow. The function is to bring the lamination being treated and being presently supported on displaceable tables to appropriate position for being punched by adjustment of these movable tables under control of the x,y and θ stages as mentioned hereinabove. The laminations are held in position by vacuum apparatus and by positoning pads in order that the lamination being treated have the same attitude as the adjustable tables and in order that the lamination being treated be in appropriate position for being focused upon by the associated cameras. The operation of the punches is postponed until appropriate alignment has been detected. At this point the punches are operated, the desired holes are punched in exact position into the lamination being treated whereafter the back stop pins are cleared and the thusly punched lamination is ejected from the apparatus, thereby clearing the way for repeating the operation.

Figure 13A:
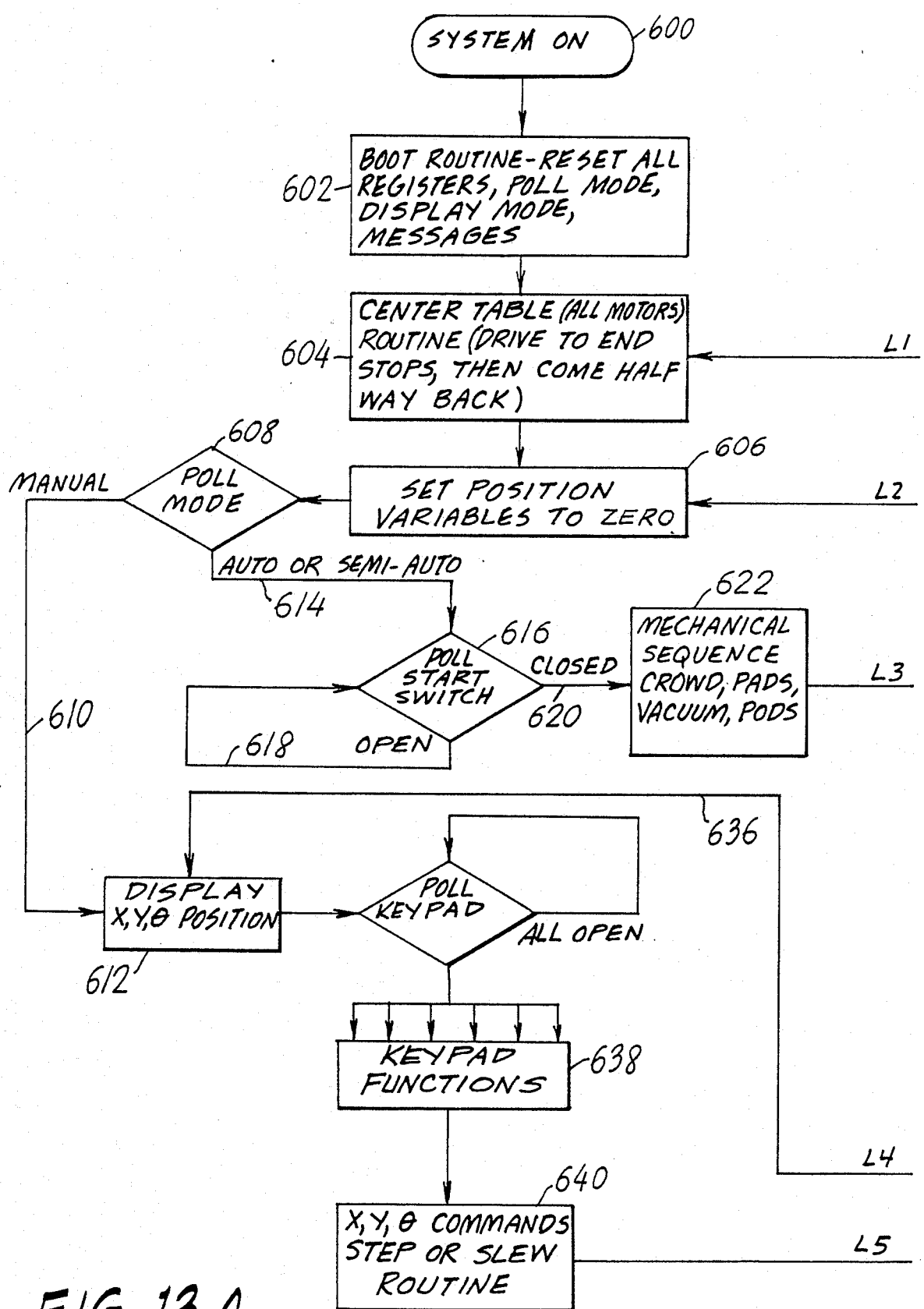
FIGS. 13A and B constitute a flow diagram illustrating the general procedure employed with the apparatus of the invention in one of the various modes of operation thereof.
Figure 13B:
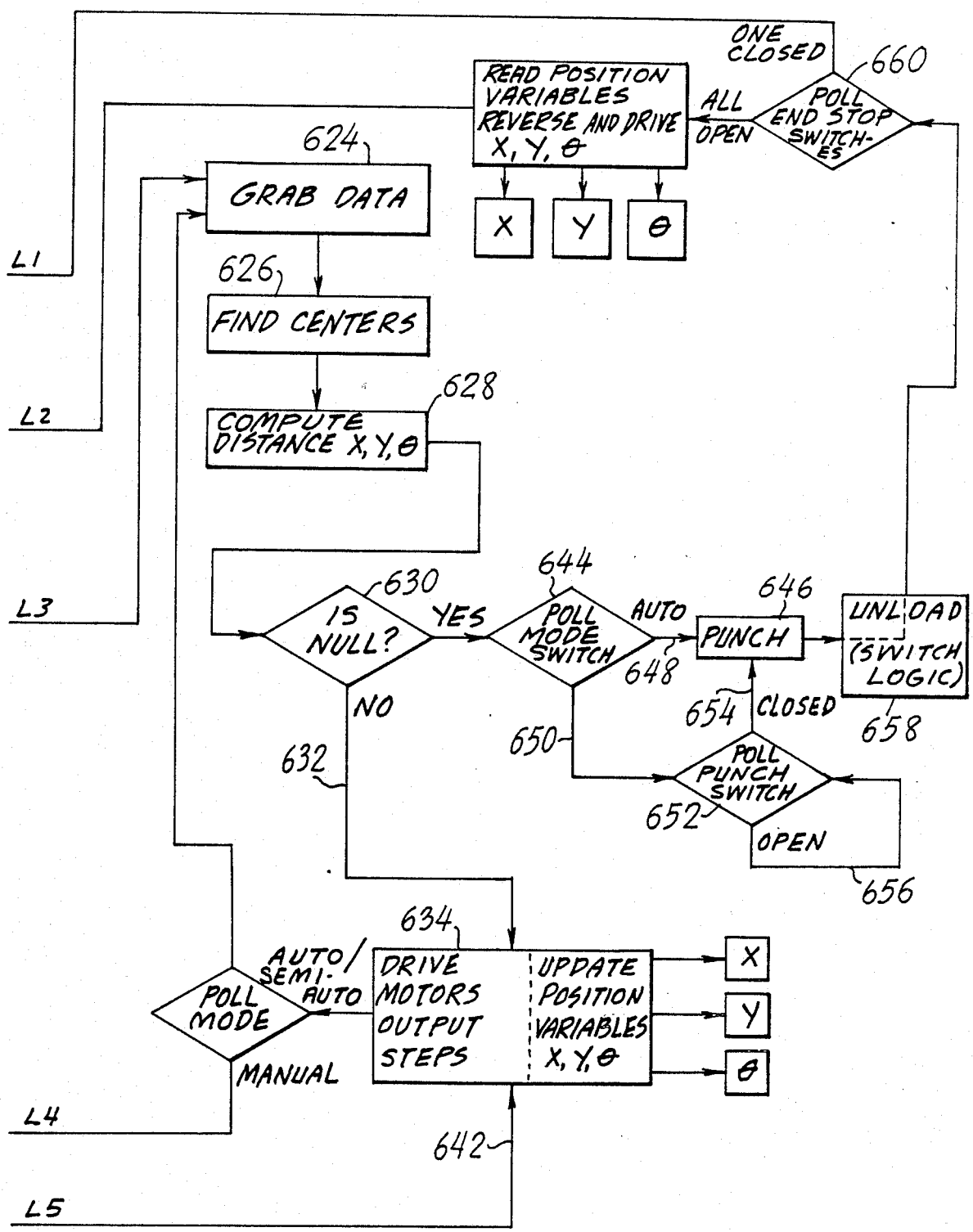
Figure 14A:
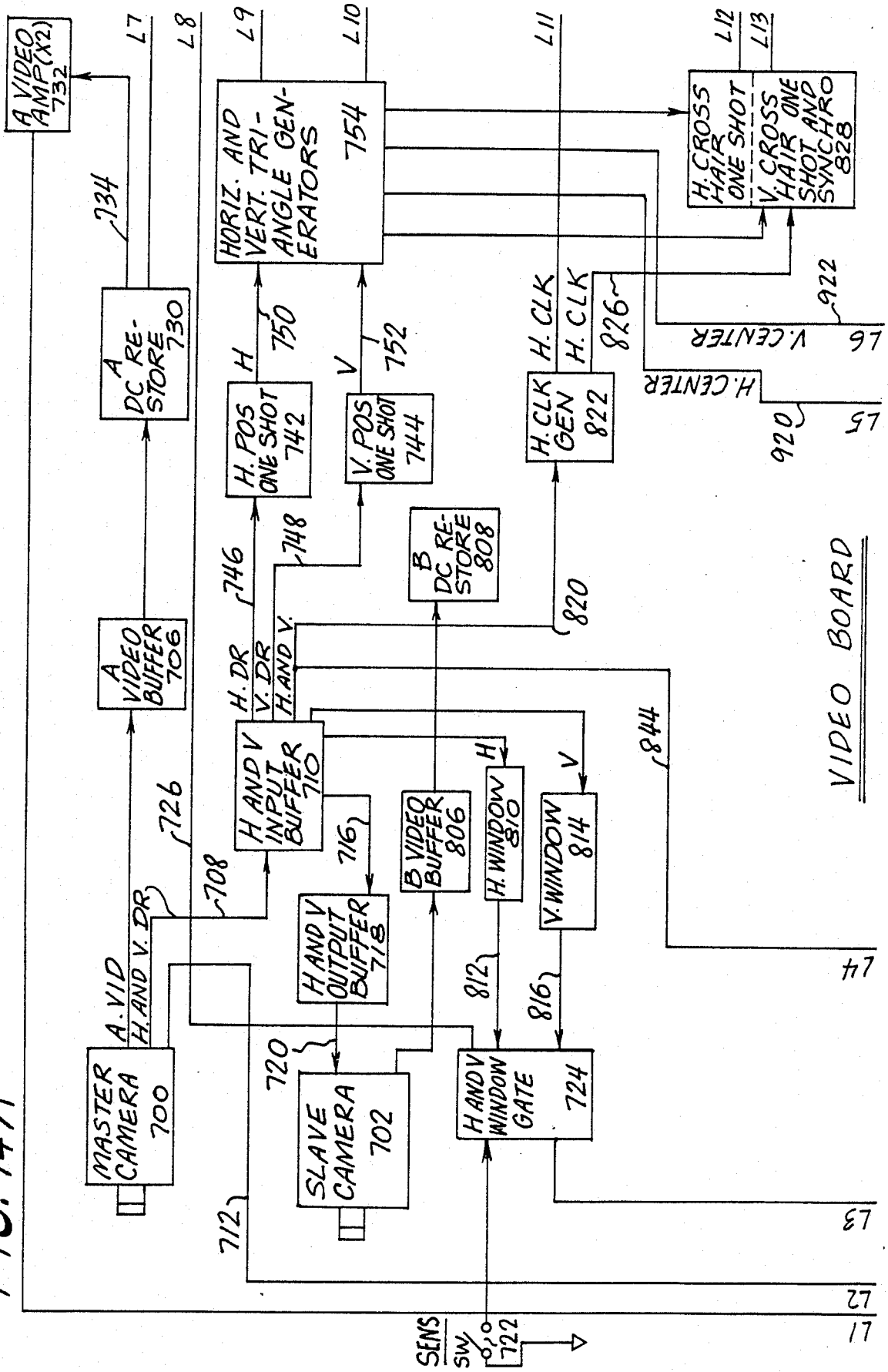
FIGS. 14A-D constitute a block diagram illustrating the operation of the electronic circuitry of the invention.
Figure 14B:
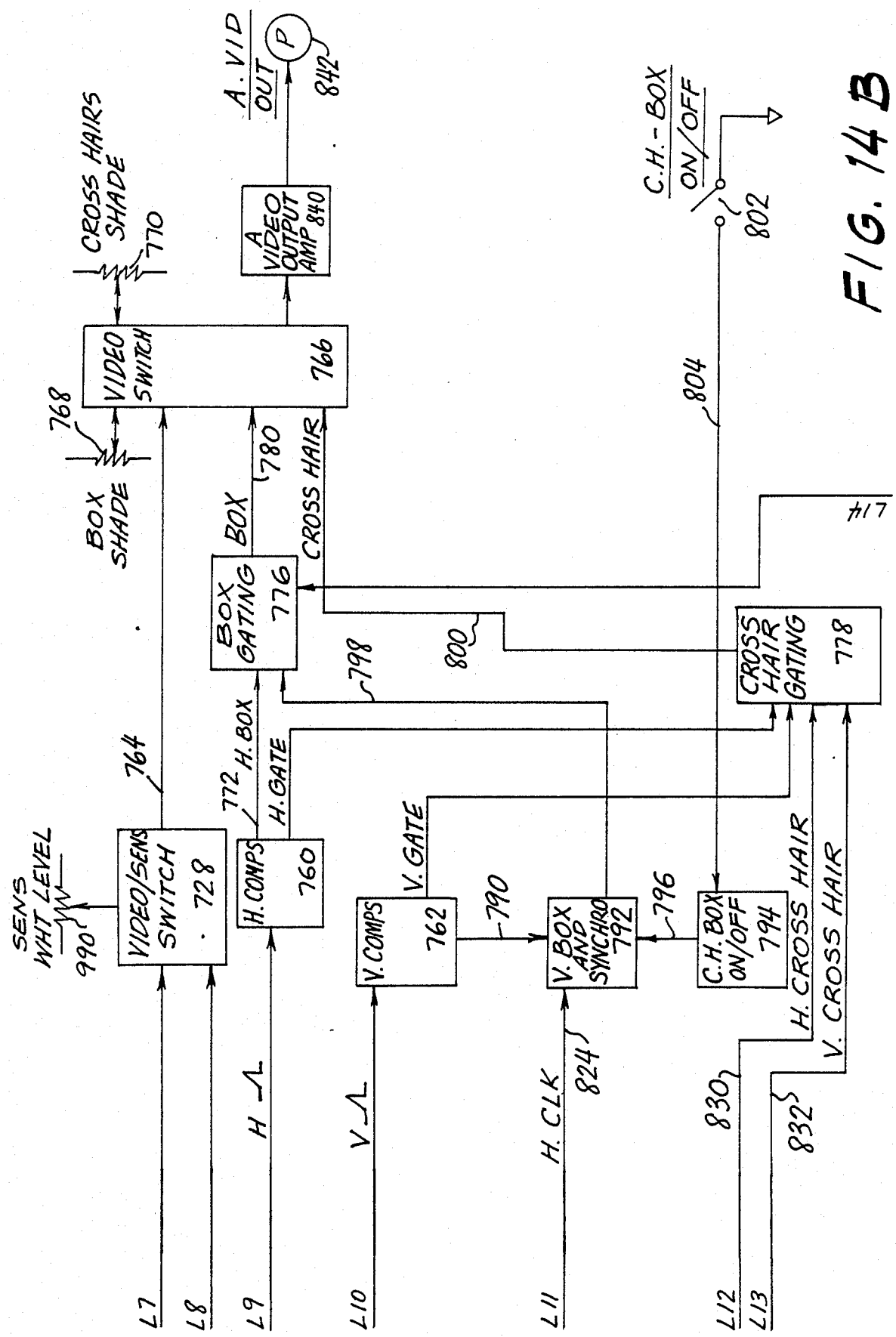
Figure 14C:
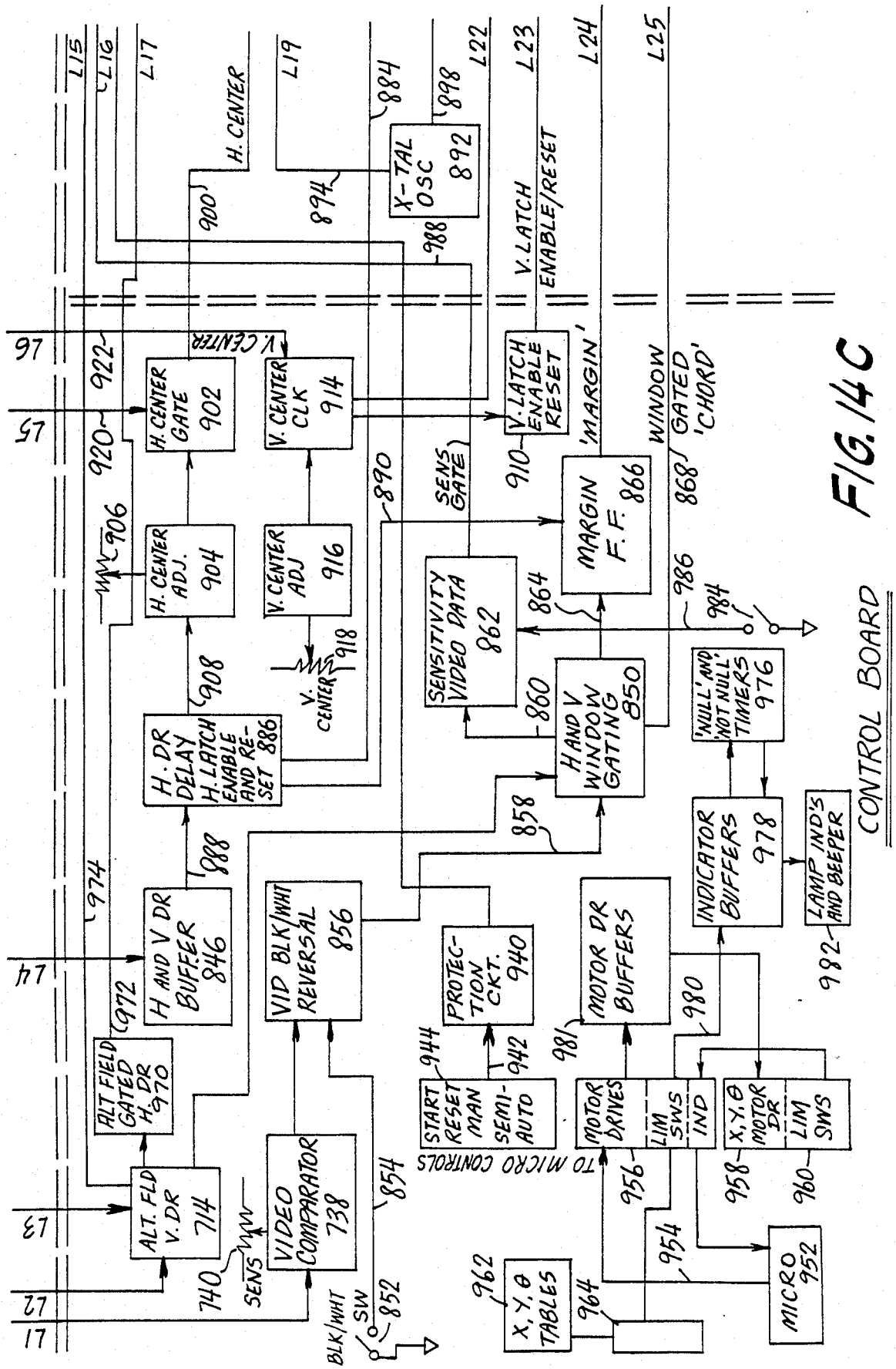
Figure 14D:
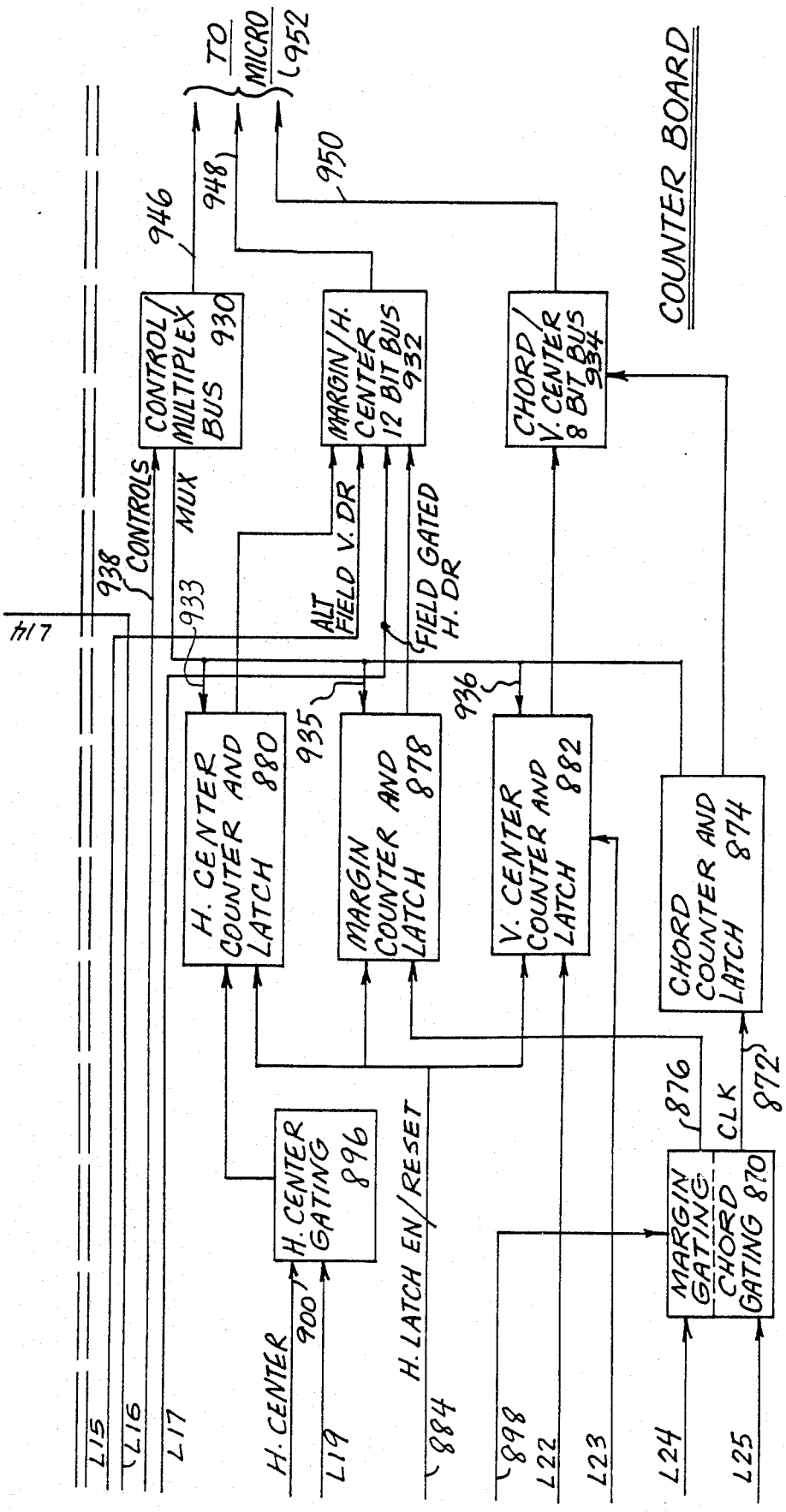
Figure 15A:
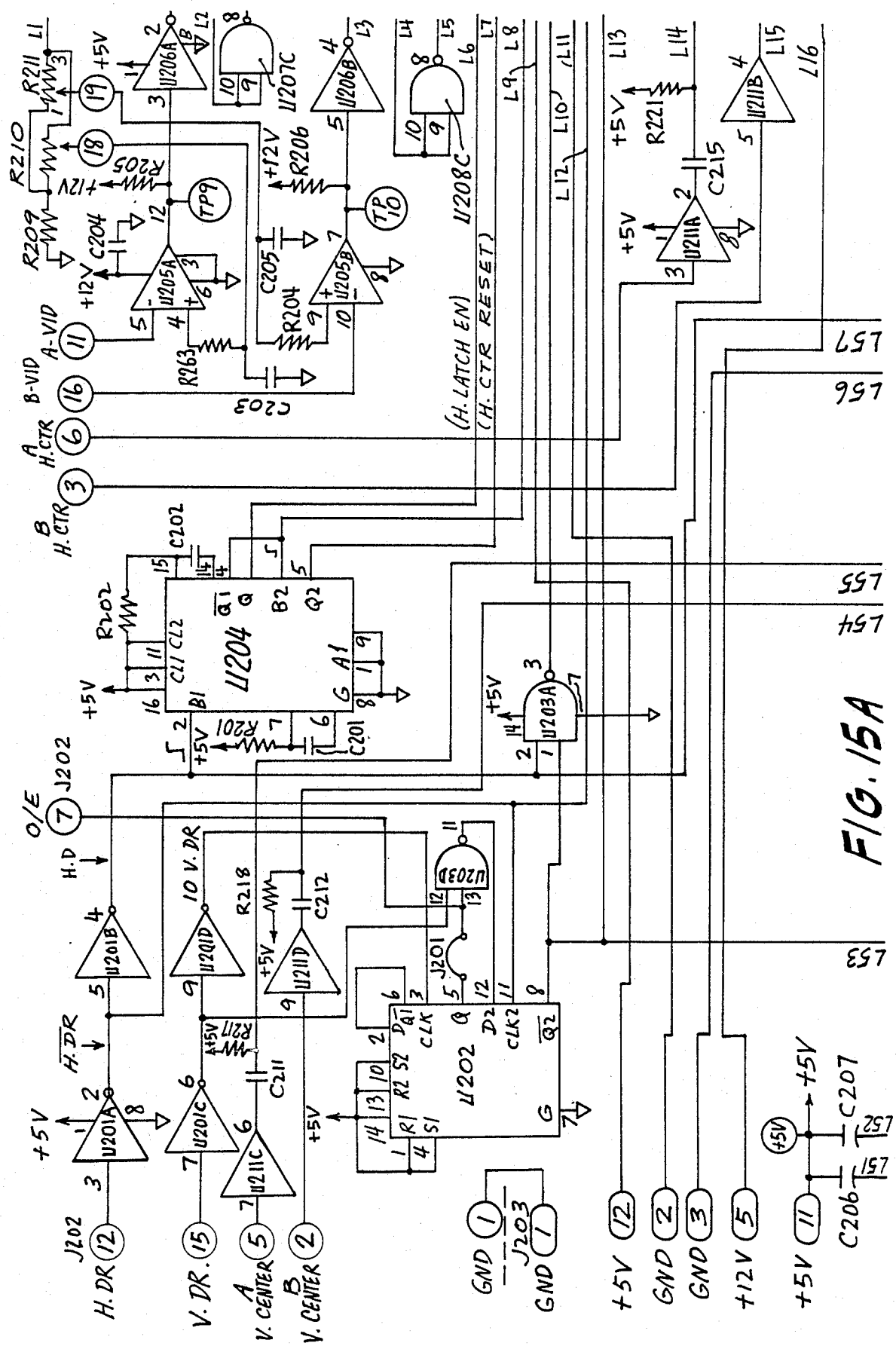
Figure 15B:
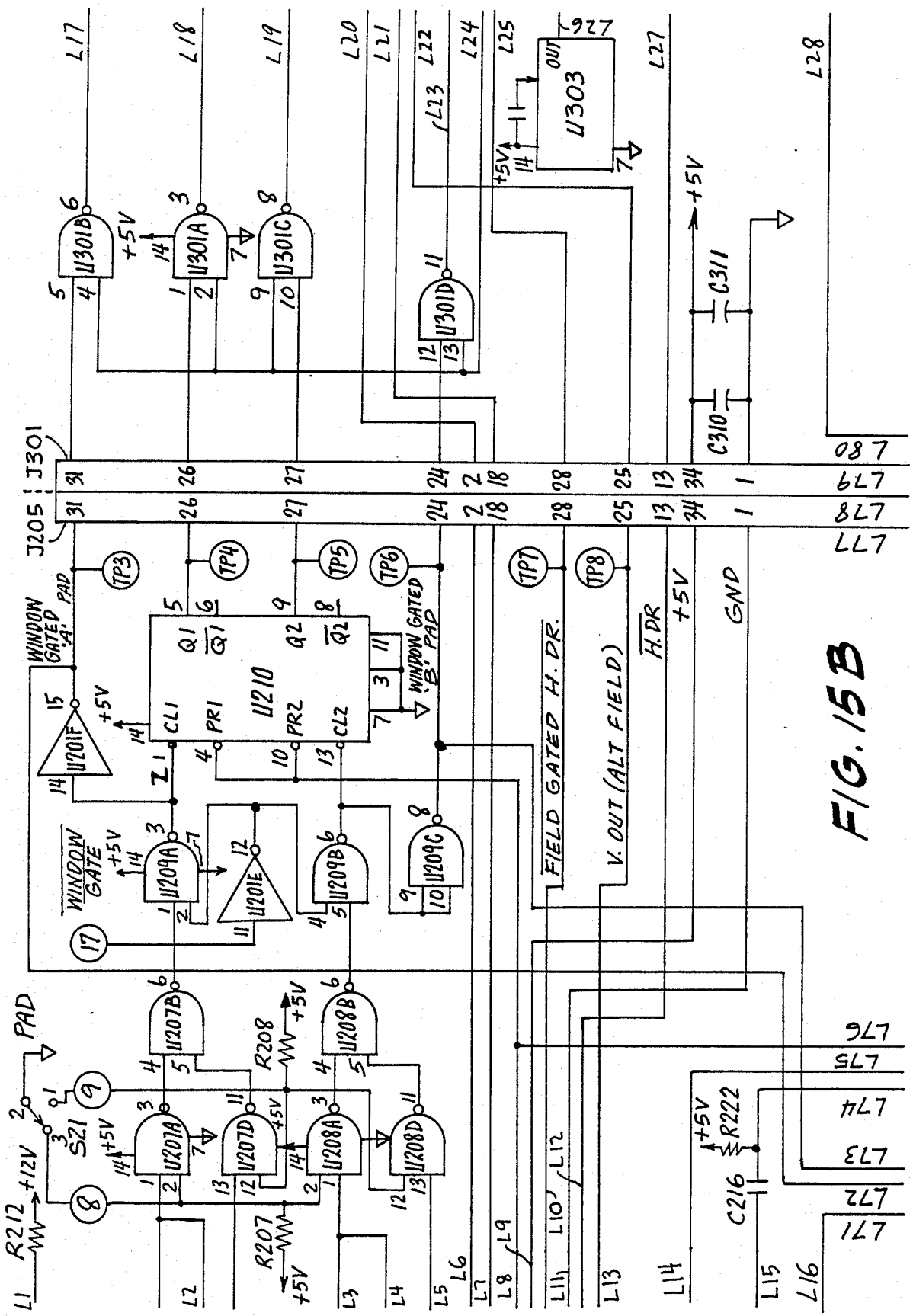
Figure 15C:
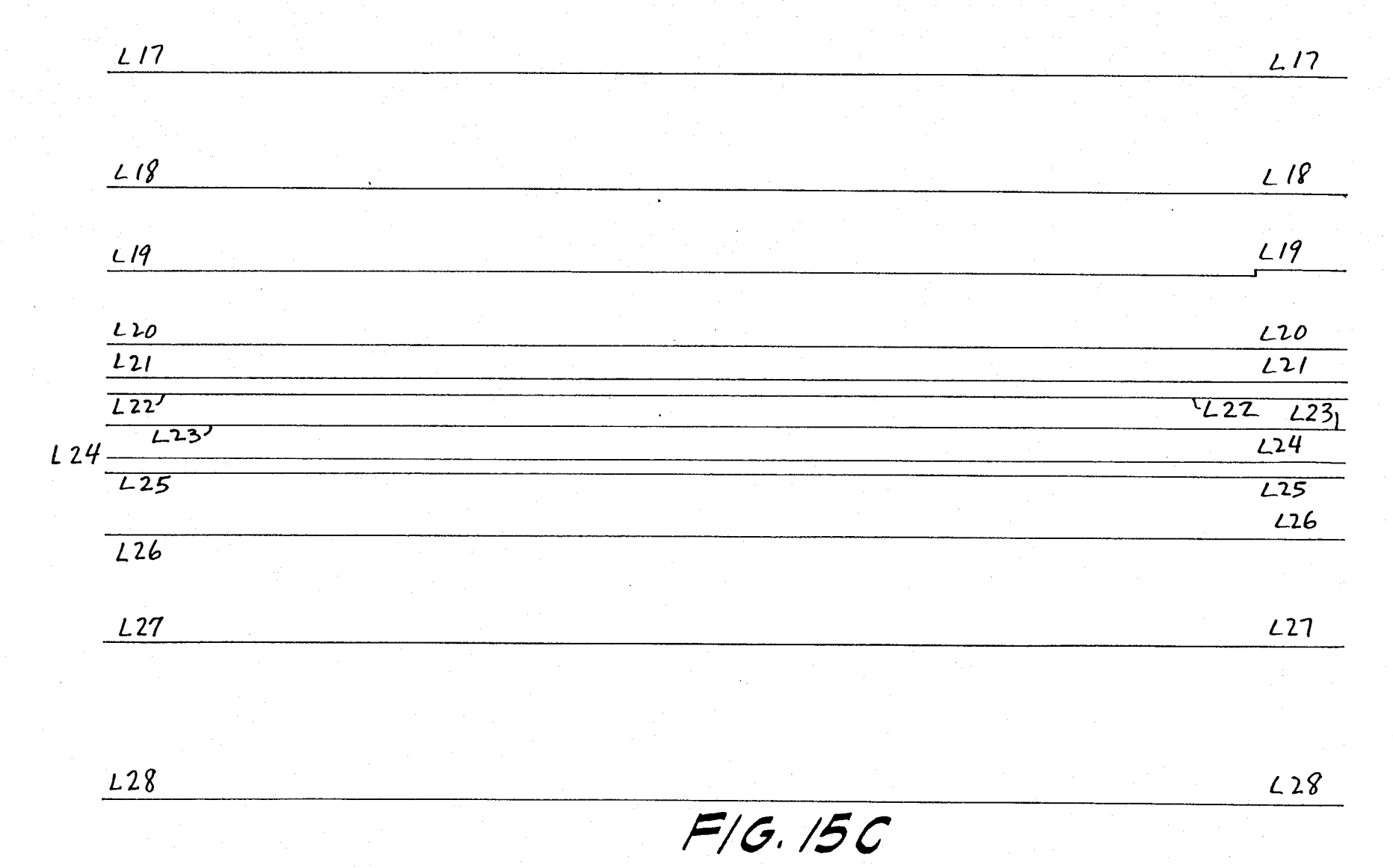
Figure 15D:
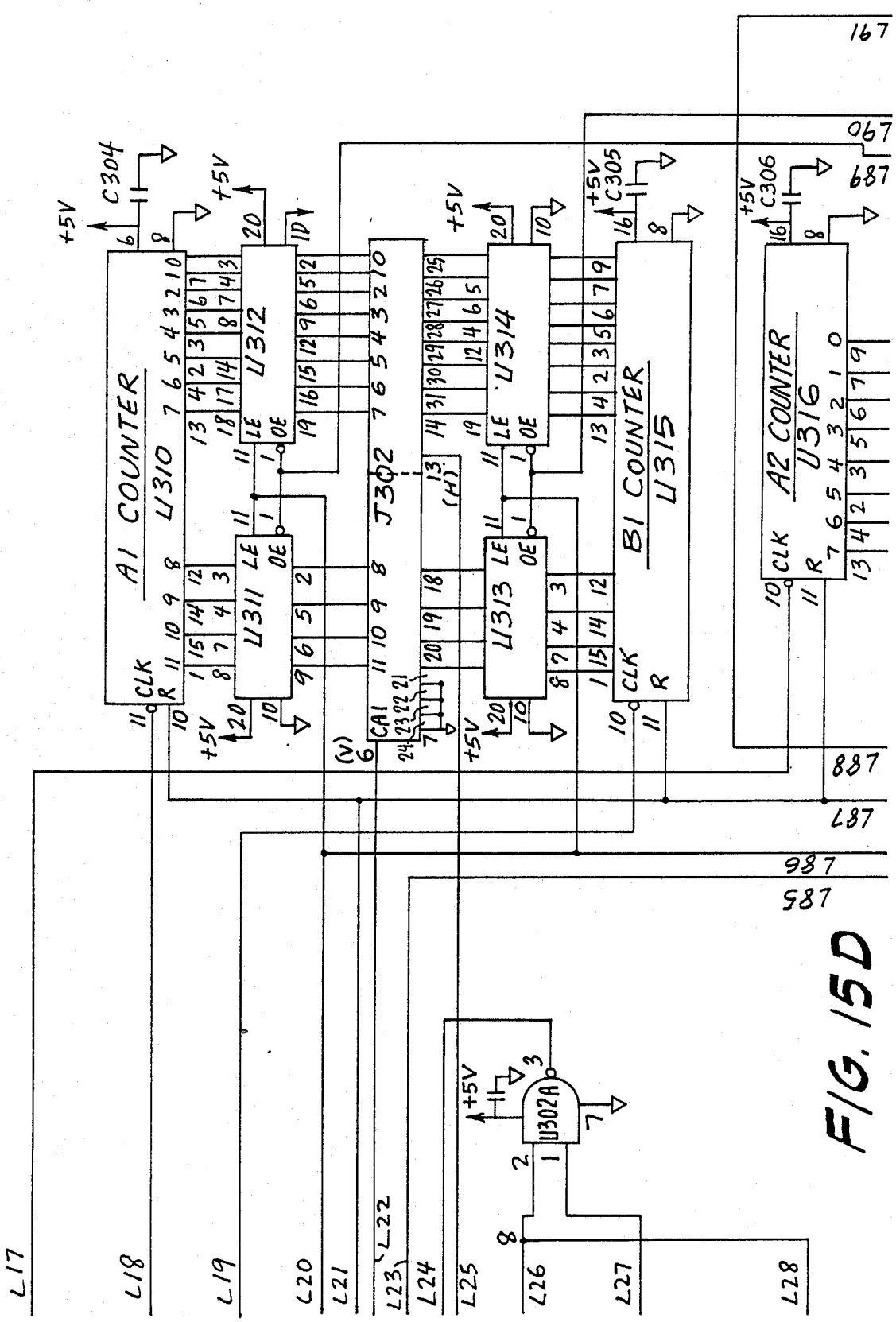
Figure 15E:
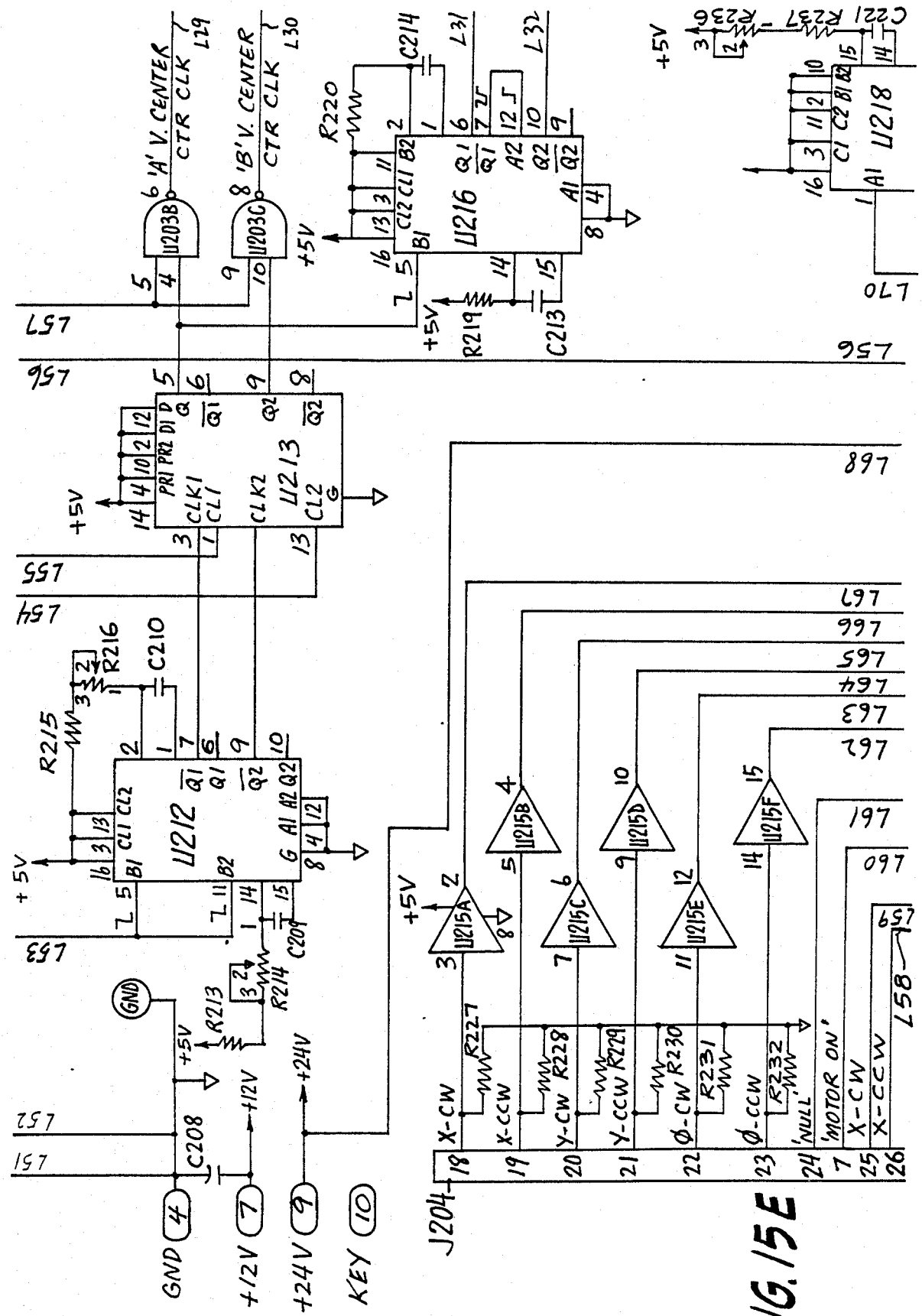
Figure 15F:
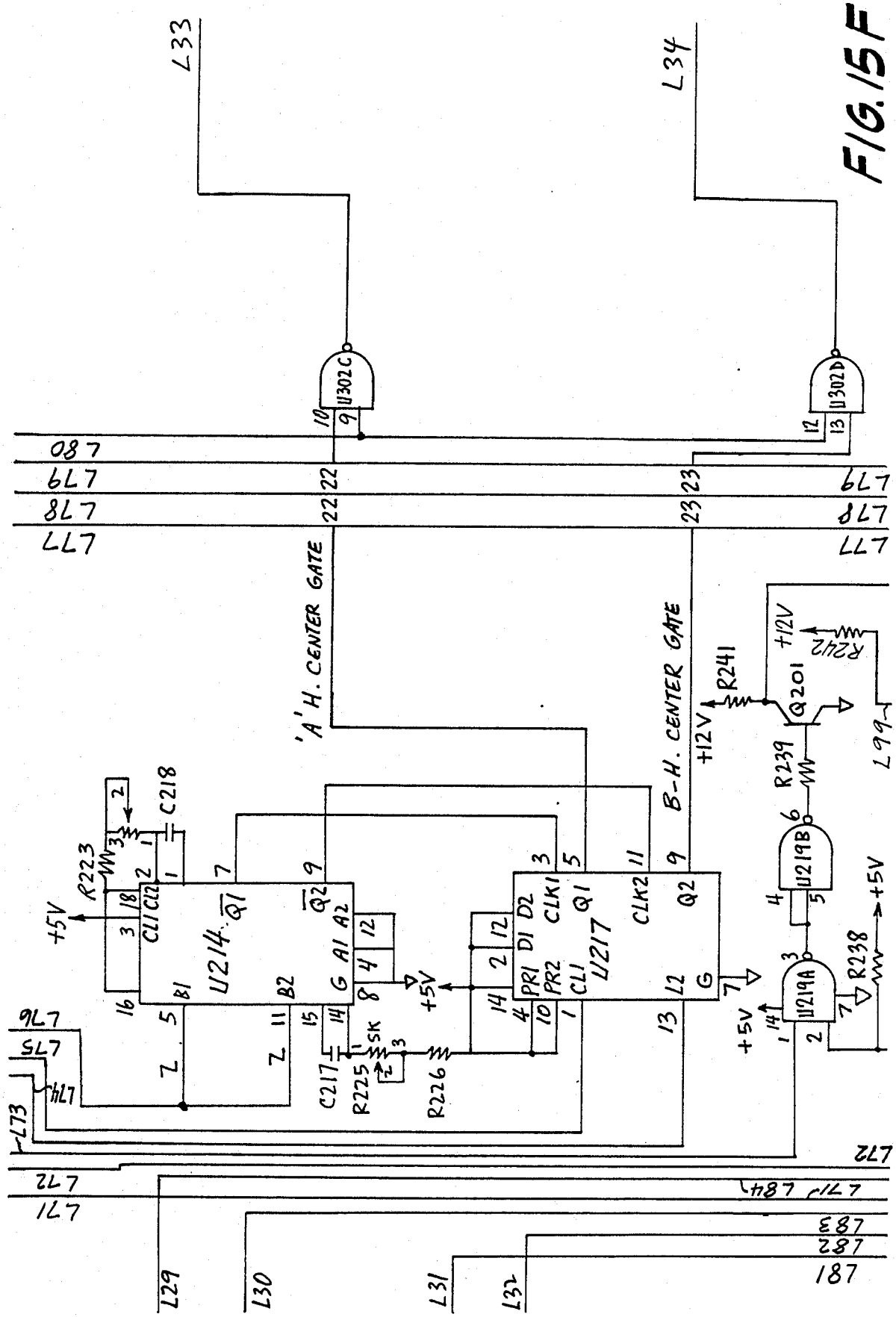
Figure 15G:
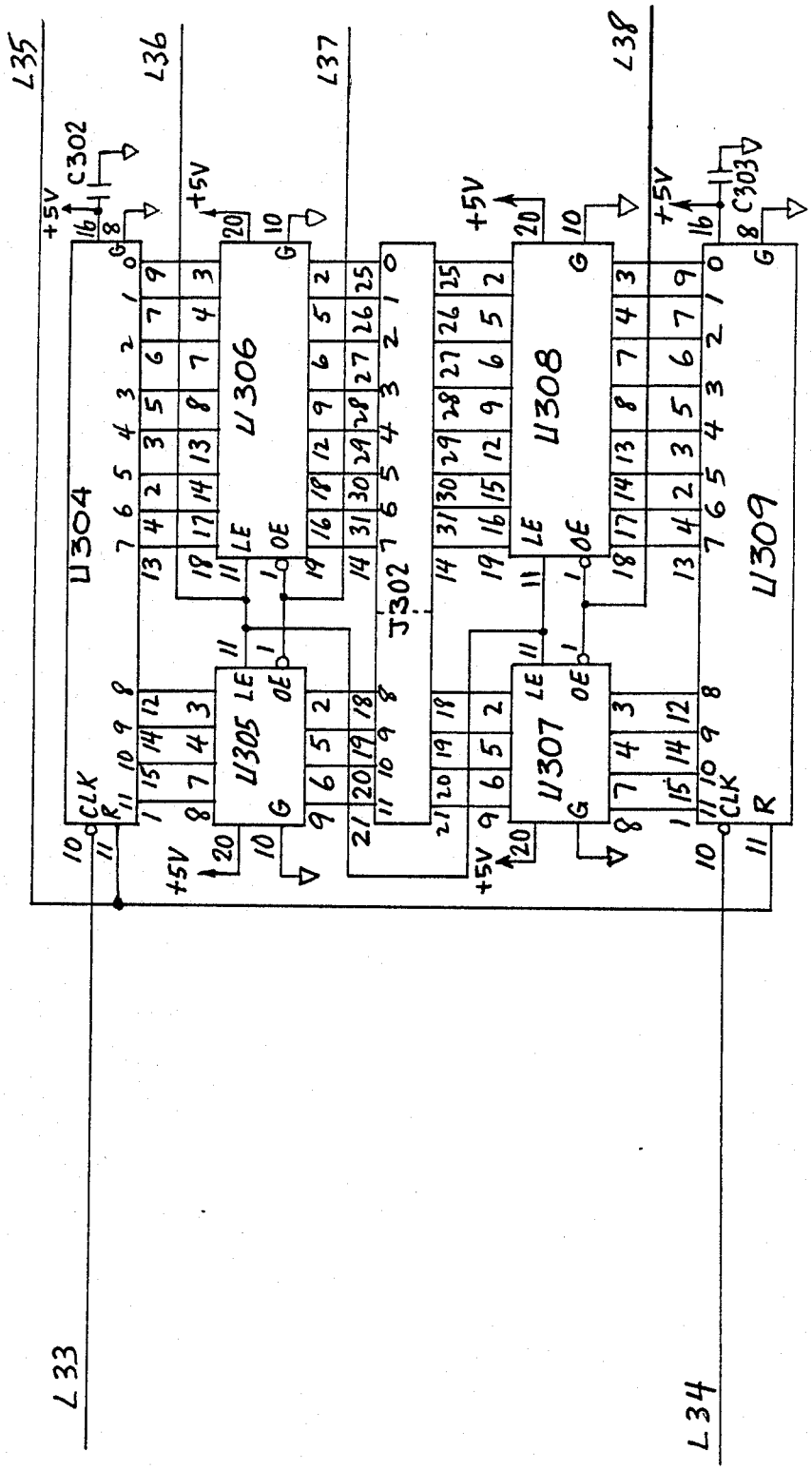
Figure 15H:
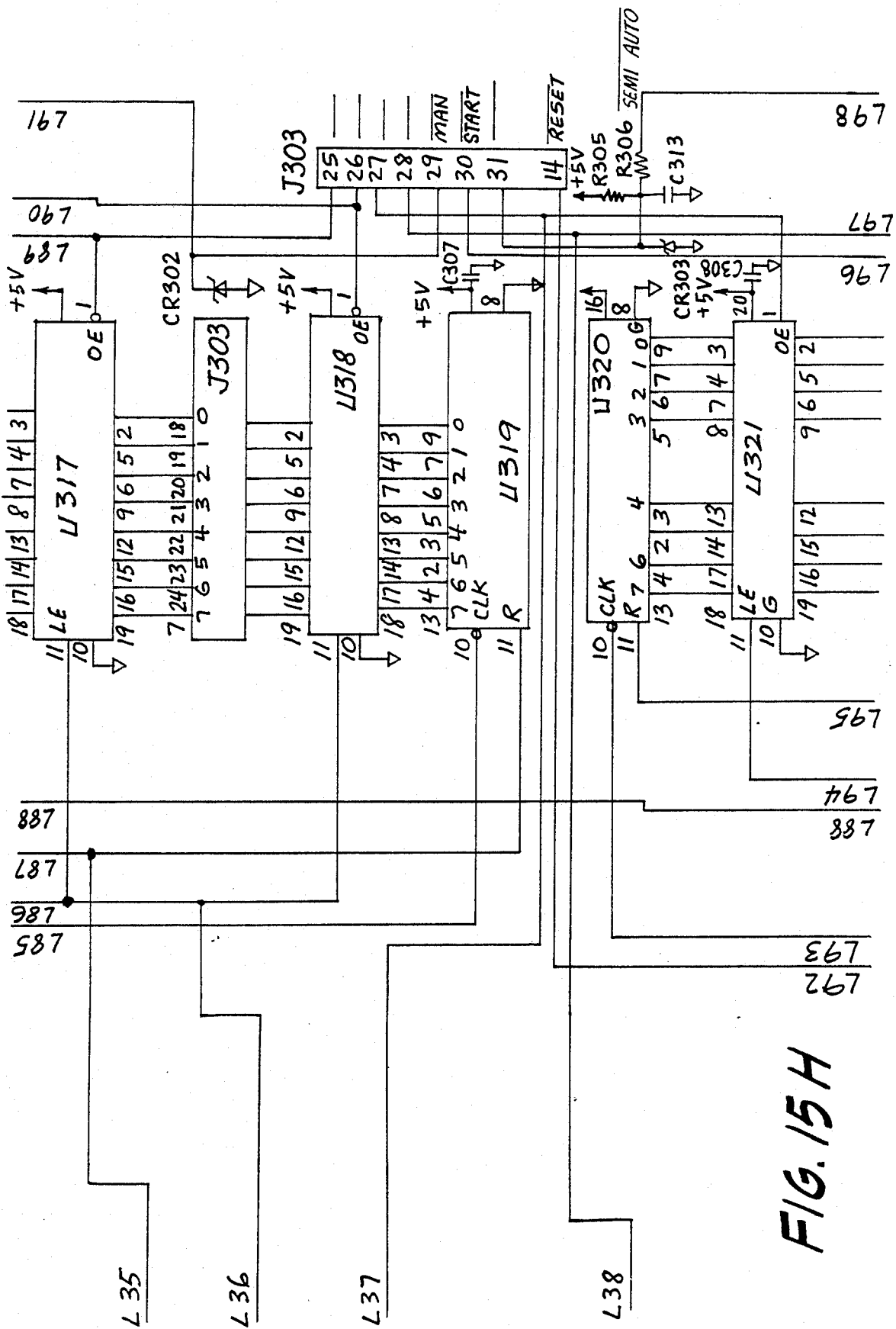
Figure 15J:
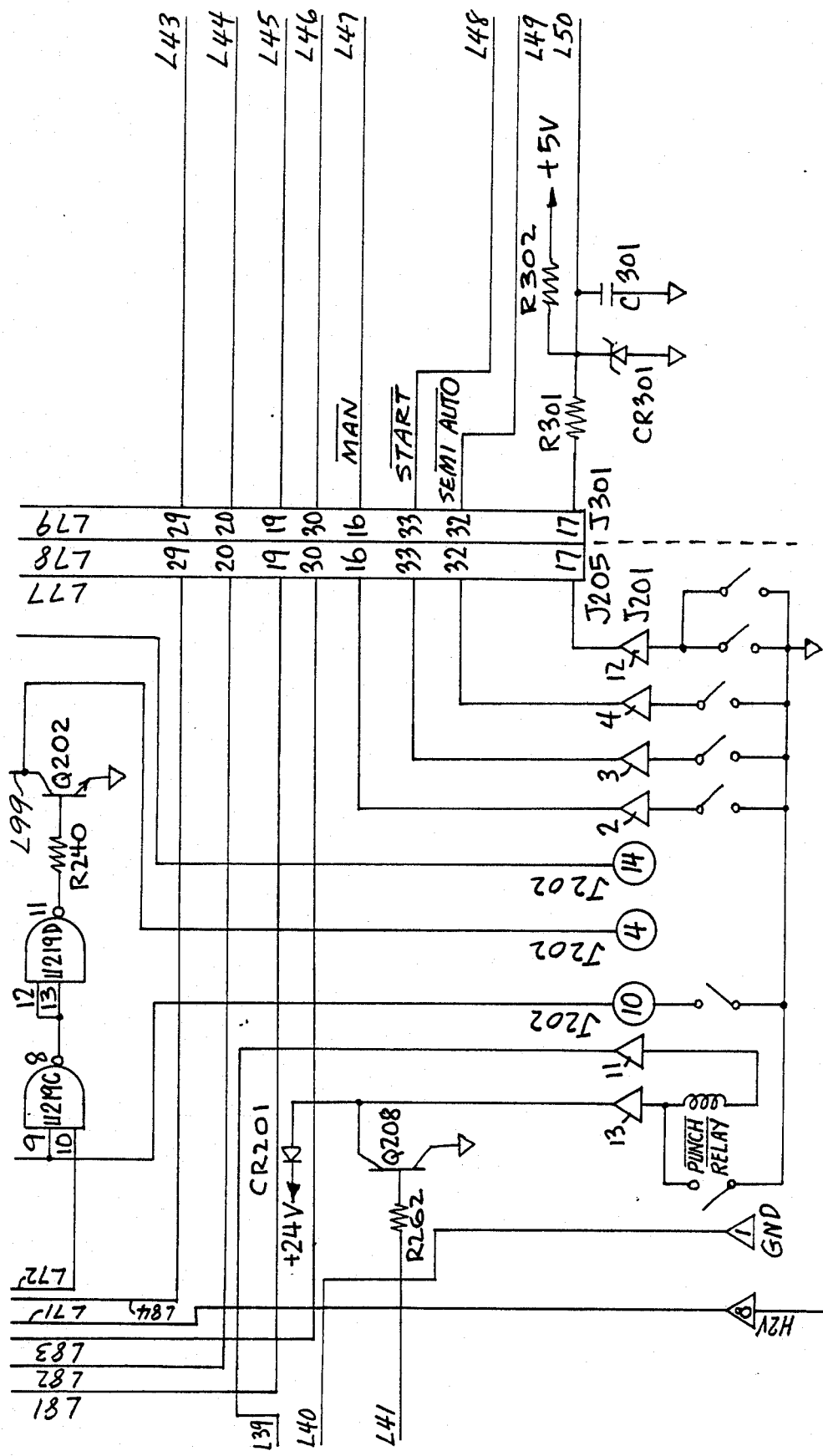
Figure 15K:
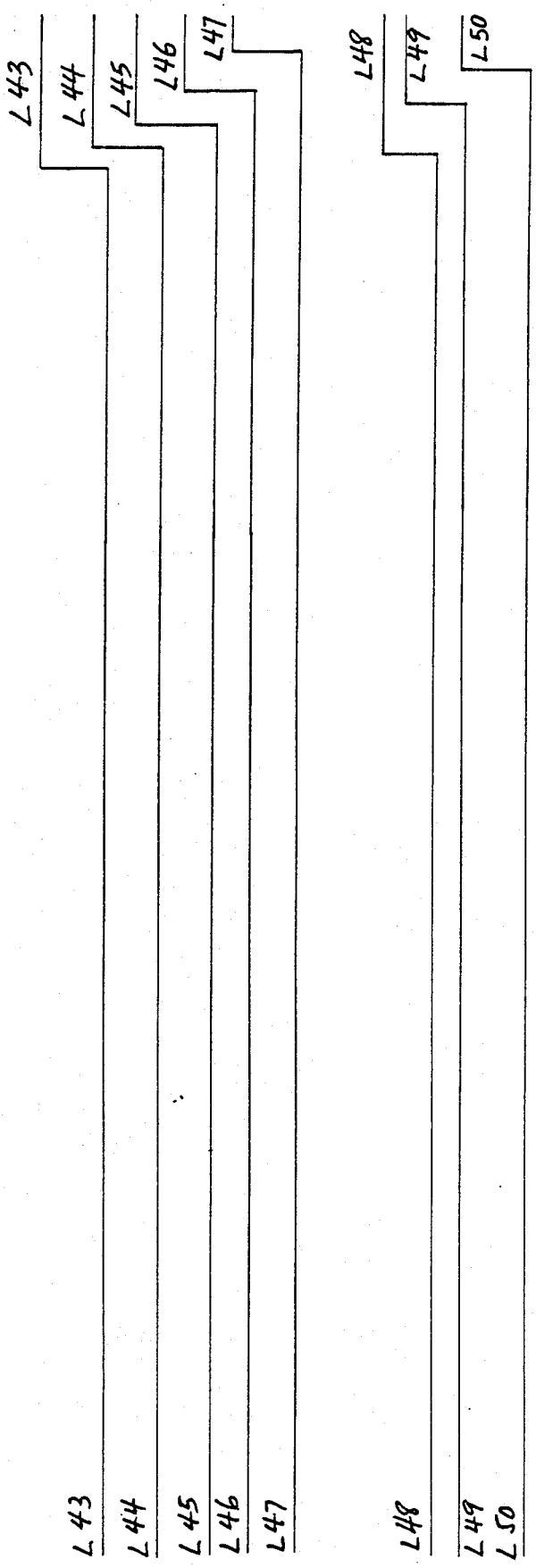
Figure 15L:
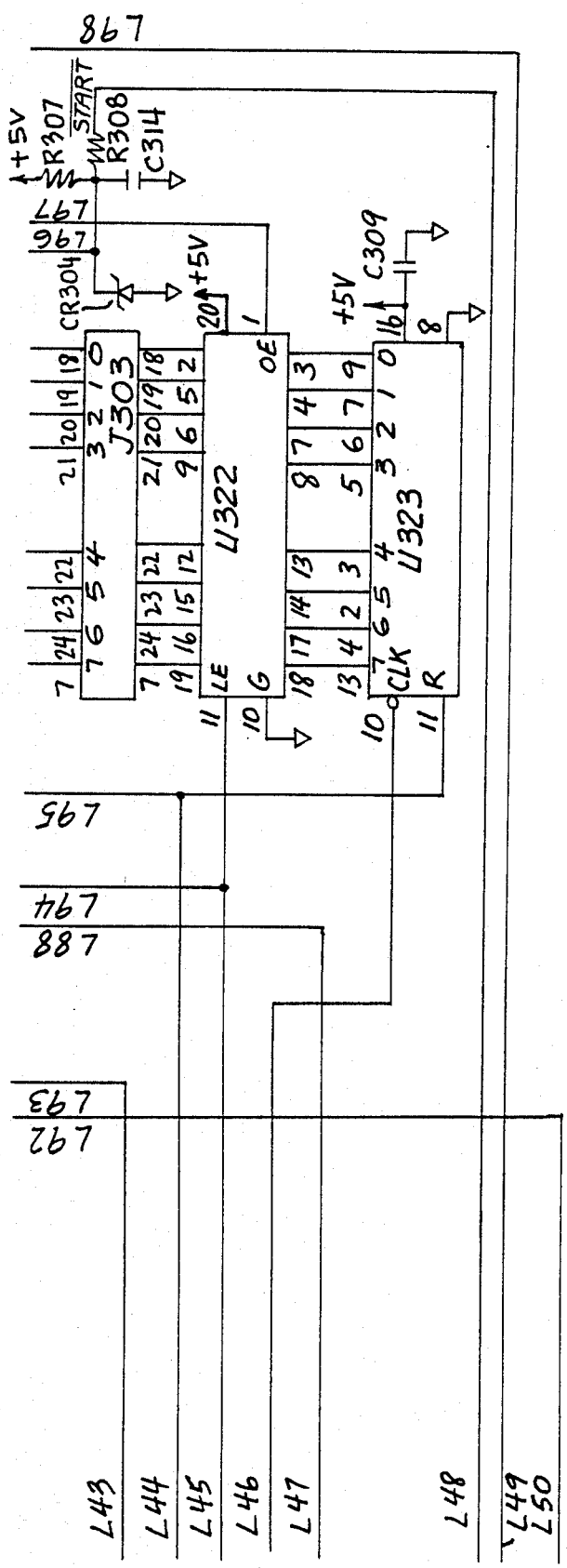

FIG. 13 illustrates a flow diagram showing the general operation of the apparatus of the invention equipped for manual, automatic or semi-automatic modes. At 600 is indicated the system on stage. Thereafter at stage 602 provision is made for resetting all registers (as appears in FIGS. 14–16) and for polling the mode in which the apparatus is to operate. Stage 602 furthermore indicates the effectiveness of the display mode and messages which are to be delivered to the operator via an appropriate display. At 604 appears the stage of operation whereby the tables are centered along with the motors driving the same. As noted, the tables are driven to end stops and then are returned halfway in order to effect centering of the same. At 606 occurs the stage whereby the position variables are set to zero and thereafter a poll is made of the various modes. If the mode is manual, as indicated by line 610, the equipment moves right ahead to display the x, y and θ positions as indicated at 612. If the operation or mode is automatic or semi-automatic as indicated at line 614, the operation proceeds to stage 616 at which a determination is made as to the status of the start switch for the electronic apparatus. If the start switch is open as indicated at line 618, the polling of the start switch continues. If the start switch is closed, as indicated at 620, the stage is effected involving mechanical sequence as indicated at 622. This provides for crowding the laminate to be treated against the stop pads and further provides for operation of the position path and vacuum or clamping apparatus. Thereafter occurs stage 624 entitled Grab Data which enables the obtaining of data and the functioning of the electronic circuitry in successive steps involving finding centers as indicated in stage 626 and computing the necessary displacement distances with respect to the x and y coordinates and the θ or polar coordinates as indicated at stage 628.

Thereafter, the question is determined as to whether null has occurred. This appears at 630. If the answer is no as indicated at line 632, the motors are driven and the position variables x, y and θ are updated as indicated at stage 634. This information is supplied via line 636 to display the x, y and θ positions. Keyboard functions are indicated at 638 with manual x, y and θ commands being possible as indicated at 640 and by line 642.

If the answer at stage 630 is yes, then according to the poll mode stage 644, the punch is automatically operated as indicated at stage 646 and by line 648. If semiautomatic operation is indicated as indicated at line 650, stage 652 allows the poll punch switch to be operated. Operation is indicated by closed line 654 and open switch maintain stage 652, this status being indicated by line 656. Operation of the punch indicates an unload stage 658 and operates the stop pin switches as indicated at stage 660 and the operation is then ready to be repeated for the next sequential lamination.

The block diagram enabling the above to be performed is indicated in FIG. 14.

In FIG. 14 is illustrated a master camera 700 and a slave camera 702. The master camera 700 is one of the cameras illustrated in the above-described apparatus for purposes of focusing in on an associated target. The slave camera 702 is the camera adapted to constitute the monitor signal. Master camera 700 is connected via line 704 to the A video buffer 706 which serves to isolate the video from the following circuits. Master camera 700 is moreover connected via line 708 which feeds a horizontal and vertical drive signal to the horizontal and vertical input buffer 710. Master camera 700 also feeds an odd/even frame signal via line 712 to the alternate field/video drive circuit 714.

Horizontal and vertical input buffer circuit 710 is connected via line 716 to the horizontal and video output buffer 718 which is, in turn, connected via line 720 to the slave camera 702.

A sensitivity switch 722 is connected to the horizontal and vertical window gate circuit 724 which feeds an output signal via line 726 to the video/sensitivity switch 728. Video buffer 706 is connected via A DC restore circuit 730 to the switch 728. The restore circuit 730 is connected to the A video amplifier 732 via line 734. The circuit 732 is connected via line 736 to video comparator circuit 738 in turn connected to a sensitivity potentiometer 740.

Also included in the aforesaid circuit is the horizontal positive one-shot multivibrator circuit 742 and the vertical positive one-shot multivibrator 744. Buffer 710 is connected via line 746 to one-shot multivibrator 742 and via line 748 to one-shot multivibrator 744. These one-shot multivibrators are connected respectively via lines 750 and 752 to horizontal and vertical triangle generators 754 connected in turn via lines 756 and 758 to horizontal comparators 760 and vertical comparators 762. Switch 728 is connected via line 764 to video switch 766 connected to box shade potentiometer 768 and connected to crosshairs shade potentiometer 770. Comparators 760 are connected via line 772 and 774 to box gating circuit 776 and crosshair gating circuit 778.

Box gating circuit 776 is connected via line 780 to video switch 766. Comparators 762 are connected via line 790 to vertical box and sychronizer circuit 792. C.H. - box circuit 794 is connected via line 796 to circuit 792 which is connected in turn via line 798 to gating circuit 776.

Gating circuit 778 is connected via line 800 to video switch 766. C.H. box circuit 794 is connected to off-on switch 802 via line 804.

In adition to the aforesaid circuits, camera 702 is connected via B video buffer 806 to B DC restore circuit 808. Buffer 710 is connected to H window circuit 810 and line 812 to gate circuit 724 while buffer 710 is moreover connected via vertical window circuit 814 and line 816 to gate circuit 724 connected in turn via line 818 to alternate field vertical drive circuit 714.

Buffer circuit 710 furthermore is connected via line 820 to horizontal clock generator 822 which feeds the signals via lines 824 and 826 to vertical box and synchronizing circuit 792 and horizontal crosshair one shot multi-vibrator and vertical crosshair one shot multi-vibrator and synchronizing the circuit 828, respectively. Circuit 828 is connected via vertical crosshair line 830 and vertical crosshair line 832 to crosshair gating circuit 778.

Inner switch circuit 766 is connected by A video output amplifier 840 to A video output 842. Buffer 710 is connected via line 844 to horizontal and vertical drive buffer 846. Alternate field video vertical drive 714 is connected via line 848 to horizontal and vertical window gating circuit 850. A black/white switch 852 is connected via line 854 to video black/white reversal circuit 856 connected in turn via line 858 to horizontal and vertical window gating circuit 800. Gating circuit 850 is connected via line 860 to sensitivity video data circuit 862 and via line 864 to margin flip-flop 866. It is furthermore connected via line 868 to margin gating circuit and chord gating circuit 870 feeding a signal via line 872 to chord counter and latch circuit 874.

Margin gating circuit 870 is connected via line 876 to margin counter and latch circuit 878 and there are moreover provided horizontal center counter and latch circuit 880 and vertical center and counter latch circuit 882, both of which are connected along with margin counter and latch circuit 878 via line 884 to a horizontal drive delay circuit and horizontal latch enable and reset circuit 886 which receives a signal from buffer 46 via line 888. Circuit 886 feeds the signal via line 890 to margin flip-flop 866 and via line 884 to the aforesaid counter and latch circuits 878, 880 and 882.

A crystal oscillator 892 feeds a signal via line 894 to horizontal gating circuit 896 and via line 898 to margin gating and chord gating circuits 870. The horizontal gating circuit 896 receives a signal via line 900 from horizontal gating circuit 902 in turn receiving a signal from horizontal center adjusting circuit 904 connected to the horizontal center potentiometer 906. Circuit 904 is furthermore connected via line 908 to circuits 886.

A vertical latch enable/point reset circuit 910 receives a signal via line 912 from a vertical center clock 914 receiving a signal from vertical center adjusting circuit 916 connected in turn to the vertical center potentiometer 918. Circuit 902 and clock 914 receive signals respectively from lines 920 and 922 connected to generators 754.

Also included in the circuit of FIG. 14, and particularly in the counter section thereof, is a control multiplex bus 930, a margin/horizontal center bus 932 and a chord/vertical center bus 934. Bus 930 feeds signals to the counter and latch circuits 880, 878 and 882 via lines 933, 934 and 936 respectively. Bus 930 receives a signal via line 938 from protection circuit 940 in turn receiving a signal via line 942 from controls 944. The buses 930, 932 and 934 feed signals via line 946, 948 and 950 to the microcomputer 952 which is connected via line 954 to motor drives 956 in turn connected to x, y and 8 motor drive 958 and limit switches 960. Tables or stages x, y and $\theta$ indicated generally at 962 feed signals through distributor circuit 964 and receive signals from the motor drive 956.

Alternate field gated horizontal drive circuit 970 feeds a signal via line 972 to the bus 932 and so does alternate field vertical drive circuit 714 which feeds its signal via line 974.

Figure 16A:
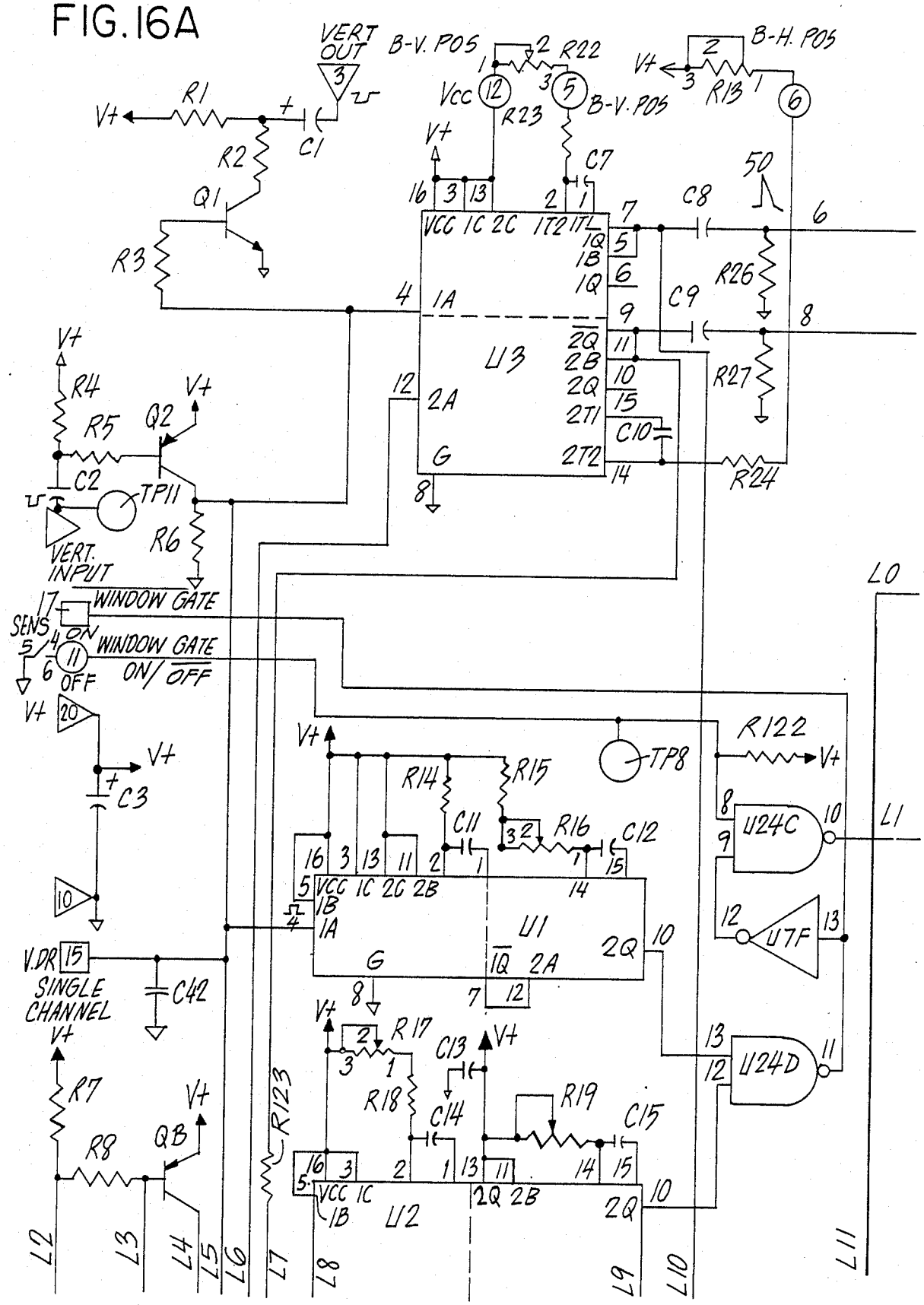
FIGS. 16A–I constitute a partly schematic, partly logical diagram of a video portion of the logical diagram of FIG. 14.
Figure 16B:
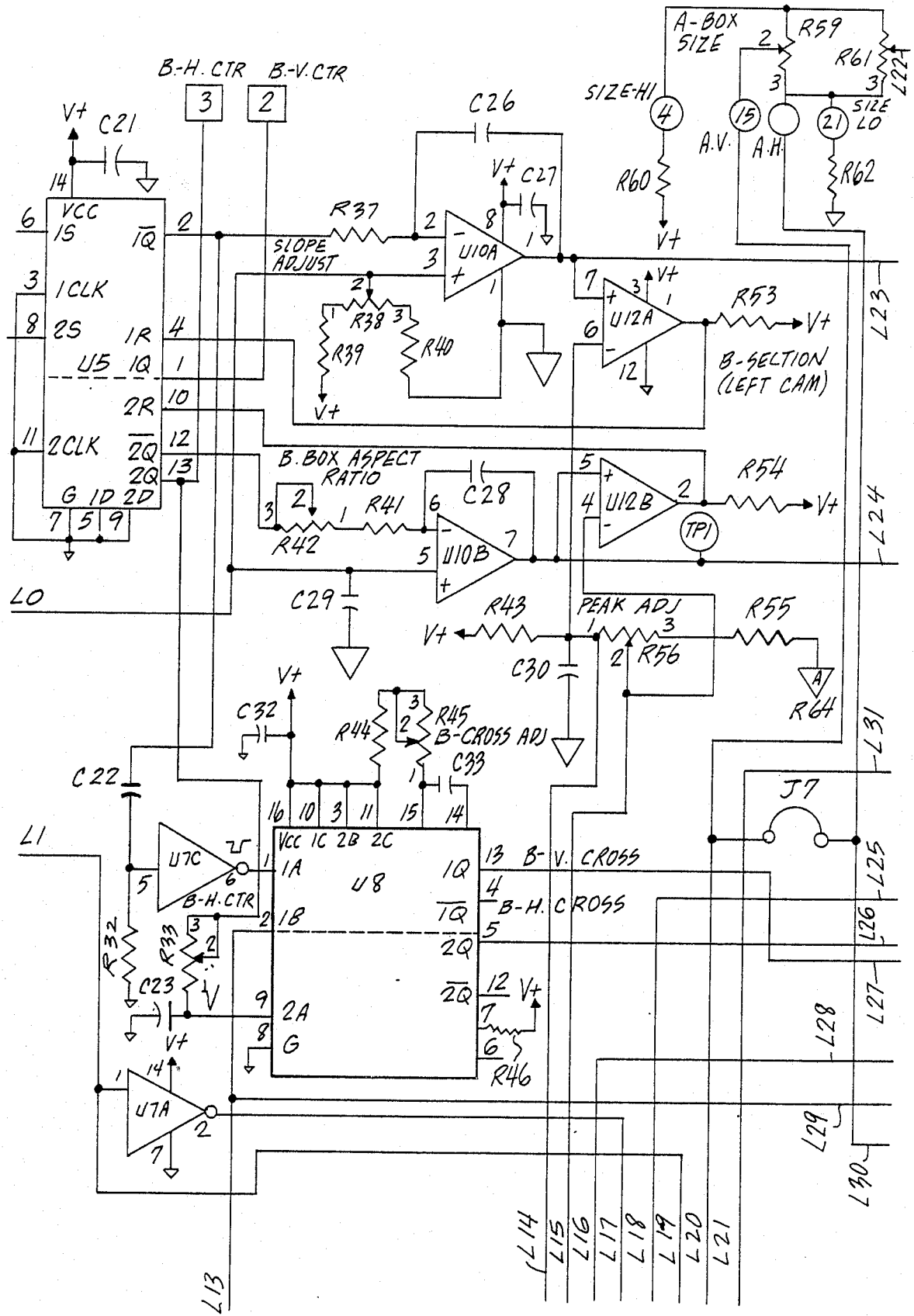
Figure 16C:
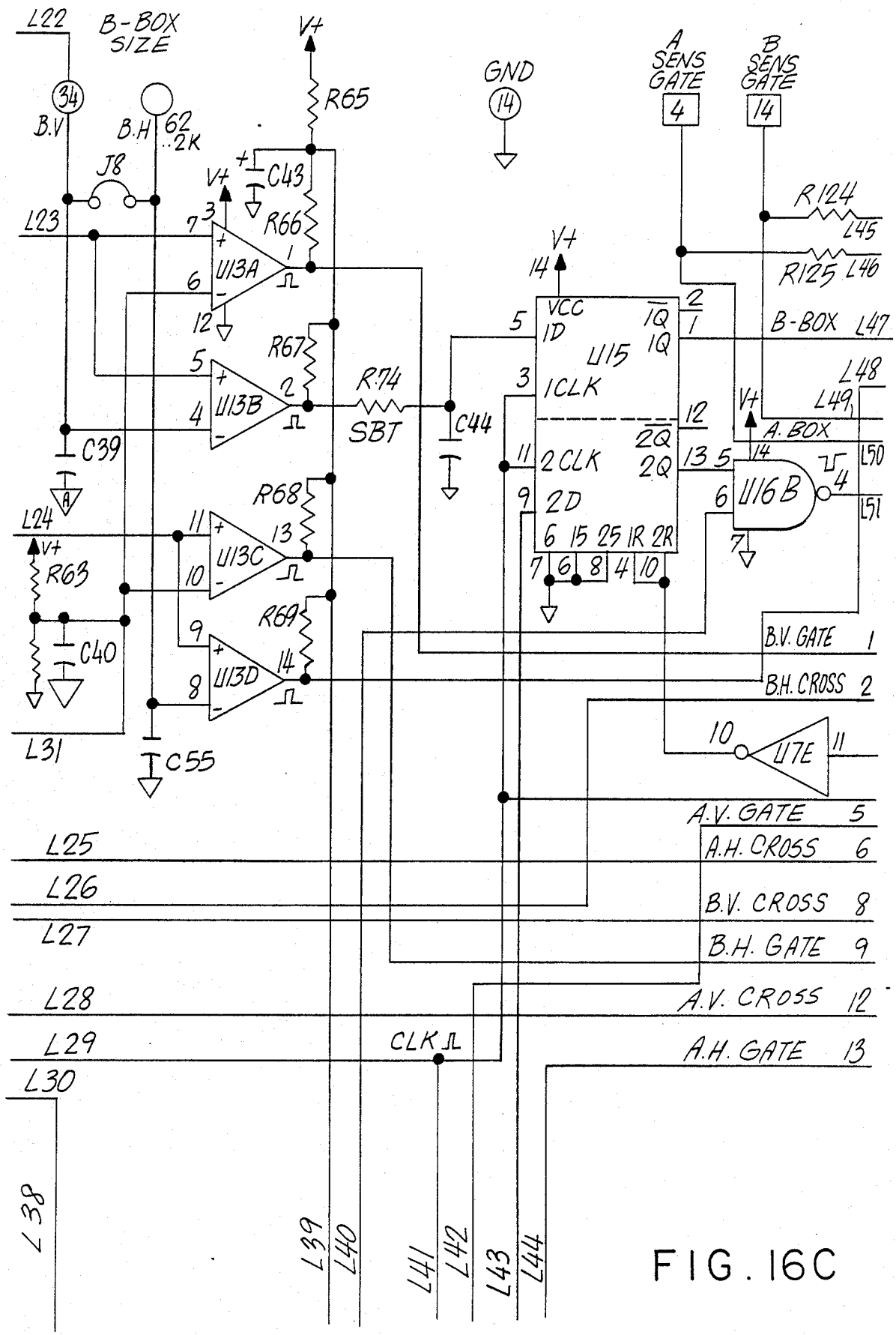
Figure 16D:
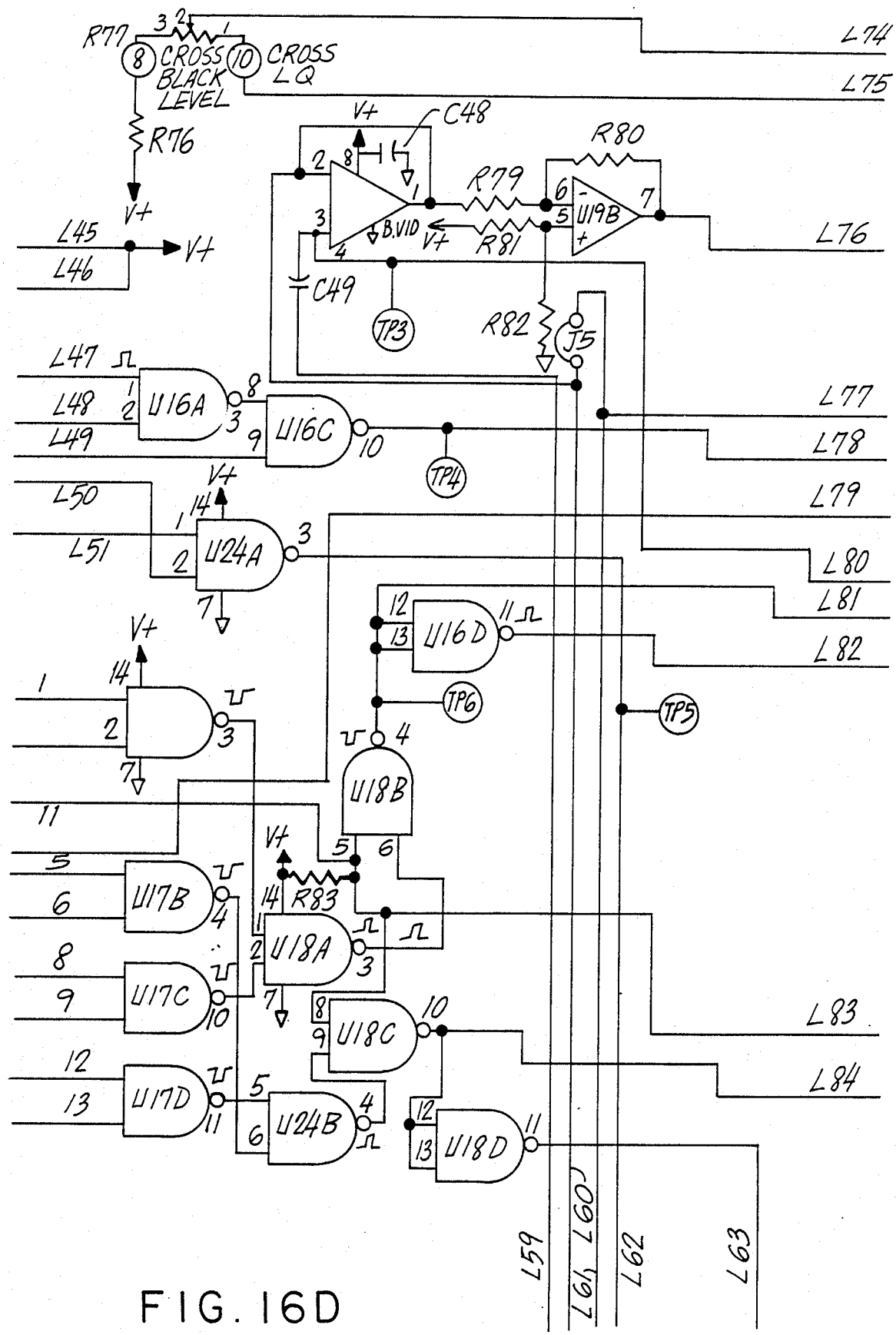
Figure 16E:
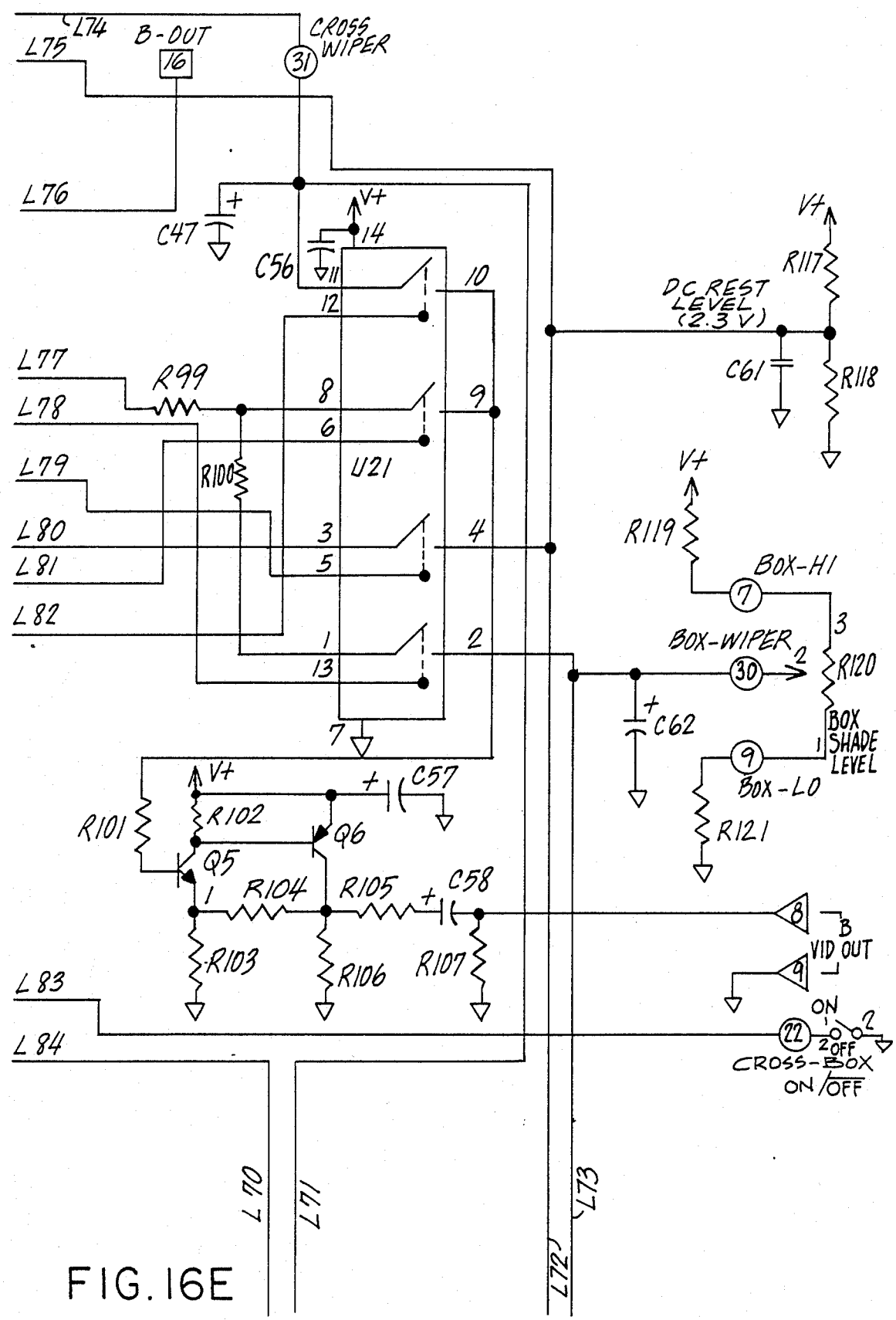
Figure 16F:
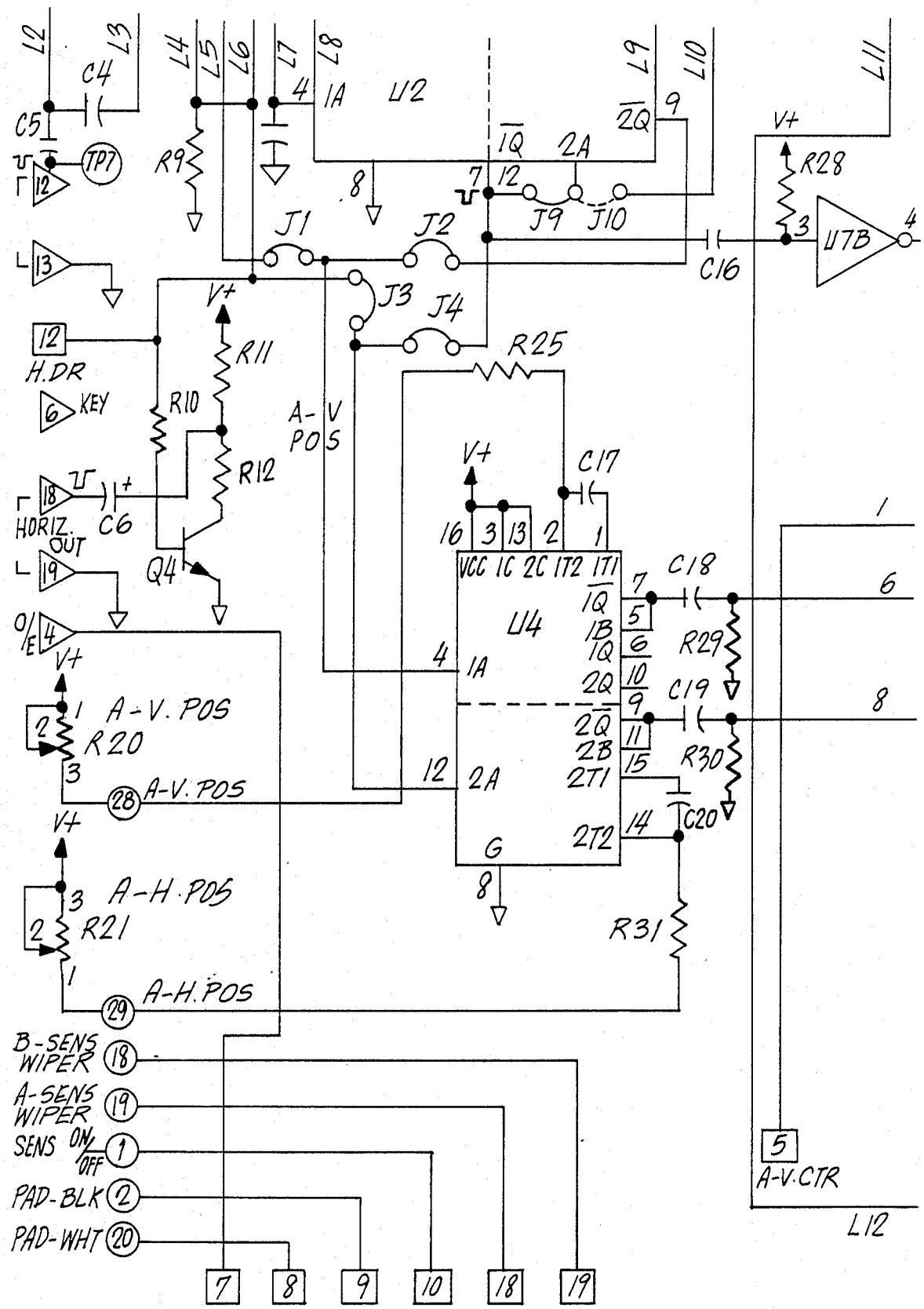
Figure 16G:
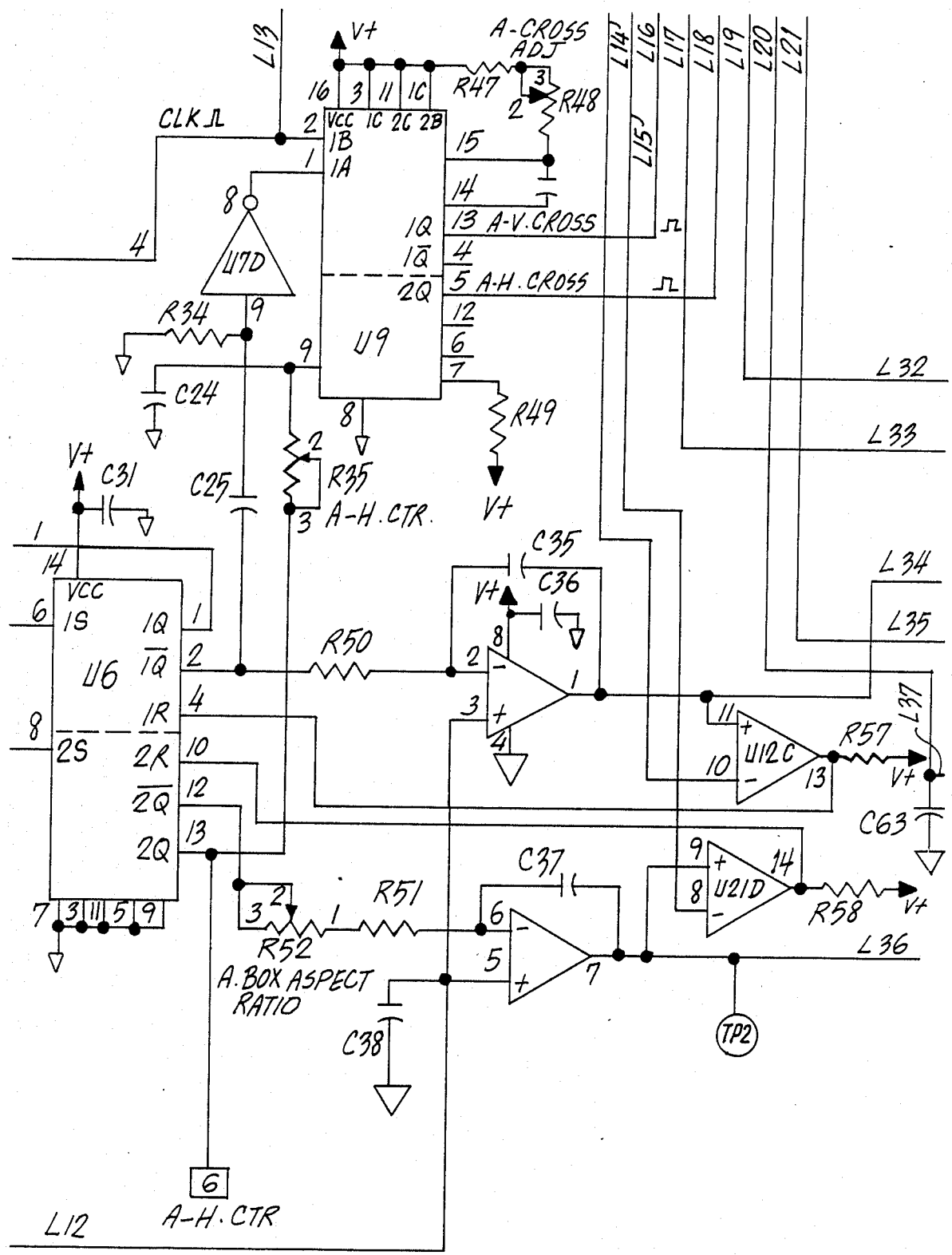
Figure 16H:
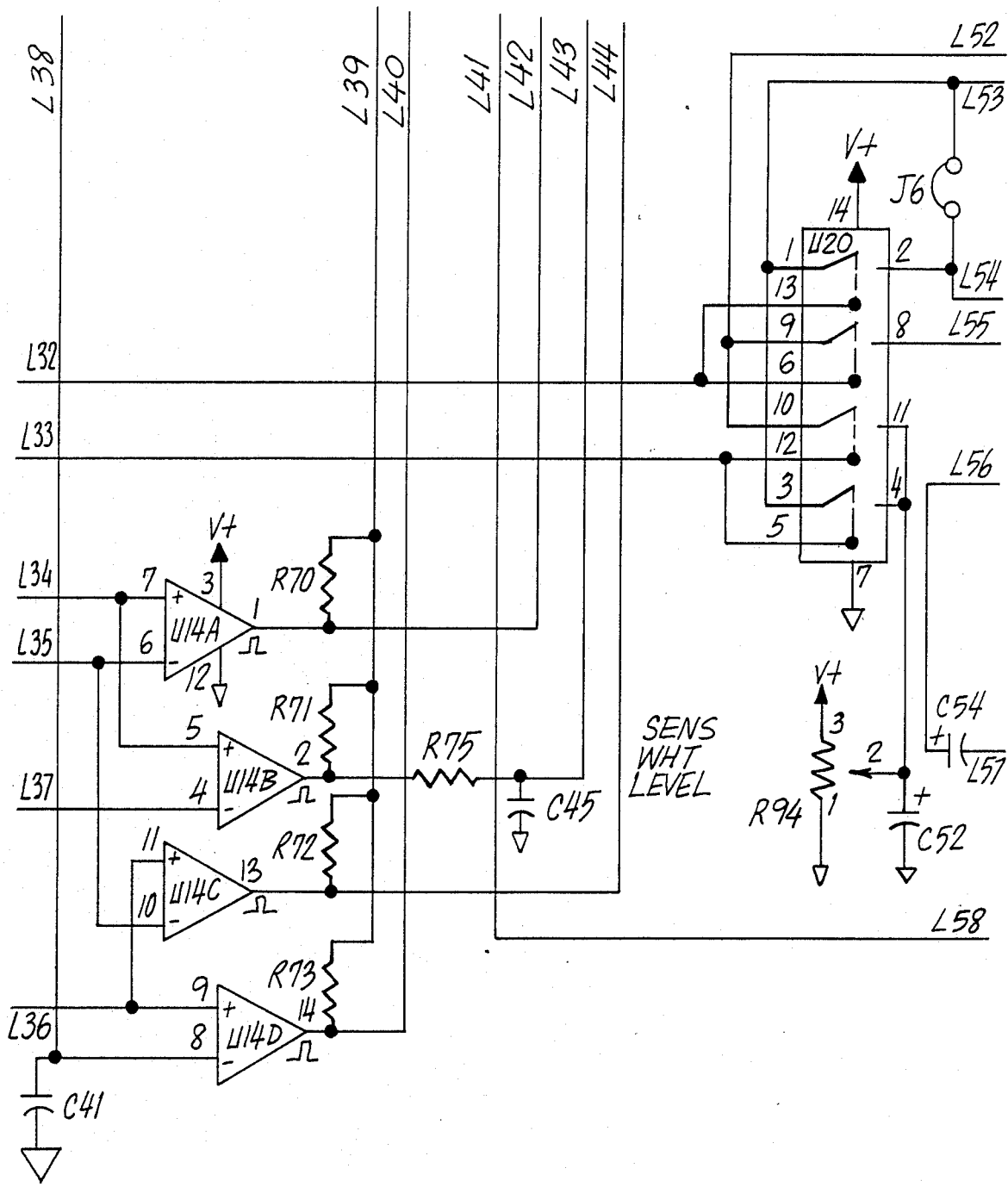
Figure 16:
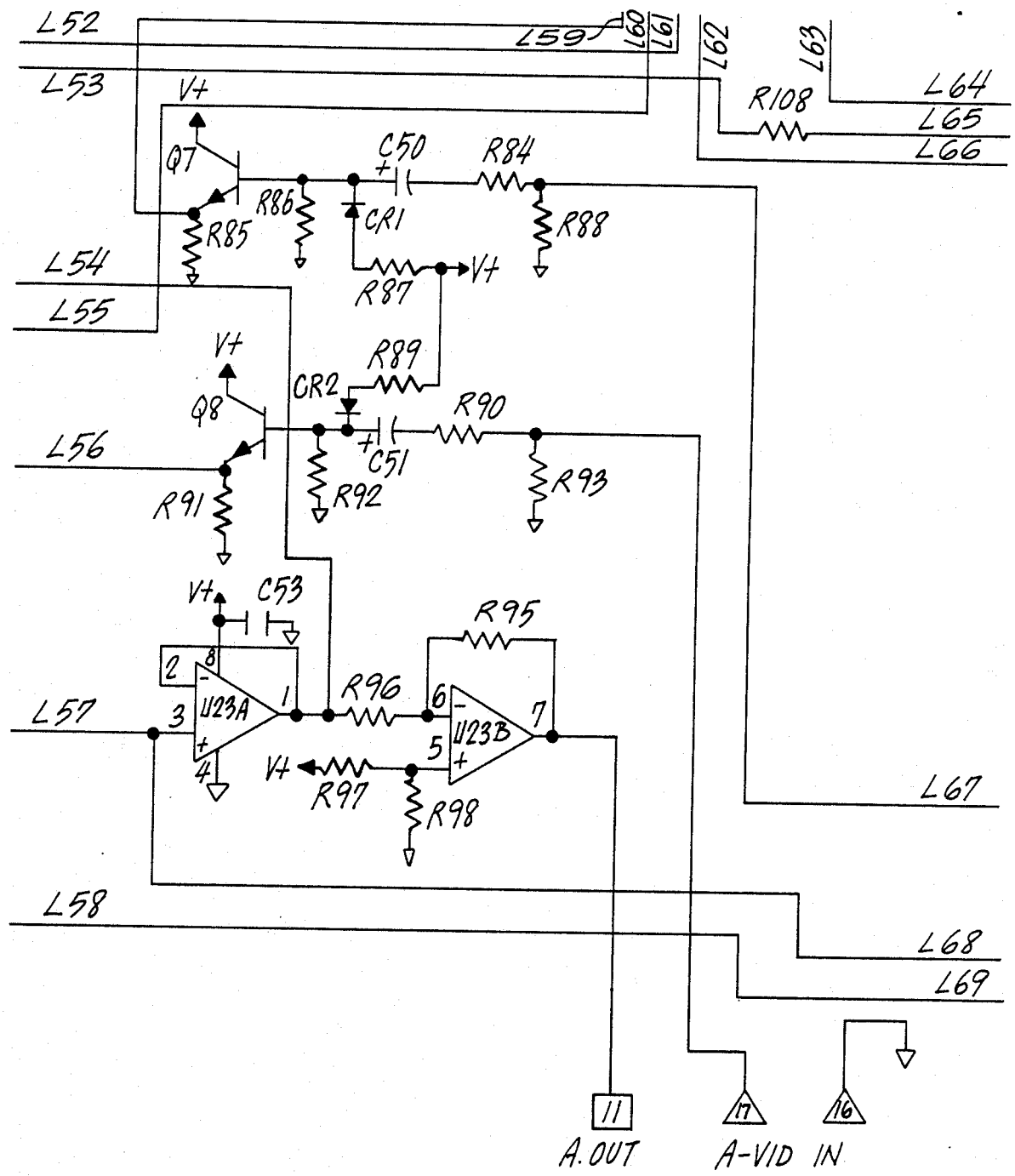
Figure 16J:
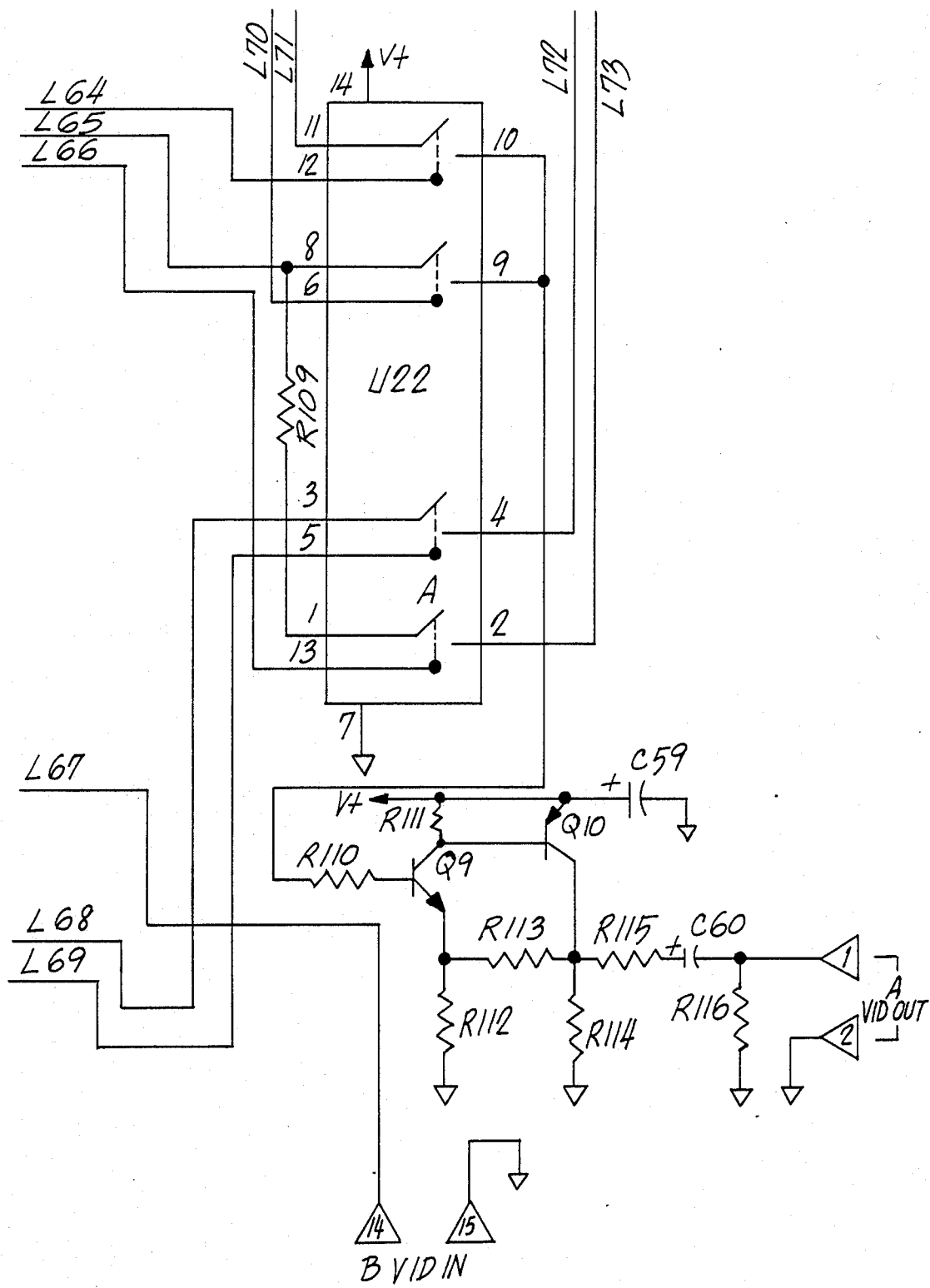

Also included in the circuitry of FIG. 14 is a null and not-null primer circuit 976 which interchanges signals through buffers and drives 978 which receives a signal via line 980 from limit switches 956 and feeds a signal to the lamp indicators and beepers circuits 982. A sensitivity switch 984 is connected via line 986 to circuit 862 connected in turn via line 988 to box gating circuit 776. Switch 728 is connected to sensitivity level potentiometer 990 and the details of the foregoing are shown in FIGS. 15 and 16. It should be noted that the circuitry of the apparatus of the invention involves the use of two master cameras associated with two targets and that the necessary circuitry is provided for each of these cameras. It should also be noted that in the aforegoing, the A video buffer circuit 706 serves to isolate the video from the following circuitry and that the A DC resource circuit 730 provides the necessary circuitry in view of the fact that the video is AC coupled. The video/sensitivity switch 728 provides for switching between direct video and blocking off the video to allow the operator to set up a sensitivity control.

The box gating circuit 776 switches between the box and computer output and the A video output amplifier 840 provides for box shading and sums up the DC levels to show the box. Counter and latch circuits 880 and 882 provide for the target box and the one shot multi-vibrators 828 provide narrow pulses constituting the crosshair signals applied to crosshair gating circuits 778.

FIGS. 15 and 16 illustrate the schematic and logical details of the block diagram of FIG. 14. The logical details of FIGS. 15 and 16 are shown in the following table. FIG. 15 illustrates the details of the counter and control boards of FIG. 14. FIG. 16 shows the details of the video board of FIG. 14 and more particularly the details of the crosshair display features thereof along with the other video aspects. In the table which follows the first column lists the reference numerals to be found in FIGS. 15 and 16, the second column gives the actual part number, the third column gives the description of the associated part of parts and the fourth column lists incidental notes, if any.

TABLE

| REF. NO. | ACTUAL PART NO. | DESCRIPT. | NOTES |
| --- | --- | --- | --- |
| J10,12,21,30 | 57FE-40240-20 | RECEP, FC (24P) | |
| J11,20 | 57FE-40360-20 | RECEP, FC (36P) | |
| P12,21,30 | 57FE-30240-20 | PLUG, FC (24P) | |
| P10 | 57-30240 | PLUG, SOL (24P) | |
| P20 | 57FE-30360-20 | PLUG, FC (36P) | |
| P11 | 57-30360 | PLUG, SOL (36P) | |
| | 22-01-2121 | RECEP, SR (12P) | |
| MP2 | 22-01-2051 | RECEP, SR (5P) | |
| P103 | 22-01-2201 | RECEP, SR (20P) | |
| P101,201,202 | 050-020-455 | RECEP, DR (20P) | |
| P102,204,205,301, | 050-034-455 | RECEP, DR (34P) | |

TABLE-continued

| REF. NO. | ACTUAL PART NO. | DESCRIPT. | NOTES |
|---|---|---|---|
| 302,303 | | | |
| P220,MP3-MP10 | FCC130-14 | PLUG, DIP (14P) | |
| J101,201,202 | 050-020-153A | HEADER, DR (20P) | |
| J102,204,205,301, 302,303 | 050-034-153A | HEADER, DR (34P) | |
| J203 | 22-10-2121 | HEADER, SR (12P) | |
| J103 | 22-10-2201 | HEADER, SR (20P) | |
| P103,203 | 15-04-9209 | KEY, POLARIZING | |
| P103,203 | 08-55-0102 | TERMINAL, MOLEX | |
| J2,3 | HR10-10R-12S | CONN, 12P (F) | |
| J4,5 | 31-236 | CONN, BNC (F) | |
| P4,5 | 278-104 | CONN-BNC(M) | OSC,15MHZ |
| U303 | RASCO-1 (15M) | OSC, XTAL (15M) | IC -SMD |
| U401W | HEF4050BTD | IC 4050 (SMD) | IC-LPTL |
| U203,207,208, 209,219,301,302 | 74LS00 | IC 7400 | IC-LPTL |
| U202,210,213,217 | 74LS74 | IC 7474 | IC-LPTL |
| U204,218 | 74LS221N | IC 74221 | IC-IPTL |
| U305,306,307, 308,311,312, 313,314,317, 318,321,322 | 74LS373 | IC 74LS373 | IC-LPTL |
| U304,309,310, 315,316,319, 320,323 | 74HC4040 | IC 74HC4040 | IC-HCMOS |
| U201,206 | 74HC4049 | IC 74HC4049 | IC-HCMOS |
| U211,215 | 74HC4050 | IC 74HC4050 | IC-HCMOS |
| U212,214,216 | 74HC4538 | IC 74HC 4538 | IC-HCMOS |
| U205 | LM319N | IC LM319 | IC LINEAR |
| U16,17,18,24 | CD4011BCN | IC 4011 | IC-CMOS |
| U5,6,15 | CD4013BCN | IC 4013 | IC-CMOS |
| U20,21,22 | MC14066BCP | IC 4066 | IC-CMOS |
| U7 | CD4069CN | IC 4069 | IC-CMOS |
| U1,2,3,4 | MC14538BCP | IC 4538 | IC-CMOS |
| U8,9 | MM74C221N | IC 74C221 | IC-CMOS |
| U12,13,14 | LM339N | IC LM339 | IC-CMOS |
| U10,11,19,23 | CA3240E | IC 3240 | IC-LINEAR |
| U401 | LM7812CT | IC 7812 | IC-REG(+12 V) |
| U402 | LM309K | IC LM309 | IC-REG(+5 V) |
| CR1,2,201,401, 402 | 1N414B | DIODE | DIODE-SIGNAL |
| CR403,404 | 1N4003 | DIODE | DIODE, PWR |
| CR301,302,303, 304 | 276-565 | ZENER (5.1 V) | ZENER, 5.1 V |
| D1 | VS247 | BRIDGE RECT | BRIDGE RECT |
| Q1,4,5,7,8,9, 201,202,203, 204,205,206, 207,208 | MPS4124 | XISTOR NPN | |
| Q2,3,6,10 | MPS4126 | XISTOR PNP | |
| R33,35,38, 56,94,224,225 | 3299W-5K | TRIMPOT 5K | TRIMPOT-5K |
| R17,42,52 | 3299W-10K | TRIMPOT 10K | TRIMPOT-10K |
| R16,19,45,48, 214,216,234, 236 | 3299W-100K | TRIMPOT 100K | TRIMPOT-100K |
| R77,210,211 | 31VA305 | POT 5L | POT-5K |
| S120 | 31VA405 | POT 25K | POT-25K |
| R13,21,59,61 | 3540S-1-203 | PR POT 20K | PREC POT-20K |
| R20,21 | 3540S-1-104 | PR POT 100K | PREC POT-100K |
| J1,J3,J7,J8, J9,R65 | CF-25 10 | RES 10/5% | |
| R2,12,101,110 | CF-25 47 | RES 47/5% | |
| R88,93,105,115 | CF-25 75 | RES 75/5% | |
| R84,90 | CF-25 100 | RES 100/5% | |
| R1,11,99,108, 301,304,306, 308 | CF-25 220 | RES 220/5% | |
| R103,106,112, 114,205,206 | CF-25 470 | RES 470/5% | |
| R104,113 | CF-25 680 | RES 680/5% | |
| R87,89,100,109, 209,249,250,253 | CF-25 1K | RES 1.0K/5% | |
| R62,64,85,91, 102,111,203,204, 212,241,242,255,256 261,262 | CF-25 2.2K | RES 2.2K/5% | |
| R3,6,9,10,28,46, 49,53,54,57,58, 60,68,69,72,73, 121 | CF-25 4.7K | RES 4.7K/5% | |

TABLE-continued

| REF. NO. | ACTUAL PART NO. | DESCRIPT. | NOTES |
|---|---|---|---|
| 123,235,237,260 | | | |
| R5,8,66,67,70,71, 107,116,217,218,221, 222,233,238,239,240, 243,244,245,246,247, 248,251,252,254,257, 258,302,303,305,307 | CF-25 10K | RES 10K/5% | |
| R26,27,29,30, 74,75,83,122, 124,125,207, 208,227,228, 229,230,231,232 | CF-25 22K | RES 22K/5% | |
| R4,7,63,76,119 | F-25 47K | RES 47K/5% | |
| R86 1M/5% | CF-25 1M | RES 1M/5% | |
| R23,24,25,31,118, 213,215 | MF-25 2.0K | RES 2.0K/1% | |
| R79,82,96,98, 201,202,223,226 | MF-2- 4.99K | RES 4.99K/1% | |
| R18 | MF-25 7.5K | RES 7.5K/1% | |
| R39,40,41,43,51, 117 | MF-25 10.0K | RES 10K/1% | |
| R55,80,81,95,97 | MF-25 15.0K | RES 15K/1% | |
| R15,44,47,219, 220 | MF-25 20.0K | RES 20K/1% | |
| R32,34,37,50 | MF-25 27.4K | RES 27.4K/1% | |
| R14 | MF-25 30.1K | RES 30.1K/1% | |
| C28,37,201,202 | SXK 347 | CAP 470P/33V 1% | POLYSTYRENE 1% |
| C10,14,15,33,34, 44,45,213,214, 217,218 | SXK 210 | CAP .001/33V 1% | POLYSTYRENE 1% |
| C20 | SXK 222 | CAP .0022/33 1% | POLYSTYRENE 1% |
| C22,25 | SXK 247 | CAP .0047/33 1% | POLYSTYRENE 1% |
| C11,209,210, | SXK 147 | CAP .047 33V 1% | POLYSTYRENE 1% |
| C7,17,26,35 | SXK 010 | CAP .1/33V 1% | POLYSTYRENE 1% |
| C4,9,16,19,23, 42,46,211,212,215, 216 | CD101K500 | CAP CER 100P/50 | CERAMIC DISC |
| C24 | CD221K500 | CAP CER 220P/50 | CERAMIC DISC |
| C8,18 | CD102K500 | CAP CER .001/50 | CERAMIC DISC |
| C5,21,27,29,30, 31,36,38,39,40, 41,48,53,56,203, 204,205,219, 222,223,224,225, 301,302,303,304, 305,306,307,308, 309,312,313,314, 315,315 | CD103Z500 | CAP CER .01/50V | CERAMIC DISC |
| C2,13,61 | CD104Z500 | CAP .1/50V | CERAMIC DISC |
| C12 | YM224K251 | CAP .22/250V | FILM |
| C6,32,43,47,49, 50,51,52,54,57, 59,62,208,220, 221 | PDA 33M16M | CAP 33/16V | AL ELEC |
| C1,3,206,207, 310,311 | PDA 100M16M | CAP 100/16V | AL ELEC |
| C58,60 | TDA 1000M16M | CAP 1000/16V | AL ELEC |
| C401 | TDA 2200M16M | CAP 2200/16V | AL ELEC |
| C402 | TDA 1000M35M | CAP 1000/35V | AL ELEC |

The functional aspects of FIGS. 15 and 16 will next be described by cross-referencing various of the parts therein to the blocks in the block diagram of FIG. 14. Thus, for example, buffer 706 in FIG. 14 includes transistor Q8 whereas buffer 710 includes transistors Q2 and Q3 and buffer 718 includes transistors Q1 and Q4, while buffer 806 includes transistor Q7. The horizontal window circuit 810 includes I.C. U1 and video window circuit 814 in FIG. 14 includes integrator chip U2. The horizontal and vertical window gating circuit 724 of FIG. 14 includes integrator chips U24 and U7.

D.C. restoring circuit 808 is constituted by I.C. U23, one shot multi-vibrator 744 consists of I.C. U4 and one shot multi-vibrator 742 consists of I.C. U3. Restoring circuit 730 consists of I.C. U19 and amplifier 732 consists of I.C. U19. In FIG. 14, triangle generators 754 consist of I.C.'s U5, 10 and 12. Switch 728 includes I.C. U20 and comparators 750 consist of I.C.'s U13 whereas comparators 762 likewise consist of I.C.'s U13.

Circuit 792 consists of I.C. U15 and circuit 794 consists of I.C. U18. Circuits 792 and 794 are vertical and horizontal box circuits. Circuit 792 performs a synchronizing function whereas circuit 794 performs an on/off function.

In the video portion of FIG. 14, furthermore, generator 822 is based on I.C. U7 and gating circuit 776 is based on I.C.'s U16 and U24. Switching circuit 766 is based on I.C. U21 and amplifying circuit 840 is based on transistors Q5 and Q6. Additionally, in FIG. 14 gating circuit 778 includes I.C.'s U17 and U18. This circuit relates to the gating function for the crosshairs. The one shot multi-vibrators in circuit 828 are based on I.C. U8.

These circuits perform one shot functions relating to the horizontal and vertical crosshairs.

In the control section of FIG. 14 circuit 714 includes the I.C. U202 and the horizontal drive circuit includes the I.C. U203. Circuit 714 performs the alternate field and video drive functions. Comparator circuit 738 includes I.C. U205 and circuit 856 includes the circuits formed on the basis of I.C.'s U206 and U207. Buffers indicated at 981 are based on I.C.'s U215 whereas buffer circuits 978 are based on transistors Q203-208. In FIG. 14, the timing circuits 976 are based on I.C. U218 and gating circuits 850 are based on I.C.'s 201 and 209.

Further indicated in FIG. 14 are circuits 886 which are based on I.C. U204 and circuits 862 which are based on I.C.'s U219 and transistors 201 and 202. The flip-flop 866 is based on I.C. U210.

FIG. 14 furthermore includes circuit 904 based on I.C. U214 and circuit 916 based on I.C. U212. Gate 902 consists of I.C.'s 211 and 217 whereas the vertical center clock 914 is based on I.C.'s U203 and U213. The circuit of FIG. 14 relating to control moreover includes enable/reset circuit 910 consisting of I.C. U216. Buffer circuit 814 is based on I.C. U201.

Finally, the counter board section of FIG. 14 includes oscillator circuit 892 inclusive of I.C. U303 whereas gating circuit 896 includes I.C. U302 and gating circuits 870 include I.C. U301. Latch circuits 880 include I.C.'s 304, 305 and 306, latch circuits 878 include I.C.'s U310, 311 and 312, and latch circuits 882 include I.C.'s 320 and 321. The chord counter and latch circuit 874 includes I.C.'s U316 and 317.

Bus 930 consists of header J303, bus 932 consists of header J302 and bus 934 consists of header J305.

In the counter section of FIG. 14 provision is made for counting the number of pulses which take place during the scanning by respective rasterlines of the target image. These pulses are counted and latched by circuits 878, 880, 882 and 874. The data gathered is conveyed by buses 930, 932, and 934 to the microprocessor 952 to be discussed hereinbelow. The pulses are generated by the oscillating circuit 892 and are gated with respect to the horizontal center by gating circuit 896. Margin gating and chord gating are also performed by circuit 870. Horizontal and vertical window gating are performed by circuit 850 and provide the window or field mentioned hereinabove with respect to FIG. 5.

In FIG. 14 furthermore crosshair gating is performed in circuit 778. It receives horizontal and vertical crosshair signals via lines 830 and 832 from circuits 828. Circuit 754 is a horizontal and vertical triangular generator which receives horizontal and vertical one shot signals via lines 750 and 752 from circuit 742 and 744. The triangular signals generated are respectively sent to horizontal and vertical comparators 760 and 762. These signals are sent to box gating circuits 776 and 792, the synchronizing signal from circuit 792 being sent via line 798 to gating circuit 776.

Figure 17A:
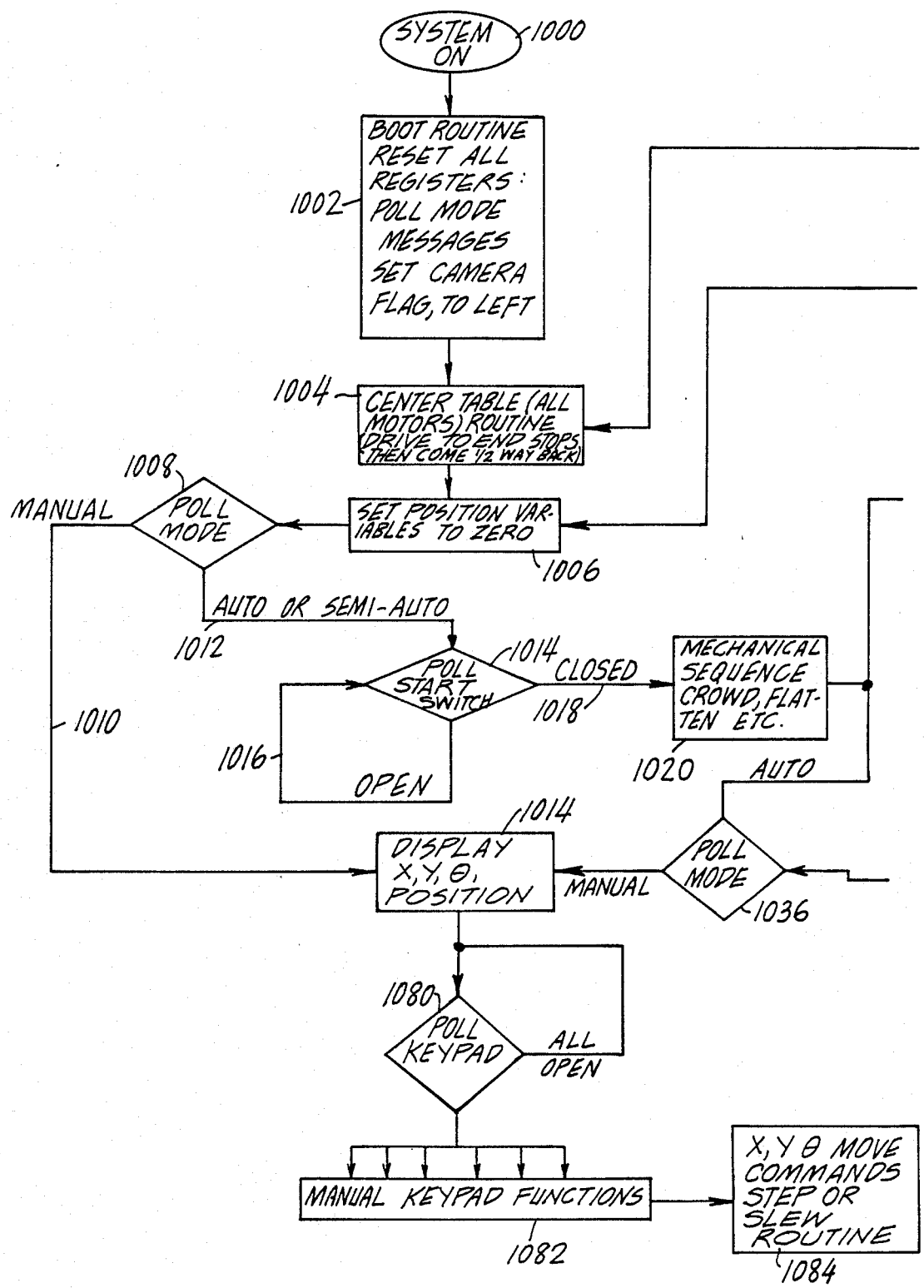
FIGS. 17A and 17B cooperatively constitute a flow diagram which is a slight variation of FIG. 13.
Figure 17B:
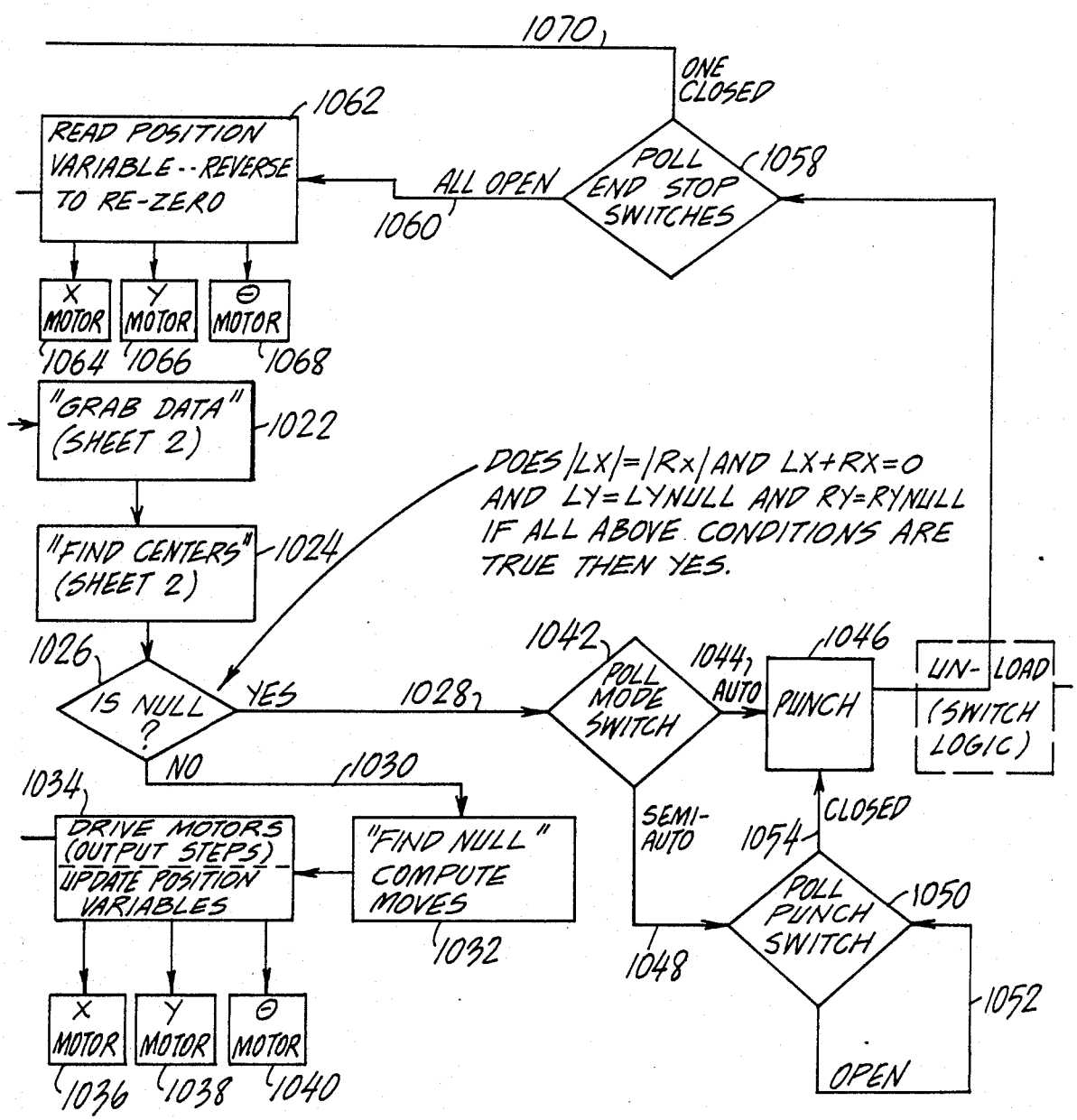

As was mentioned hereinabove, FIGS. 17A and 17B cooperatively constitute a general routine employed in connection with the apparatus mentioned hereinabove. FIGS. 17A and 17B constitute a slight modification of the software flow diagram previously discussed with respect to FIG. 13. In FIGS. 17A and 17B, the initiation of the operation of the system is indicated at 1000. This is followed by a boot routine including the resetting of all registers, polling the mode, displaying mode message, setting the camera flag to the left, etc. This is indicated at 1002. This is followed by centering the table as indicated at 1004. This is followed by setting position variable to zero as indicated at 1006. Operations with respect to position variables will be indicated hereinbelow.

Next provision is made for polling the mode as with respect to manual, automatic or semi-automatic operations as indicated at 1008 and by lines 1010 and 1012. Following polling mode at 1008 as indicated by line 1010 there takes place the display of x, y and $\theta$ as indicated at 1014. Following line 1012, there is the operation of polling the start switch as indicated at 1014. If the switch is open as indicated at line 1016 the operation is repeated. If the switch is closed as indicated at 1018, the mechanical sequences of crowd and flatten the sheet to be processed is indicated at 1020. This is followed by Grab Data as indicated at 1024. Thereafter, the question is asked as indicated at 1026 as to whether there is a null. If the answer is yes, the operation proceeds along line 1028. If the answer is no, the operation proceeds along line 1030.

Deriving from line 1030 is the Find Null operation as indicated at line 1032 which, in turn, is followed by Drive Motors as indicated at 1034. This provides for updating the position of the variables and the operation of the x, y and $\theta$ motors as indicated at 1036, 1038 and 1040.

Deriving from line 1028 is the pole of mode switch operation indicated at 1042. If the operation is automatic as indicated at 1044, the punch is operated as indicated at 1046. If the operation is semi-automatic as indicated at 1048, the polling of the punch switch is indicated at 1050. If the switch is open as indicated at 1052, the operation is repeated. If the switch is closed as indicated at 1054, the punch is operated as indicated at 1046. An unloading operation is indicated optionally at 1056 followed by the polling of the end stop switches as indicated at 1058. If all these switches are open as indicated at 1060, the operation proceeds to reading position variables as indicated at 1062 and reversing to re-zero the x, y and $\theta$ motors as indicated at 1064, 1066 and 1068. If one of the end stop switches is closed as indicated at 1070, the operation returns to centering the table as indicated at 1004.

The motor drive step indicated at 1034 returns via pole mode operation 1036 to the display operation at 1014 which also derives from line 1010. This, in turn, leads to polling the key pad as indicated at 1080, in turn leading to the manual key pad functions as indicated at 1082, in turn leading to the x, y and $\theta$ move commands as indicated at 1084.

Reference has been made hereinabove to Grab Data and Find Centers operations. These are shown in greater depth in FIGS. 18A and 18B to which reference is next made in greater detail. In the explanation which follows, line A (see FIG. 18C) is the first scan line to encounter the target; line B is a scan line through the target near its center; and line C is the last scan line to encounter the target. Also to be noted with respect to what follows is that M stands for the margin which is the amount of time or length of scan before an object is encountered. C represents a chord which is the amount of time or length of scan occupied by the target, or other object which may be, for example, visible noise. M and C are expressed as clock pulses and are measurements in the x direction. Measurement in the y direction is represented by the count of scan lines of the first field in a 2 to 1 interlaced frame.

Referring next to FIG. 18C, it is seen that a raster image appears at 1090. This proceeds to the camera raster indicated at 1092, which, in turn, leads to the cursor circuit 1094. The cursor circuit is hardware which has been referred to and detailed hereinabove. Display Cursor is indicated at 1096. From operation 1098 is derived the finding of the first frame of the interlaced field. This is found in analog form and is converted to digital as indicated at 100. Deriving from cursor circuit 1094 is the operation of locating the cursor position as indicated at 1102 which is followed in turn by an analog-to-digital conversion as indicated at 1104. From the operation indicated at 1100 is derived the operation of filling the look up table screen as indicated at 1106. The look up table screen is indicated in graphic representation at 1108. This look up table screen consists of three columns, namely line number, M and C. The line number represents the raster lines and, in the particular example under consideration, the line numbers are indicated as 0–239, thus making a total of 240 lines in the raster. The relevance of this screen will become apparent in the explanation which follows hereinbelow.

The operation of the apparatus of the invention involves two cameras, namely a left camera and a right camera and the operations therefor are intertwined. The operation is presently discussed with respect to the left camera and except where otherwise deemed necessary, the right camera is merely indicated as a generality at 1110. The question is whether the flag is set to the left camera as indicated at 1112. If the answer is no, as indicated at 1114, a fill the look up table screen operation is performed for the right camera as indicated at 1116. If the answer is yes as indicated at 1118, indicating that the flag is set for the left camera currently under consideration, the proceeding to the operation of filling the look up table screen for the left camera is effected as indicated at 1106. The operation proceeds to set the variables as indicated at 1120. These variables include lx-null and ly-null. The letter 1 in this case represents the left camera. Thereafter, the operation proceeds to Find Top as indicated at 1122.

The majority of the Find Centers operation appears in FIG. 18B as indicated at 1124. This includes the subsets Find Top of Target as indicated at 1126 and Find Bottom of Target as indicated at 1128. FIG. 18B also includes the subset Find Horizontal Center as indicated at 1130 and FIG. 18C includes the subset Find Vertical Center as indicated at 1132.

Reference is next made to FIG. 18C wherein is shown the raster map indicated at 1134. Therein is found the image 1136 of the target or pad. Also indicated are the three horizontal scan lines A, B and C. As will be recalled, line A is the first scan line to encounter the target; line B is a scan line through the target near its center; and line C is the last scan line to encounter the target. The numbering of the raster lines is indicated at 1138.

The scan line indications are also shown at the left-hand side of FIG. 18D as indicated at 1140. The scan lines proceed from scan line 0 to scan line 239 which as indicated hereinabove gives a total number of raster lines of 240. Sync pulses are indicated at the right-hand side of FIG. 18D and are particularly indicated at 1042. Referring to scan line 0 by way of initial example the margin M is indicated at 1144 as occupying the entire width of the screen. This simply means that no target or noise signal has been encountered. When the first encounter of the target by a scan line occurs as indicated at A, the margin assumes a lesser value as indicated at 1146. The initial contact or crossing of the target by a scan line yields a chord C of relatively small width as indicated at 1148. As indicated at line B, C increases in value as one would expect as indicated at 1150. This merely represents the known fact that the chord in horizontal direction through the center of a circle achieves at the maximum distance at the center of the circle. The continuance of the scan yields line D wherein the margin is of once again a greater dimension as indicated at 1152 with the chord C being of a smaller dimension as indicated at 1154. The remainder of the lines as indicated at 1156 shows no encountering of a target and, hopefully, no encountering of visible noise on the surface being scanned as indicated at 1156. FIG. 18D also shows the running of the clock pulses as indicated at 1158. The source of these clock impulses has been indicated hereinabove in a detailed discussion of the hardware of the circuit. The particular example under discussion employs 820 clock pulses per line of raster scan and the widths of the various M and C signals are measured in clock pulse count as has also been discussed hereinabove.

Assuming now that the look up table indicated at 1108 has been appropriately filled as a result of the scans in FIG. 18D and that this has been constantly updated, the operation pertaining to Find Top of Target indicated at 1126 starts off with an examination of line 0 as indicated at 1160. Initially, there takes place a looking up of the value of C for line 0 as indicated at 1162. This is followed by an examination of whether C is greater than the value 3 as indicated at 1164. A value of 3 has been selected to enable the distinguishing between an actual signal and the occurrence of visible or optical noise.

If the answer is yes as indicated at line 1166, the operation proceeds to the looking up of the value of the corresponding M as indicated at 1168. If the answer is no, the question is asked as to whether the screen line number is less than 239 as indicated at 1170. If the answer is yes, as indicated at 1172, the screen line number is increased by one as indicated at 1174 and the procedure of looking up the value of C is repeated for the next sequential line in the series. If the screen line number is not less than 239 as indicated at 1176, an error is indicated at 1178 which provides for bringing the operator into the operation or for automatically repeating the operation to reexamine for errors or actual data.

If the value of M is greater than 800, this question being asked at 1180, and the answer yes being indicated at 1182, the screen line is increased by one as indicated at 1184 and the next value of C is examined. If the answer is no as indicated at 1186, the screen line value is increased by 1. The next sequential C is examined as indicated at 1,188. The operation indicated at 1190 is a feature of the invention. In accordance with this feature, the value of C is multiplied by 10 and the question is asked as to whether this value is greater than the value of C from the next proceeding line (that is the screen line number $-1) \times 12$. If the answer is no as indicated at 1192, an error is indicated. If the answer is yes, the screen line number is decreased by 1 as indicated at 1194. The top of the target has then been located as indicated at 1196 and the operation proceeds to find the bottom of the target as indicated at 1198. The value of C is looked up on the table 1108 as indicated 1200. Once again, the question is examined as to whether the value of C is greater than 3 as indicated at 1202. And essentially the same operation ensues until the operation arrives at the feature of the invention indicated at 1204. The one difference in the proceeding is that at 1206 the question is asked as to whether the line number is greater than 0 rather than the operation referring to line number 239 described hereinabove with respect to subset 1126. At 1204 the question is asked whether the value of C multiplied by 10 is greater than the value of C from the next line in sequence (namely the line number under consideration +1) times 12. If the answer is yes, the line number under consideration is increased by one as indicated at 1206 and the bottom of the screen line has been located as indicated at 1208. The operation then proceeds via line 1210 to the subset 1130 relating to Find Horizontal Center. This operation commences as indicated at 1212 with the top of the target at which an examination is made of the table 1108. The value of the top chord and margin are manipulated according to step 1214 such that the margin is added to one-half of the corresponding C value to give a result which is called x total. The operation then proceeds to increase the number of the line by 1 and the question is asked as indicated at 1216 as to whether the screen line number equals the bottom line number. If the answer is no as indicated at 1218, the operation is continued for the next sequential line. If the answer is yes as indicated at 1220, the total summation of the x totals is divided by the number of lines (the bottom line number minus the top line number) and the result is determined to be the horizontal center as indicated at 1222. The question is then asked as to whether the flag is set to the left camera as indicated at 1224. If the answer is yes as indicated at 1226, the resulting figure is identified as 1x which equals horizontal center as indicated at 1228. If the answer is no, as indicated at 1230, the operation proceeds to find the horizontal center to identify the result as the horizontal center for the right camera as indicated at 1232. The operation proceeds via line 1234 which is indicated both in FIG. 18B and in FIG. 18A.

The operation thus proceeds to the subset 1132 indicating the operation has proceeded to find Vertical Center. At 1236 the operation takes the top and bottom line numbers and sums the two and divides the same by two. At 1238 the operation sets the screen line number equal to the top number previously determined and at 1240, the value of C is looked up and set aside. The operation proceeds at 1242 with identifying the bottom of target line number and looking up the value of the corresponding C as indicated at 1244.

In the above, the value of C has been set as equal to T at 1240 and the value of C at 1244 has been set as equal to B. At 1246, the value of T is compared with B. If the value of T is less than that of B as indicated by line 1248, the operation proceeds to stage 1250. If the value of T is greater than that of B as indicated at line 1252, the operation proceeds to stage 1254. Stages 1250 and 1254 represent respective features of the invention. At stage 1250 the Vertical Center is set to equal the Vertical Center plus the quantity of 0.5 minus the quantity of 0.5 x the ratio of T divided by B. At 1254, the value of the Vertical Center is set to equal the value of Vertical Center minus 0.5 less the quantity of 0.5 x the ratio of B divided by T. This is the determination of the Vertical Center and weights the location of the Vertical Center towards the larger of the values of T and B. This is to account for the non-circularity of the pad or target as discussed hereinabove and the relatively course resolution of vertical data.

Thereafter, determination is made as to whether the flag is set to the left as indicated at 1260. If the answer is no, the determination has been made for the right camera as indicated at 1262. If the answer is yes, the determination is made for the left camera as indicated at 1264. The question is then asked as to whether the flag is set for the right as indicated at 1266. And the procedure that follows is to proceed to Grab Data as indicated at 1268. If the determination is made that the flag is set to the left as indicated at 1270, the operation proceeds to Find Null as indicated at 1272.

Figure 19:
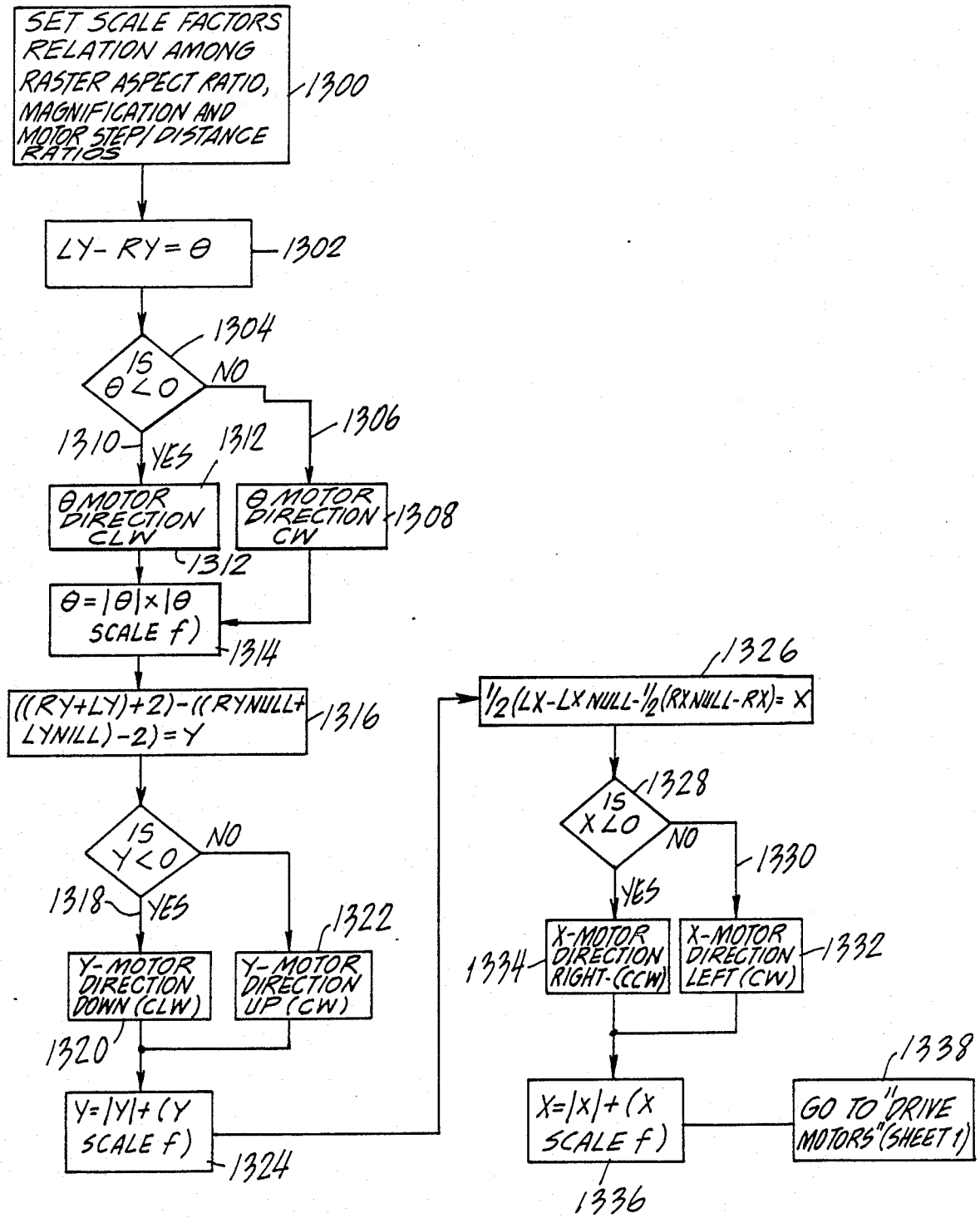
FIG. 19 illustrates the routine in flow diagram form with respect to the Find Null aspect deriving from FIG. 18C.

The Find Null Flow Chart is found in FIG. 19. Before a discussion of this figure is undertaken, reference should be made to the fact that a factor scale f is employed therein. This is a scale factor which is a constant and which is empirically determined. It takes into account a resolution factor for the rotary table, the magnification of the respective cameras, the resolution of the motor steps, the aspect ratio of the raster, and a resolution factor for the scanning raster. In effect, this is a further progression in accordance with the invention to account for the tightness or looseness of the particular piece of apparatus which is being employed.

The scale factor can be ignored if it is not essential to make the equipment as tight as is provided for in FIG. 19.

The general indication of setting the scale factors is indicated at 1300. Thereafter, a determination is made of the value of $\theta$ as indicated at 1302. This is a value determined to be equal to the difference between the left and right y values previously determined under subset 1132 and set aside as indicated at 1264. The question is next asked whether the value of $\theta$ is less than zero, as indicated at 1304. If the answer is no, as indicated at 1306, the motor direction is set at clockwise, as indicated at 1308. If the answer is yes, as indicated at 1310, the motor direction is set to be counterclockwise as indicated at 1312. Thereafter, as indicated at 1314, the value of $\theta$ is adjusted according to scale f. This simply means that the value of $\theta$ is taken to be the absolute value of $\theta$ multiplied by the scaling factor. Thereafter, a determination is made of the value of y. The sum of Ry and Ly is divided by 2 or in other words is averaged to form a first quantity from which is subtracted the value of Ry Null plus the value of LY Null divided by 2. The resulting figure is the value of y. This is indicated at 1316 and constitutes a further feature of the invention.

If the value of y is less than zero as indicated at 1318, the y motor direction is set to be counterclockwise which is the down direction as indicated at 1320. If the value of Y is greater than zero, the y motor direction is set at clockwise as indicated at 1322. The value of y is moreover adjusted for the scale factor f as indicated at 1324 and the operation proceeds to a further feature of the invention indicated at 1326. Therein one-half of the value of the difference between the value of 1x and the value of 1x Null is employed as a first quantity from which is subtracted one-half of the value of Rx Null less the value of Rx. This taken to be the value of x.

The next question is asked as to whether the value of x is less than zero as indicated at 1328. If the answer is no, as indicated at 1330, the operation proceeds to set the motor direction for the left as counterclockwise, as indicated at 1332. If the answer is yes, the x motor direction is set for the right as being counterclockwise as indicated at 1334. The value of x is furthermore adjusted for scale factor f as indicated at 1336. The operation then proceeds as indicated at 1336. The operation then proceeds to the driving motors as indicated at 1338. The operation proceeds until the x and y signals correspond to the Null Values whereat the laminate being operated upon is fully and finally positioned and a punching operation may take place.

It is to be understood that many variations and modifications of the above procedures and hardware may occur without departing from the scope of the invention as defined in the following claims.

What is claimed is:

1. A method of employing an operational tool, said method comprising locating a pattern and a target in prescribed relationship on a substrate, positioning the substrate on a support, determining the location of said target by means of a video system which carries out the steps of generating a location reference having a determined location relative to an operational tool, determining the relationship of the target to said location, and producing a signal representative of the relationship between said target and said location reference, moving the substrate in response to said signal to bring said target and thereby said pattern into prescribed relationship with said location reference such that said substrate is brought into a prescribed relationship relative to said tool, and thereafter operating said tool to perform an operation on said substrate.

2. A method as claimed in claim 1 comprising moving the support to move the substrate along Cartesian coordinates and rotationally.

3. A method as claimed in claim 1 comprising generating a light image of said target and wherein the reference is generated by said system which includes a television camera which captures the light generated image of said target for use in said system.

4. A method as claimed in claim 3 wherein the image of the target is scanned by a raster to generate signals which are used to effect x, y and θ displacement of the image of the target relative to the reference and thereby to control the positioning of the pattern and substrate relative to the tool.

5. A method as claimed in claim 4 wherein the pattern and target are etched, prior to the moving of the substrate and the operation on said substrate, into the electrically conductive material on the substrate which is a relatively flat laminate.

6. A method as claimed in claim 1 comprising locating a second target on the substrate in prescribed relationship to the pattern and moving the substrate to displace the second target relative to a second reference.

7. A method as claimed in claim 4 wherein the target is formed in at least generally circular form and the at least approximate center of the circle is brought to alignment with the reference.

8. A method as claimed in claim 7 wherein, to account for non-circularity of said target, the center is determined by weighting the signals according to the results of multiple scannings at different locations across he circle.

9. A method as claimed in claim 8 wherein the center is weighted in y direction thereof in accordance with the relative values of the at least approximately first and last raster scans passing through or near the upper and lower extremities of the target image.

10. A method as claimed in claim 8 wherein the center is weighted in x direction thereof in accordance with the average chord resulting from a plurality of horizontal scans through the target image.

11. A method as claimed in claim 9 wherein the center is weighted in x direction thereof in accordance with the average chord resulting from a plurality of horizontal scans through the target image.

12. A method as claimed in claim 11 wherein the television camera has a field and the support is coarsely brought to a position where the target image is in said field and fine adjustments of the position of the image relative to the reference are automatically made by repeated scannings of the target image.

13. A method as claimed in claim 12 wherein the substrate is crowded against a stop to bring the image into the field.

14. A method as claimed in claim 6, wherein said substrate has a surface with a center, comprising forming said targets at least substantially equidistant from the center.

15. A method as claimed in claim 1 wherein said target is formed as an at least substantially circular target in a visually contrasting field.

16. A method as claimed in claim 15 wherein said field is circular and is formed from a part of said substrate.

17. A method as claimed in claim 1, wherein the moving of the substrate is effected by moving said support.

18. A method as claimed in claim 17, wherein said support is moved by automatically driving said support on the basis of the signal produced by the video system which is representative of the relationship between the target and the location reference.

19. A method as claimed in claim 1, wherein said operation comprises forming a hole in the substrate.

20. A method as claimed in claim 1, wherein said signal which is representative of the relationship between said target and said reference location is an electrical signal.

21. Apparatus for locating and treating a sheet having at least one target thereon, said apparatus comprising relatively displaceable sheet engagement means and sheet treatment means, optical and computing means for generating a positional reference and for comparing an image of said target with respect to said reference and further for generating signals indicating any displacement between the reference and at least an approximate center of said target, and control means coupled to the optical and computing means and to said sheet engagement means for automatically adjusting the relative positioning of the sheet and the sheet treatment means to bring the reference and target into positional correspondence whereby operation of the treatment means is effective at a position related to the target.

22. Apparatus as claimed in claim 21, wherein said sheet has two targets thereon, said optical and computing means generating two positional references including the first said reference and superimposing images of the targets with respect to respective of said references, said optical and computing means generating signals indicating displacement between the references and the approximate centers of the images of the targets, said control means bringing the references and images of the targets into positional correspondence.

23. Apparatus as claimed in claim 22 wherein said control means includes means for adjusting said sheet engagement means relative to x and y axes and rotationally.

24. Apparatus as claimed in claim 23 wherein said targets are at least generally circles and said optical and computing means includes approximating means for approximating the centers of the circles.

25. Apparatus as claimed in claim 24 wherein the approximating means includes scanning means for electronically scanning an electronic representation of each circle along sequential chords in the x direction and comparing one of the first scans intersecting each circle against one of the last scans intersecting the corresponding circle and weighting the center thereof in the y direction, in favor of the larger of the thusly compared scans.

26. Apparatus as claimed in claim 25 wherein the approximating means includes means for averaging a plurality of scans generally centrally located in the y direction of each circle and averaging the same to approximate the center of each circle with respect to the x direction.

27. Apparatus as claimed in claim 24 wherein the sheet treatment means includes punches for punching holes through said sheet.

28. Apparatus as claimed in claim 24 comprising means defining an opening to enable the manual feeding of the sheet onto said sheet engagement means, stop means for limiting movement of the sheet in x and y directions, and crowding means to crowd the sheet against the stop means thereby to juxtapose the images of the targets and the references.

29. Apparatus as claimed in claim 28 wherein the means for adjusting said sheet engagement means comprises individual means for moving the sheet engagement means respectively relative to the x and y axes and rotationally coupled in series to each other.

30. Apparatus as claimed in claim 28 wherein the stop means are adjustable according to the size of the sheet.

31. Apparatus as claimed in claim 24 wherein the optical and computing means includes television cameras for each of said targets and means for directing light at each of said targets.

32. Apparatus as claimed in claim 21 further comprising means for automatically ejecting the sheet from the sheet engagement means after operation by said sheet treatment means.

33. Apparatus as claimed in claim 21 wherein said sheet includes a pattern thereon having a defined relation with respect to said target so that the position at which the operation of said sheet treatment means is effective is related to said pattern.

* * * * *